United States Patent
Song et al.

(10) Patent No.: US 12,453,228 B2
(45) Date of Patent: Oct. 21, 2025

(54) DISPLAY DEVICE AND METHOD OF MANUFACTURING THE SAME

(71) Applicant: Samsung Display Co., LTD., Yongin-si (KR)

(72) Inventors: Dae Ho Song, Hwaseong-si (KR); Min Woo Kim, Hwaseong-si (KR); Hyung Il Jeon, Seoul (KR); Jin Woo Choi, Seoul (KR); Sung Kook Park, Suwon-si (KR); So Yeon Yoon, Uijeongbu-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 750 days.

(21) Appl. No.: 17/563,488

(22) Filed: Dec. 28, 2021

(65) Prior Publication Data
US 2022/0352437 A1    Nov. 3, 2022

Related U.S. Application Data

(60) Provisional application No. 63/182,195, filed on Apr. 30, 2021.

(30) Foreign Application Priority Data

Apr. 30, 2021    (KR) .......................... 10-2021-0056387

(51) Int. Cl.
*H10K 59/121*    (2023.01)
*H01L 25/16*    (2023.01)
(Continued)

(52) U.S. Cl.
CPC ......... *H10H 29/142* (2025.01); *H01L 25/167* (2013.01); *H10H 20/8515* (2025.01);
(Continued)

(58) Field of Classification Search
CPC ..... H01L 33/56; H01L 25/167; H01L 33/507; H01L 33/60; H01L 33/62;
(Continued)

(56) References Cited

U.S. PATENT DOCUMENTS 8,748,922 B2 *    6/2014    Van Herpen ...... B32B 17/10761
                                              257/E33.074
9,698,204 B2 *    7/2017    Kamura ............... H10K 59/122
(Continued)

FOREIGN PATENT DOCUMENTS

KR    10-2017-0084139    7/2017
KR    10-2018-0118488    10/2018
(Continued)

*Primary Examiner* — Eduardo A Rodela
(74) *Attorney, Agent, or Firm* — CANTOR COLBURN LLP

(57) ABSTRACT

A display device includes a bank disposed on a substrate, a light emitting element disposed in a light emitting area partitioned by the bank on the substrate, and extended in a thickness direction of the substrate, a wavelength conversion layer disposed on the light emitting element in the light emitting area and converting a wavelength of light emitted from the light emitting element, and a protective film disposed between the light emitting element and the wavelength conversion layer in the light emitting area. The protective film is disposed between at least one side of the light emitting element and at least one side of the bank which face each other.

32 Claims, 35 Drawing Sheets

(51) Int. Cl.
*H10H 20/851* (2025.01)
*H10H 20/854* (2025.01)
*H10H 20/856* (2025.01)
*H10H 29/14* (2025.01)
*H10K 59/122* (2023.01)
*H10H 20/01* (2025.01)
*H10H 20/80* (2025.01)
*H10H 20/812* (2025.01)
*H10H 20/825* (2025.01)
*H10H 20/857* (2025.01)

(52) U.S. Cl.
CPC ........ *H10H 20/854* (2025.01); *H10H 20/856* (2025.01); *H10K 59/121* (2023.02); *H10K 59/122* (2023.02); *H10H 20/0362* (2025.01); *H10H 20/0363* (2025.01); *H10H 20/812* (2025.01); *H10H 20/825* (2025.01); *H10H 20/857* (2025.01); *H10H 20/882* (2025.01)

(58) Field of Classification Search
CPC ....... H01L 2933/005; H01L 2933/0058; H01L 2933/0091; H10K 59/121; H10K 59/122; H10K 59/173; H10K 59/70; H10K 19/20
See application file for complete search history.

(56) References Cited

U.S. PATENT DOCUMENTS

| | | | |
|---|---|---|---|
| 10,043,784 B2 * | 8/2018 | Sakariya | H01L 33/06 |
| 10,700,246 B2 | 6/2020 | Sim et al. | |
| 11,075,326 B2 | 7/2021 | Sim et al. | |
| 11,251,341 B2 * | 2/2022 | Chen | H01L 33/62 |
| 11,456,288 B2 * | 9/2022 | Onuma | H01L 25/0753 |
| 11,515,456 B2 * | 11/2022 | Chen | H01L 25/0753 |
| 11,588,078 B2 * | 2/2023 | Kuo | H01L 27/156 |
| 11,764,336 B2 | 9/2023 | Sim et al. | |
| 11,855,053 B2 | 12/2023 | Kong et al. | |
| 2010/0193806 A1 * | 8/2010 | Byun | H01L 33/507 |
| | | | 977/774 |
| 2015/0221836 A1 * | 8/2015 | Kurino | H01L 33/58 |
| | | | 257/98 |

FOREIGN PATENT DOCUMENTS

| | | |
|---|---|---|
| KR | 1020200005692 A | 1/2020 |
| KR | 1020200006209 A | 1/2020 |
| KR | 10-2020-0038370 | 4/2020 |
| KR | 10-2020-0073340 | 6/2020 |
| KR | 10-2020-0145900 | 12/2020 |
| KR | 10-2022-0049065 | 4/2022 |

* cited by examiner

DISPLAY DEVICE AND METHOD OF MANUFACTURING THE SAME

CROSS-REFERENCE TO RELATED APPLICATION(S)

This application claims priority to and benefits of U.S. Provisional Application 63/182,195 filed in United States Patent and Trademark Office (USPTO) on Apr. 30, 2021, and Korean Patent Application No. 10-2021-0056387 filed in the Korean Intellectual Property Office (KIPO) on Apr. 30, 2021, under 35 U.S.C. § 119, the entire contents of which are incorporated herein by reference.

BACKGROUND

1. Technical Field

The disclosure relates to a display device and a method for fabricating the same.

2. Description of the Related Art

With the advancement of the information age, the demand for a display device for displaying an image has increased with various forms. The display device may be a flat panel display device such as a liquid crystal display device, a field emission display device, and a light emitting display panel. The light emitting display device may include an organic light emitting display device including an organic light emitting diode element as a light emitting element, an inorganic light emitting display device including an inorganic semiconductor element as a light emitting element, or a micro light emitting diode element as a light emitting element.

Recently, a head mounted display including a light emitting display device has been developed. The head mounted display (HMD) is a glasses type monitor device of a virtual reality (VR) or augmented reality (AR), which is worn by a user in the form of glasses or helmet and forms a focus at a distance close to eyes of the user.

A high-resolution micro light emitting diode display panel including a micro light emitting diode element is applied to a head mounted display. Since the micro light emitting diode element emits light of a single color, the micro light emitting diode display panel may include a wavelength conversion layer that converts a wavelength of light emitted from the micro light emitting diode element to display various colors.

SUMMARY

Embodiments may provide a display device and a method for fabricating the same, in which a wavelength conversion layer may be prevented from being damaged due to heat emission of a light emitting element.

Additional features of embodiments will be set forth in the description which follows, and in part may be apparent from the description, or may be learned by practice of an embodiment or embodiments herein.

According to an embodiment, a display device may include a bank (or partition wall) disposed on a substrate, a light emitting element disposed in a light emitting area partitioned by the bank on the substrate, and extended in a thickness direction of the substrate, a wavelength conversion layer disposed on the light emitting element in the light emitting area and converting a wavelength of light emitted from the light emitting element, and a protective film disposed between the light emitting element and the wavelength conversion layer in the light emitting area. The protective film may be disposed between at least one side of the light emitting element and at least one side of the bank which face each other.

The protective film may include a scatterer having a diameter in a range of about 1 nanometer to about 100 nanometers.

The protective film may have a thickness smaller than a thickness of the wavelength conversion layer.

The display device may further include a common connection electrode disposed under the bank and spaced apart from the light emitting element.

The display device may further include a pixel electrode disposed on the substrate, and a connection electrode disposed on the pixel electrode and electrically connected to an end of the light emitting element.

The common connection electrode and the connection electrode may include a same material.

The display device may further include a first insulating film disposed between the bank and the common connection electrode.

The bank may include a first bank, and a partial area of the first bank and the light emitting element may include a same material.

The light emitting element may include a first semiconductor layer disposed on the connection electrode, an active layer disposed on the first semiconductor layer, and a second semiconductor layer disposed on the active layer.

The first bank may include a first sub-bank, the first sub-bank and the first semiconductor layer having a same material, a second sub-bank, the second sub-bank and the active layer having a same material, and a third sub-bank, the third sub-bank and the second semiconductor layer having a same material.

The third sub-bank may have a thickness greater than a thickness of the second semiconductor layer.

The first bank may be disposed on the third sub-bank, and further includes a fourth sub-bank having an undoped semiconductor material.

The fourth sub-bank may have a thickness greater than a thickness of the second semiconductor layer.

The bank further includes a second bank disposed on the first bank and having an insulating material, and a third bank disposed on the second bank and having a conductive material.

The second partition wall may have a thickness greater than a thickness of the third bank.

The display device may further include a second insulating film disposed on sides of the bank and sides of the light emitting element.

The display device may further include a common electrode disposed on an upper surface and sides of the bank and an upper surface and sides of the light emitting element.

The common electrode may contact a second insulating film disposed on the sides of the bank and the sides of the light emitting element.

The display device may further include a reflection film disposed on the sides of the bank and the sides of the light emitting element.

The reflection film may contact the common electrode disposed on the sides of the bank and the sides of the light emitting element.

The display device may further include a color filter disposed on the wavelength conversion layer.

The display device may further include a capping layer disposed between the wavelength conversion layer and the color filter, and a selective transmission film disposed between the capping layer and the color filter.

The display device may further include a selective transmission film disposed between the wavelength conversion layer and the color filter, and a capping layer disposed between the selective transmission film and the color filter.

The wavelength conversion layer may convert at least a portion of first light emitted from the light emitting element into fourth light that is mixture light of second light and third light.

The wavelength conversion layer includes a first wavelength conversion layer disposed on the protective film and converting at least a portion of first light emitted from the light emitting element into second light, and a second wavelength conversion layer disposed on the first wavelength conversion layer and converting at least a portion of the first light into third light.

According to an embodiment, a display device may include a first light emitting area emitting first light, a second light emitting area emitting second light, and a third light emitting area emitting third light, the first, second, and third light emitting areas being disposed in a display area of a substrate, a bank partitioning the first light emitting area, the second light emitting area, and the third light emitting area, and a light emitting element spaced apart from the bank in each of the first light emitting area, the second light emitting area, and the third light emitting area, and extended in a thickness direction of the substrate, a protective film disposed on the light emitting element in each of the first light emitting area, the second light emitting area, and the third light emitting area, and a wavelength conversion layer disposed on the protective film in at least one of the first light emitting area, the second light emitting area, and the third light emitting area. The protective film may have a thickness smaller than a thickness of the wavelength conversion layer.

The wavelength conversion layer may be disposed in the first light emitting area, the second light emitting area and the third light emitting area, and converts at least a portion of the first light into fourth light that is mixture light of second light and third light.

The display device may further include a first color filter disposed in the first light emitting area and transmitting the first light, a second color filter disposed in the second light emitting area and transmitting the second light, and a third color filter disposed in the third light emitting area and transmitting the third light.

The wavelength conversion layer may include a first wavelength conversion layer disposed on the protective film and converting at least a portion of the first light into the second light, and a second wavelength conversion layer disposed on the first wavelength conversion layer and converting at least a portion of the first light into the third light.

The display device may further include a light transmitting layer disposed on the protective film in the first light emitting area. The protective film may have a thickness smaller than that of the light transmitting layer.

The wavelength conversion layer may be disposed on the protective film in the second light emitting area to convert at least a portion of the first light into the second light, and is disposed on the protective film in the third light emitting area to convert at least a portion of the first light into the third light.

According to an embodiment, a method may include forming a first connection electrode layer on a first substrate, forming a first insulating film that planarizes an area having a height difference of the first connection electrode layer, and forming a second connection electrode layer on a light emitting element layer of a second substrate, bonding the first substrate to the second substrate by adhering the first connection electrode layer of the first substrate to the second connection electrode layer of the second substrate to form a connection electrode layer, removing the second substrate, forming a first mask pattern and a second mask pattern on the light emitting element layer, and forming at least one light emitting element and at least one bank by etching the light emitting element layer in accordance with the first mask pattern and the second mask pattern, forming connection electrodes and a common connection electrode by etching the connection electrode layer, forming a second insulating film on sides of the at least one light emitting element and sides of the at least one bank, forming a common electrode connecting an upper surface of the at least one light emitting element with the common connection electrode, forming a reflection film on the sides of the at least one light emitting element and the sides of the at least one bank, and forming a protective film on the light emitting element in each of light emitting areas defined by the at least one bank, forming a wavelength conversion layer on the protective film, and forming a color filter on the wavelength conversion layer.

According to an embodiment, a protective film is disposed between a light emitting element and a wavelength conversion layer in each of a plurality of light emitting areas. Since a distance between the light emitting element and the wavelength conversion layer may be increased due to the protective film, wavelength conversion particles of the wavelength conversion layer may be prevented from being damaged due to heat emission of the light emitting element.

According to an embodiment, as a protective film includes a scatterer, light of the light emitting element may be scattered in a random direction. For this reason, since a path length of light passing through the wavelength conversion layer may be increased, color conversion efficiency based on the wavelength conversion layer may be increased.

According to an embodiment, as a selective transmission film is formed on the wavelength conversion layer, a portion of first light emitted as it is without being converted by the wavelength conversion layer may be reflected by the selective transmission film, and then may re-enter the wavelength conversion layer. Therefore, light conversion efficiency of the first light emitted from the light emitting element and converted to another light by the wavelength conversion layer may be enhanced.

According to an embodiment, at least a partial area of a bank and light emitting elements may include the same material. For example, since the bank may be formed by the same process as that of the light emitting elements, a fabricating process may be simplified.

Other features and embodiments may be apparent from the following detailed description, the drawings, and the claims.

BRIEF DESCRIPTION OF THE DRAWINGS

The accompanying drawings, which are included to provide a further understanding of the disclosure, illustrate embodiments in which.

DETAILED DESCRIPTION OF THE DISCLOSURE

Figure 1:
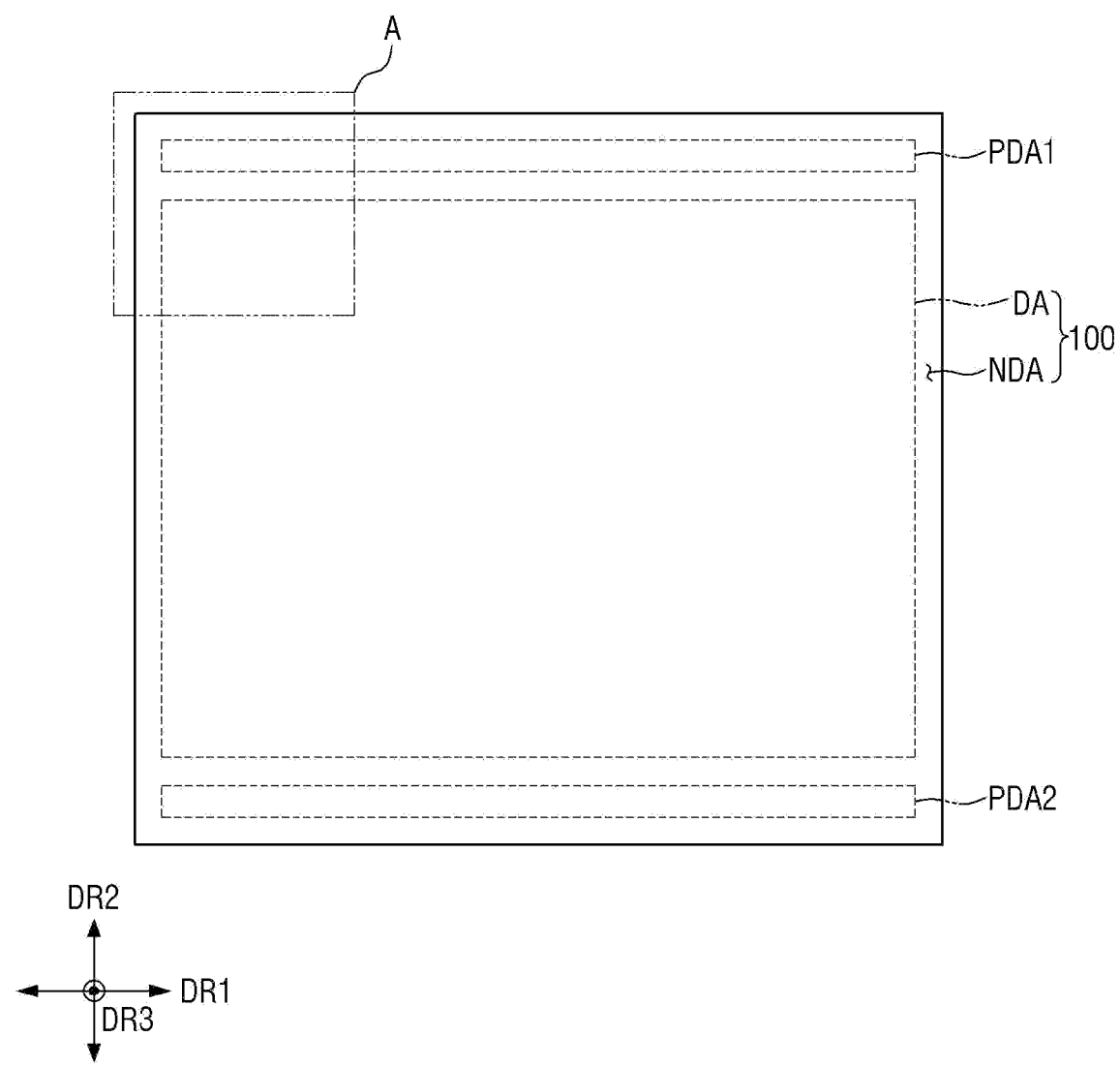
FIG. 1 is a schematic layout view of a display device according to an embodiment of the present disclosure.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
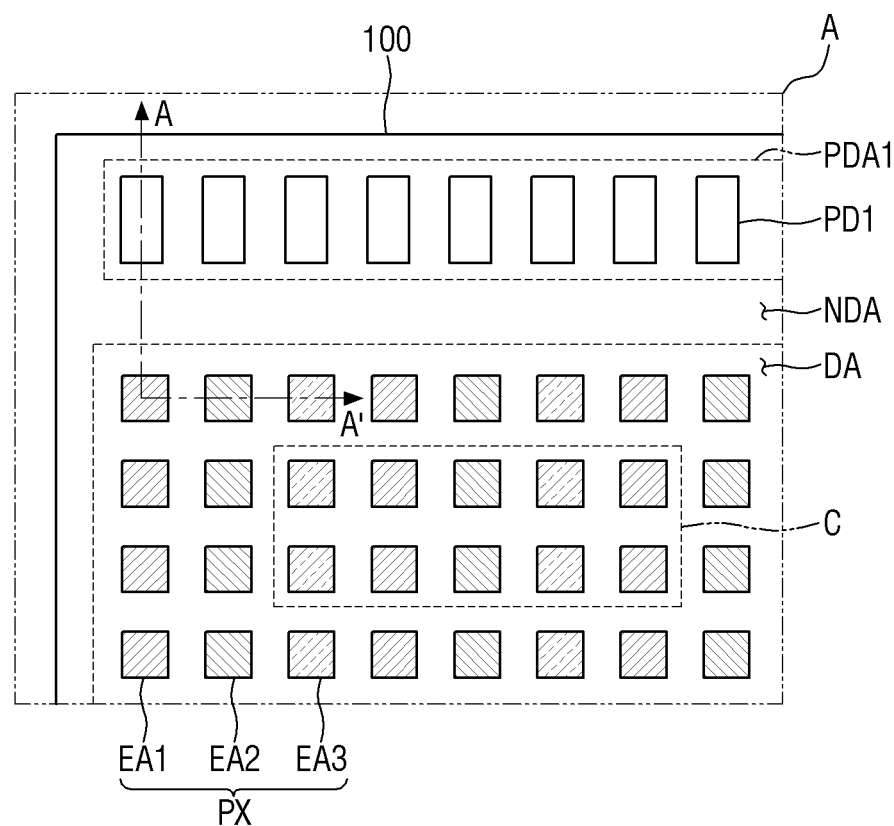
FIG. 2 is a detailed layout view schematically illustrating an area A of FIG. 1.

FIG. 1 is a schematic layout view of a display device according to an embodiment of the disclosure. FIG. 2 is a detailed layout view schematically illustrating an area A of FIG. 1, and FIG. 3 is a layout view schematically illustrating area C of pixels of a display panel according to an embodiment of the disclosure.

Figure 3:
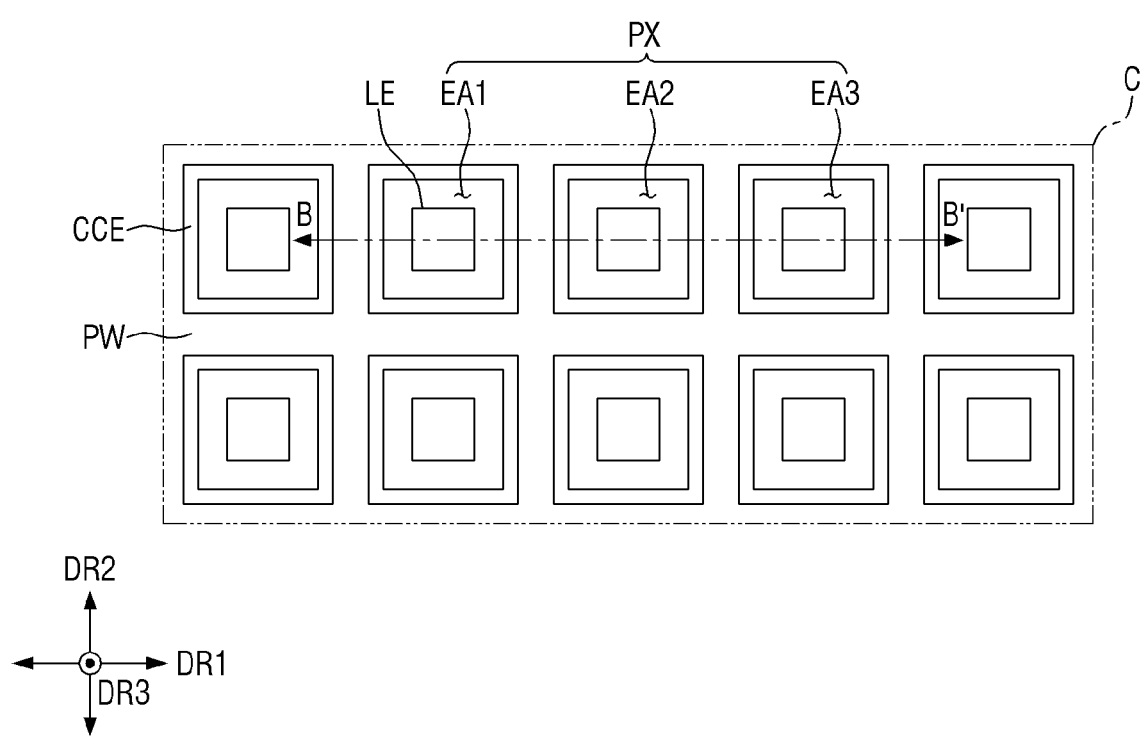
FIG. 3 is a layout view schematically illustrating area C of pixels of a display panel according to an embodiment of the disclosure.

Although the display device according to an embodiment of the disclosure is a micro light emitting diode display device (or nano light emitting diode display device) including a micro light emitting diode as a light emitting element in FIGS. 1 to 3, the embodiment of the disclosure is not limited thereto.

Also, although the display device according to an embodiment of the disclosure is a light emitting diode on Silicon (LEDoS) having light emitting diodes disposed on a semiconductor circuit board 110 formed by a semiconductor process as light emitting elements in FIGS. 1 to 3, it should be noted that the embodiment of the disclosure is not limited thereto.

In FIGS. 1 to 3, a first direction DR1 indicates a horizontal direction of a display panel 100, a second direction DR2 indicates a vertical direction of the display panel 100, and a third direction DR3 indicates a thickness direction of the display panel 100 or a thickness direction of the semiconductor circuit board 110. In this case, the terms "left," "right," "up," and "down" indicate directions when the display panel 100 is viewed from the plane (or in a plan view). For example, "right" indicates one side of the first direction DR1, "left" indicates the other side of the first direction DR1, "upper" indicates one side of the second direction DR2, and "lower" indicates the other side of the second direction DR2. In addition, "upper" indicates one side of the third direction DR3, and "lower" indicates the other side of the third direction DR3.

Referring to FIGS. 1 to 3, the display device 10 according to an embodiment includes a display panel 100 including a display area DA and a non-display area NDA.

The display panel 100 may have a rectangular plane shape having a long side of the first direction DR1 and a short side of the second direction DR2, but the plane shape of the display panel 100 is not limited thereto, and may have another polygonal shape in addition to the rectangular shape, a circular shape, an oval shape, or an irregular plane shape.

The display area DA may be an area where an image is displayed, and the non-display area NDA may be an area where an image is not displayed. The plane shape of the display area DA may follow the plane shape of the display panel 100. In the example of FIG. 1, the plane shape of the display area DA is a rectangular shape. The display area DA may be disposed in a central area of the display panel 100. The non-display area NDA may be disposed in the vicinity of the display area DA. The non-display area NDA may be disposed to surround the display area DA.

The display area DA of the display panel 100 may include pixels PX. A pixel PX may be defined as a minimum light emission unit (or light emission part) capable of displaying light (e.g., white light).

Each of the pixels PX may include light emitting areas EA1, EA2, and EA3 that emit light. In the embodiment of the disclosure, each of the pixels PX includes three light emitting areas EA1, EA2, and EA3, but is not limited thereto. For example, each of the pixels PX may include four light emitting areas.

Each of the light emitting areas EA1, EA2, and EA3 may include a light emitting element LE for emitting first light (or light of a first color). Although the light emitting element LE has a rectangular plane shape, the embodiment of the disclosure is not limited thereto. For example, the light emitting element LE may have a polygonal shape in addition to a rectangular shape, a circular shape, an oval shape, or an irregular shape.

Each of the first light emitting areas EA1 indicates an area for emitting first light. Each of the first light emitting areas EA1 may output the first light output from the light emitting element LE as it is. The first light may be the light of a blue wavelength band. For example, the blue wavelength band may range from about 370 nm to about 460 nm, but the embodiment of the disclosure is not limited thereto.

Each of the second light emitting areas EA2 indicates an area for emitting second light (or light of a second color). Each of the second light emitting areas EA2 may convert a portion of the first light output from the light emitting element LE into the second light and output the second light. The second light may be the light of a green wavelength band. For example, the green wavelength band may range from about 480 nm to about 560 nm, but the embodiment of the disclosure is not limited thereto.

Each of the third light emitting areas EA3 indicates an area for emitting third light (or light of a third color). Each of the third light emitting areas EA3 may convert a portion of the first light output from the light emitting element LE into the third light and output the third light. The third light may be the light of a red wavelength band. For example, the red wavelength band may range from about 600 nm to about 750 nm, but the embodiment of the disclosure is not limited thereto.

The first light emitting areas EA1, the second light emitting areas EA2, and the third light emitting areas EA3 may alternately be arranged in the first direction DR1. For example, the first light emitting areas EA1, the second light emitting areas EA2, and the third light emitting areas EA3 may be disposed in the first direction DR1 in due order.

The first light emitting areas EA1 may be arranged in the second direction DR2. The second light emitting areas EA2 may be arranged in the second direction DR2. The third light emitting areas EA3 may be arranged in the second direction DR2.

The light emitting areas EA1, EA2, and EA3 may be partitioned by a partition wall (or bank) PW. The partition wall PW may be disposed to surround the light emitting element LE. The partition wall PW may be disposed to be spaced apart from the light emitting element LE. The partition wall PW may have a meshed plane shape, a net plane shape, or a lattice plane shape.

Although FIGS. 2 and 3 illustrate that each of the light emitting areas EA1, EA2, and EA3 defined by the partition wall PW has a rectangular plane shape, the embodiment of the disclosure is not limited thereto. For example, each of the light emitting areas EA1, EA2, and EA3 defined by the partition wall PW may have a polygonal shape in addition to the rectangular shape, a circular shape, an oval shape, or an irregular plane shape.

A common connection electrode CCE may be disposed to overlap the partition wall PW in the third direction DR3. The common connection electrode CCE may be disposed to surround the light emitting element LE. The common connection electrode CCE may be disposed to be spaced apart from the light emitting element LE. The common connection electrode CCE have a meshed plane shape, a net plane shape, or a lattice plane shape.

Figure 7:
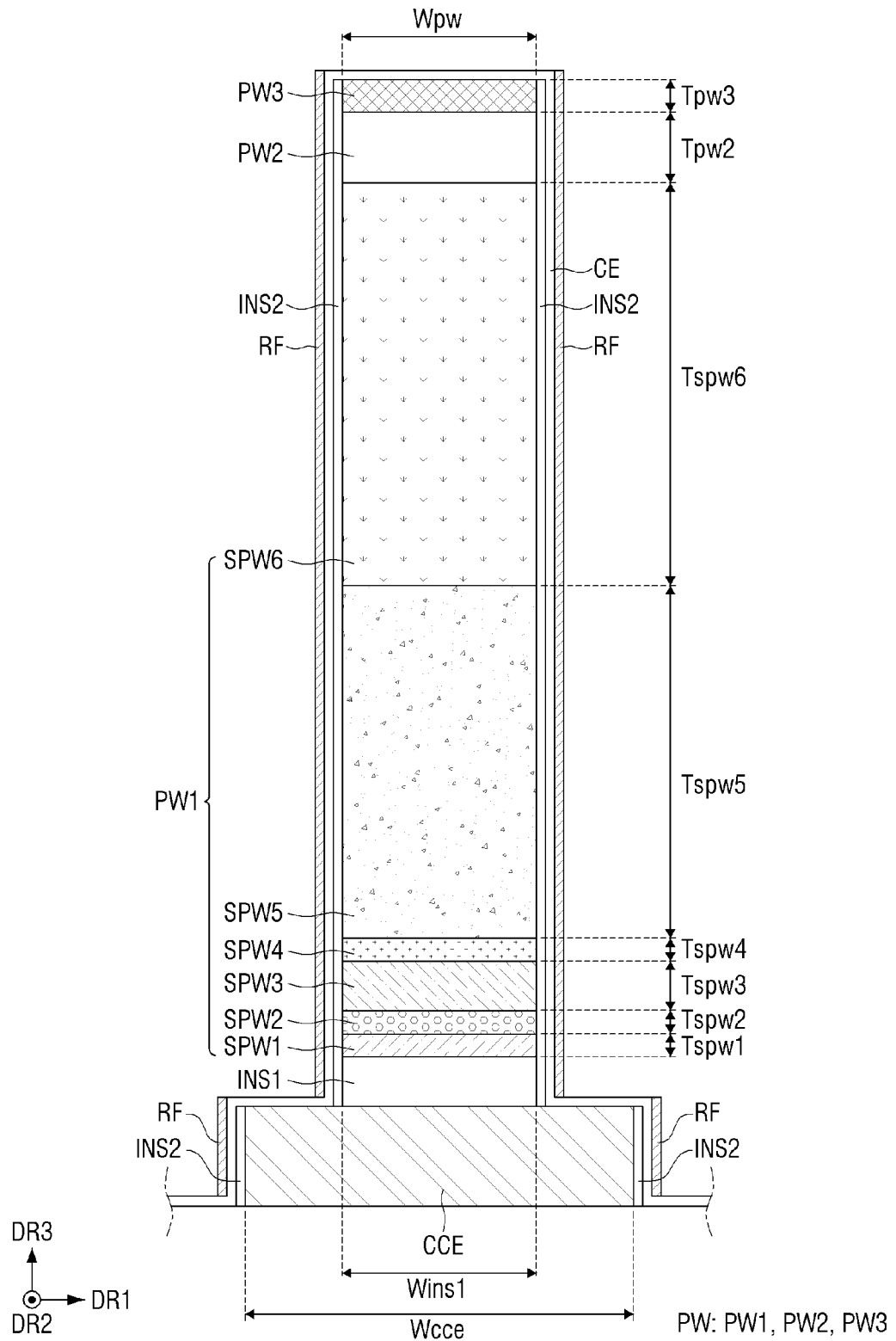
FIG. 7 is a detailed enlarged cross-sectional view schematically illustrating an example of a partition wall of FIG. 5.

A width Wcce of the common connection electrode CCE in the first direction DR1 or the second direction DR2 may be wider than a width Wpw of the partition wall PW (see, e.g., FIG. 7). The partition wall PW may completely overlap the common connection electrode CCE in the third direction DR3. A portion of the common connection electrode CCE may overlap the partition wall PW in the third direction DR3.

The non-display area NDA may include a first pad area PDA1 and a second pad area PDA2.

The first pad area PDA1 may be disposed in the non-display area NDA. The first pad area PDA1 may be disposed above the display panel 100. The first pad area PDA1 may include first pads PD1 connected with an external circuit board CB (FIG. 4).

The second pad area PDA2 may be disposed in the non-display area NDA. The second pad area PDA2 may be disposed below the semiconductor circuit board 110. The second pad area PDA2 may include second pads for connection with the external circuit board CB (FIG. 4). The second pad area PDA2 may be omitted.

Figure 4:
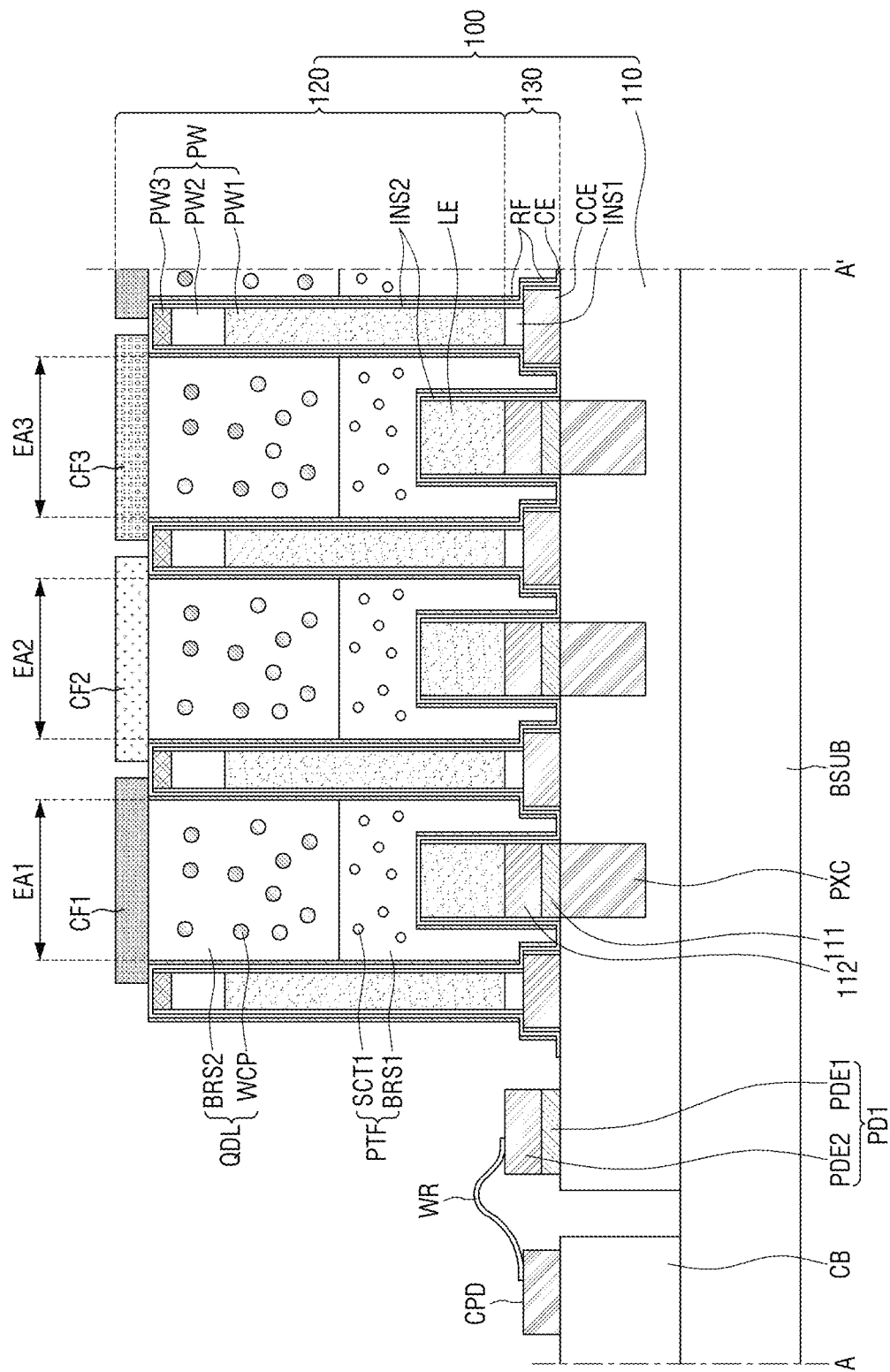
FIG. 4 is a cross-sectional view schematically illustrating an example of a display panel taken along line A-A' of FIG. 2.
Figure 5:
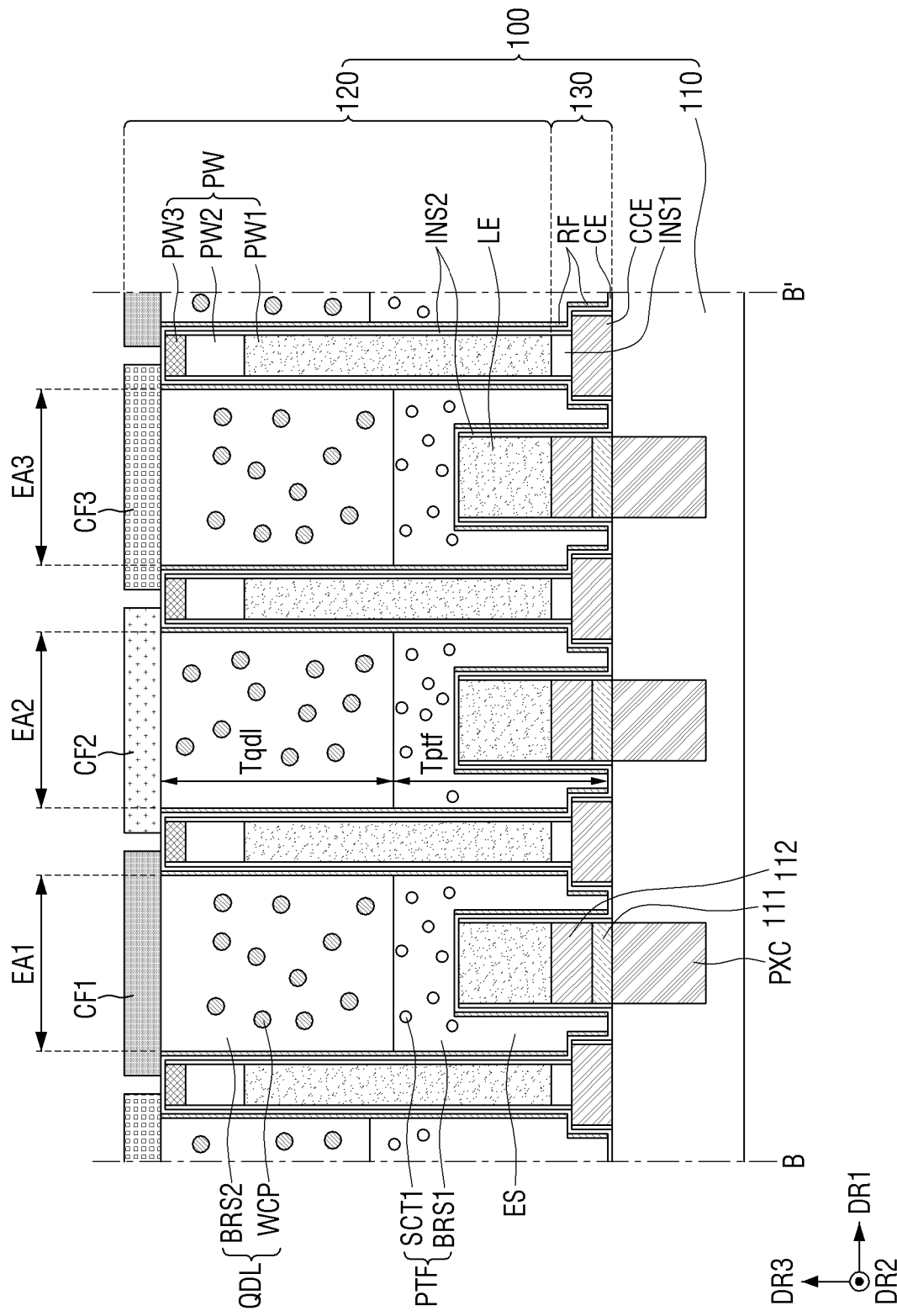
FIG. 5 is a cross-sectional view schematically illustrating an example of a display panel taken along line B-B' of FIG. 4.
Figure 6:
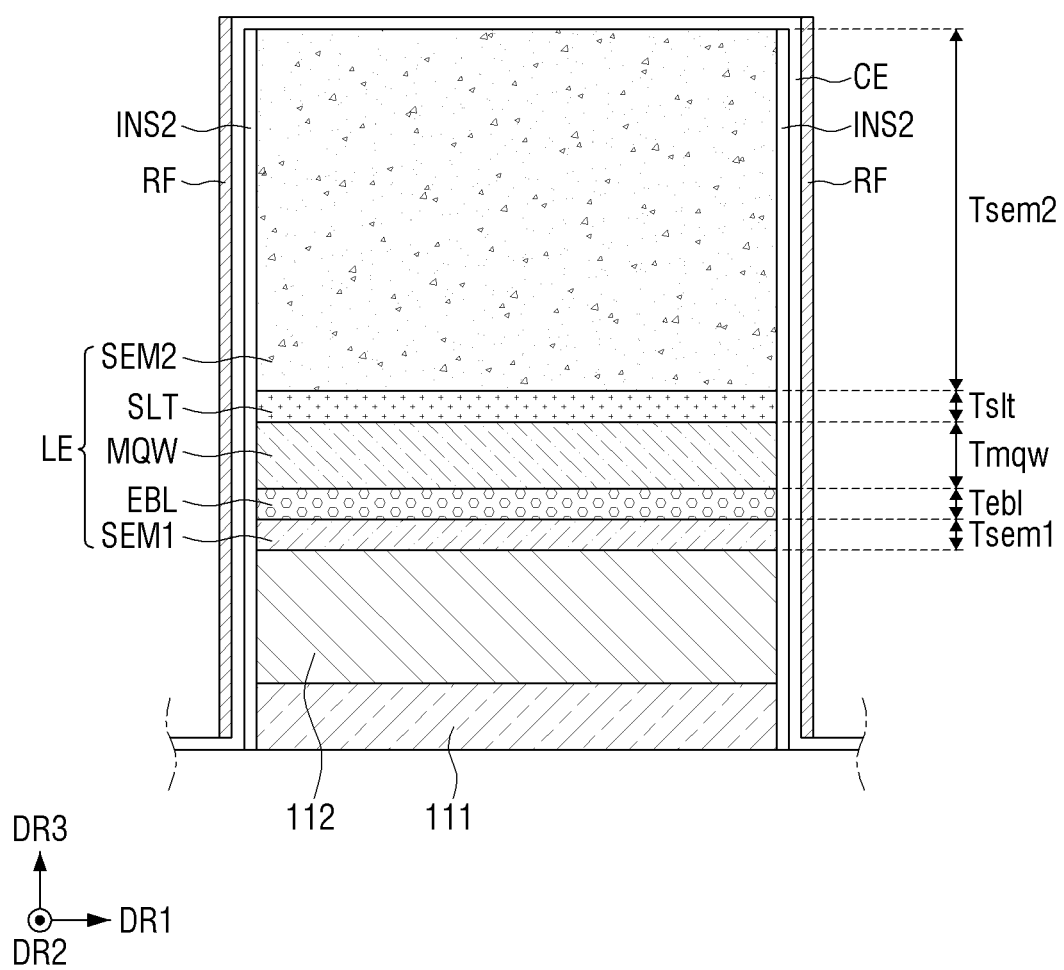
FIG. 6 is a detailed enlarged cross-sectional view schematically illustrating an example of a light emitting element of FIG. 5.

FIG. 4 is a cross-sectional view schematically illustrating an example of a display panel taken along line A-A' of FIG. 2. FIG. 5 is a cross-sectional view schematically illustrating an example of a display panel taken along line B-B' of FIG. 4. FIG. 6 is a detailed enlarged cross-sectional view schematically illustrating an example of a light emitting element of FIG. 5. FIG. 7 is a detailed enlarged cross-sectional view schematically illustrating an example of a partition wall of FIG. 5.

Referring to FIGS. 4 to 7, the display panel 100 may include a semiconductor circuit board 110, a conductive connection layer 130, and a light emitting element layer 120.

The semiconductor circuit board 110 may include pixel circuit areas PXC and pixel electrodes 111. The conductive connection layer 130 may include connection electrodes 112, first pads PD1, a common connection electrode CCE, and a first insulating film INS1.

The semiconductor circuit board 110 may be a silicon wafer substrate formed using a semiconductor process. The pixel circuit areas PXC of the semiconductor circuit board 110 may be formed using the semiconductor process.

The pixel circuit areas PXC may be disposed in the display area DA. Each of the pixel circuit areas PXC may be connected to its corresponding pixel electrode 111. For example, the pixel circuit areas PXC and the pixel electrodes 111 may be connected to each other in a one-to-one correspondence. Each of the pixel circuit areas PXC may overlap the light emitting element LE in the third direction DR3.

Each of the pixel circuit areas PXC may include at least one transistor formed by the semiconductor process. Each of the pixel circuit areas PXC may further include at least one capacitor formed by the semiconductor process. Each of the pixel circuit areas PXC may apply a pixel voltage or an anode voltage to the pixel electrode 111.

Each of the pixel electrodes 111 may be disposed on its corresponding pixel circuit area PXC. Each of the pixel electrodes 111 may be an exposed electrode exposed from the pixel circuit area PXC. For example, each of the pixel electrodes 111 may be protruded from an upper surface of the pixel circuit area PXC. Each of the pixel electrodes 111 may integrally be formed with (or integral with) the pixel circuit area PXC. Each of the pixel electrodes 111 may be supplied with a pixel voltage or an anode voltage from the pixel circuit area PXC. The pixel electrodes 111 may be formed of (or include) aluminum (Al).

Each of the connection electrodes 112 may be disposed on its corresponding pixel electrode 111. Each of the connection electrodes 112 may be disposed on the pixel electrode 111. The connection electrodes 112 may include a metal material for adhering the pixel electrodes 111 to the light emitting elements LE. For example, the connection electrodes 112 may include at least one of gold (Au), copper (Cu), aluminum (Al), or tin (Sn). As another example, the connection electrodes 112 may include a first layer including any one of gold (Au), copper (Cu), aluminum (Al), and tin (Sn), and a second layer including the other one of gold (Au), copper (Cu), aluminum (Al), and tin (Sn). In this case, the second layer may be disposed on the first layer.

The common connection electrode CCE may be disposed to be spaced apart from the pixel electrode 111 and the connection electrode 112. The common connection electrode CCE may be disposed to surround the pixel electrode 111 and the connection electrode 112.

The common connection electrode CCE may be connected to any one of the first pads PD1 of the first pad area PDA1 of the non-display area NDA or any one of the second pads PD2 of the second pad area PDA2 to receive a common voltage. The common connection electrode CCE and the connection electrodes 112 may include the same material. For example, the common connection electrode CCE may include at least one of gold (Au), copper (Cu), aluminum (Al), or tin (Sn). In case that each of the connection electrodes 112 includes a first layer and a second layer, the common connection electrode CCE and the first layer of each of the connection electrodes 112 may include the same material.

The first insulating film INS1 may be disposed on the common connection electrode CCE. The first insulating film INS1 may be formed of an inorganic film, such as a silicon oxide film ($SiO_2$), an aluminum oxide film ($Al_2O_3$), or a hafnium oxide film ($HfO_x$). A width Wins1 of the first insulating film INS1 in the first direction DR1 and/or the second direction DR2 may be narrower than a width Wcce of the common connection electrode CCE. For this reason, a portion of an upper surface of the common connection electrode CCE may be exposed without being covered by (or being overlapped by or overlapping) the first insulating film INS1. The portion of the upper surface of the common connection electrode CCE, which is exposed without being covered by the first insulating film INS1, may be in contact with (or contact) the common electrode CE. Therefore, the common electrode CE may be connected to the common connection electrode CCE.

Each of the first pads PD1 may be connected to a pad CPD of the circuit board CB through a conductive connection member such as a corresponding wire WR. For example, the first pads PD1, the wires WR, and the pads CPD of the circuit board CB may electrically be connected to one another in a one-to-one correspondence.

Each of the first pads PD1 may include a first pad electrode PDE1 and a second pad electrode PDE2. The first pad electrode PDE1 and the pixel electrode 111 may include the same material. The second pad electrode PDE2 and the connection electrodes 112 may include the same material. For example, the second pad electrode PDE2 may include at least one of gold (Au), copper (Cu), aluminum (Al), or tin (Sn). In case that each of the connection electrodes 112 includes a first layer and a second layer, the second pad electrode PDE2 may also include a first layer and a second layer.

The semiconductor circuit board 110 and the circuit board CB may be disposed on a base substrate B SUB. The semiconductor circuit board 110 and the circuit board CB may be attached to an upper surface of the base substrate BSUB by an adhesive member such as a pressure sensitive adhesive.

The circuit board CB may be a flexible printed circuit board (FPCB), a printed circuit board (PCB), a flexible printed circuit (FPC), or a flexible film such as a chip on film (COF).

In an embodiment, the second pads of the second pad area PDA2 may substantially identical or similar to the first pad PD1 described with reference to FIGS. 4 and 5, and thus their descriptions will be omitted below.

The light emitting element layer 120 may include light emitting elements LE, a partition wall PW, a second insulating film INS2, a common electrode CE, a reflection film RF, a protective film PTF, a wavelength conversion layer QDL, and color filters CF1, CF2 and CF3.

The light emitting element layer 120 may include the first light emitting areas EA1, the second light emitting areas EA2, and the third light emitting areas EA3, which are partitioned by the partition wall PW. The light emitting element LE, the protective film PTF, the wavelength conversion layer QDL, and any one of the color filters CF1, CF2 and CF3 may be disposed in each of the first light emitting areas EA1, the second light emitting areas EA2, and the third light emitting areas EA3.

The light emitting element LE may be disposed on the connection electrode 112 in each of the first light emitting areas EA1, the second light emitting areas EA2, and the third light emitting areas EA3. The light emitting element LE may be a vertical light emitting diode element extended in the third direction DR3. For example, a length of the light emitting element LE in the third direction DR3 may be longer than a length in a horizontal direction. The length in the horizontal direction indicates a length in the first direction DR1 or a length in the second direction DR2. For example, the length of the light emitting element LE in the third direction DR3 may be about 1 μm to about 5 μm.

The light emitting element LE may be a micro light emitting diode element. The light emitting element LE includes a first semiconductor layer SEM1, an electron blocking layer EBL, an active layer MQW, a superlattice layer SLT, and a second semiconductor layer SEM2 in the third direction DR3 as shown in FIG. 6. The first semiconductor layer SEM1, the electron blocking layer EBL, the active layer MQW, the superlattice layer SLT, and the second semiconductor layer SEM2 may sequentially be deposited in the third direction DR3.

The first semiconductor layer SEM1 may be disposed on the connection electrode 112. The first semiconductor layer SEM1 may be doped with a first conductive type dopant such as Mg, Zn, Ca, Se, and Ba. For example, the first semiconductor layer SEM1 may be p-GaN doped with p-type Mg. A thickness of the first semiconductor layer SEM1 may be about 30 nm to about 200 nm.

The electron blocking layer EBL may be disposed on the first semiconductor layer SEM1. The electron blocking layer EBL may be a layer for suppressing or preventing excessive electrons from flowing to the active layer MQW. For example, the electron blocking layer EBL may be p-AlGaN doped with p-type Mg. A thickness of the electron blocking layer EBL may be about 10 nm to about 50 nm. The electron blocking layer EBL may be omitted.

The active layer MQW may be disposed on the electron blocking layer EBL. The active layer MQW may emit light by combination of electron-hole pairs in accordance with an electrical signal applied through the first semiconductor layer SEM1 and the second semiconductor layer SEM2. The active layer MQW may emit first light having a main peak wavelength band ranging from about 450 nm to about 495 nm, for example, light of a blue wavelength band.

The active layer MQW may include a single or multiple quantum well structure material. In case that the active layer MQW includes a multiple quantum well structure material, well layers and barrier layers may alternately be deposited. In this case, the well layer may be formed of, but not limited to, InGaN, and the barrier layer may be formed of, but not limited to, GaN or AlGaN. A thickness of the well layer may be about 1 nm to about 4 nm, and a thickness of the barrier layer may be about 3 nm to about 10 nm.

Alternately, the active layer MQW may have a structure in which semiconductor materials having a large band gap energy and semiconductor materials having a low band gap energy are alternately deposited, and may include different group III to group V semiconductor materials depending on a wavelength range of light that is emitted. The light emitted from the active layer MQW is not limited to the first light (light of a blue wavelength band), and may emit second light (light of a green wavelength band), third light (light of red wavelength band), or light of any color as the case may be.

The superlattice layer SLT may be disposed on the active layer MQW. The superlattice layer SLT may be a layer for mitigating stress between the second semiconductor layer SEM2 and the active layer MQW. For example, the superlattice layer SLT may be formed of InGaN or GaN. A thickness of the superlattice layer SLT may be about 50 nm to about 200 nm. The superlattice layer SLT may be omitted.

The second semiconductor layer SEM2 may be disposed on the superlattice layer SLT. The second semiconductor layer SEM2 may be doped with a second conductive type dopant such as Si, Ge and Sn. For example, the second semiconductor layer SEM2 may be n-GaN doped with n-type Si. A thickness of the second semiconductor layer SEM2 may be 2 µm to 4 µm.

The partition wall PW may be disposed to be spaced apart from the light emitting element LE disposed in each of the first light emitting areas EA1, the second light emitting areas EA2, and the third light emitting areas EA3. The partition wall PW may be disposed to surround the light emitting element LE disposed in each of the first light emitting areas EA1, the second light emitting areas EA2, and the third light emitting areas EA3.

The partition wall PW may be disposed on common connection electrodes CCE. A width Wpw of the partition wall PW in the first direction DR1 and/or the second direction DR2 may be narrower than a width Wcce of the common connection electrode CCE. The partition wall PW may be disposed to be spaced apart from the light emitting elements LE.

The partition wall PW may include a first partition wall PW1, a second partition wall PW2, and a third partition wall PW3.

The first partition wall PW1 may be disposed on the first insulating film INS1. The first partition wall PW1 and the light emitting element LE may be formed by the same process, and at least a partial area of the first partition wall PW1 and the light emitting element LE may include the same material.

The first partition wall PW1 may include sub-partition walls (or sub-banks) SPW1 to SPW6 sequentially deposited in the third direction DR3. For example, the first partition wall PW1 may include a first sub-partition wall SPW1, a second sub-partition wall SPW2, a third sub-partition wall SPW3, a fourth sub-partition wall SPW4, a fifth sub-partition wall SPW5, and a sixth sub-partition wall SPW6.

The first sub-partition wall SPW1 and the first semiconductor layer SEM1 of the light emitting element LE may be formed of (or include) the same material. The first sub-partition wall SPW1 and the first semiconductor layer SEM1 of the light emitting element LE may be formed by the same process. A thickness Tspw1 of the first sub-partition wall SPW1 may be substantially equal to a thickness Tsem1 of the first semiconductor layer SEM1 of the light emitting element LE.

The second sub-partition wall SPW2 and the electron blocking layer EBL of the light emitting element LE may be formed of the same material. The second sub-partition wall SPW2 and the electron blocking layer EBL of the light emitting element LE may be formed by the same process. A thickness Tspw2 of the second sub-partition wall SPW2 may be substantially equal to thickness Teb1 of the electron blocking layer EBL of the light emitting element LE. In case that the electron blocking layer EBL is omitted, the second sub-partition wall SPW2 may also be omitted.

The third sub-partition wall SPW3 and the active layer MQW of the light emitting element LE may be formed of the same material. The third sub-partition wall SPW3 and the active layer MQW of the light emitting element LE may be formed by the same process. A thickness Tspw3 of the third sub-partition wall SPW3 may be substantially equal to a thickness Tmqw of the active layer MQW of the light emitting element LE The fourth sub-partition wall SPW4 and the superlattice layer SLT of the light emitting element LE may be formed of the same material. The fourth sub-partition wall SPW4 and the superlattice layer SLT of the light emitting element LE may be formed by the same process. A thickness Tspw4 of the fourth sub-partition wall SPW4 may be substantially equal to a thickness Tslt of the superlattice layer SLT of the light emitting element LE.

The fifth sub-partition wall SPW5 and the second semiconductor layer SEM2 of the light emitting element LE may be formed of the same material. The fifth sub-partition wall SPW5 and the second semiconductor layer SEM2 of the light emitting element LE may be formed by the same process. The fifth sub-partition wall SPW5 may not be removed, while a portion of the second semiconductor layer SEM2 of the light emitting element LE may be removed during the fabricating process of the display panel 100, and thus a thickness Tspw5 of the fifth sub-partition wall SPW5 may be thicker or greater than the thickness Tsem2 of the second semiconductor layer SEM2 of the light emitting element LE.

The sixth sub-partition wall SPW6 may be formed of a semiconductor layer that is not doped with a dopant, that is, an undoped semiconductor layer. For example, the sixth sub-partition wall SPW6 may be an undoped GaN that is not doped with a dopant. A thickness Tspw6 of the sixth sub-partition wall SPW6 may be greater than the thickness Tsem2 of the second semiconductor layer SEM2 of the light emitting element LE. The thickness Tspw6 of the sixth sub-partition wall SPW6 may be about 2 µm to about 3 µm.

The second partition wall PW2 and the third partition wall PW3 may serve or function as masks for preventing the first partition wall PW1 from being etched during a fabricating process for forming a light emitting element LE and a partition wall PW.

The second partition wall PW2 may be disposed on the first partition wall PW1. The second partition wall PW2 may be formed of an inorganic film such as a silicon oxide film ($SiO_2$), an aluminum oxide film ($Al_2O_3$), or a hafnium oxide film ($HfO_x$). A thickness Tpw2 of the second partition wall PW2 may be about 1 µm to about 2 µm.

The third partition wall PW3 may be disposed on the second partition wall PW2. The third partition wall PW3 may include a conductive material such as nickel (Ni). A thickness Tpw3 of the third partition wall PW3 may be about 0.01 µm to about 1 µm.

The second insulating film INS2 may be disposed on sides of the common connection electrode CCE, sides of the partition wall PW, sides of each of the pixel electrodes 111, sides of each of the connection electrodes 112, and sides of each of the light emitting elements LE. The second insulating film INS2 may be formed of an inorganic film, such as a silicon oxide film ($SiO_2$), an aluminum oxide film ($Al_2O_3$), or a hafnium oxide film ($HfO_x$). A thickness of the second insulating film INS2 may be 0.1 µm.

The common electrode CE may be disposed on the upper surface and sides of each of the light emitting elements LE and the upper surface and sides of the partition wall PW. For example, the common electrode CE may be disposed to cover (or overlap) the upper surface and sides of each of the light emitting elements LE and the upper surface and sides of the partition wall PW.

The common electrode CE may contact the second insulating film INS2 disposed on the sides of the common connection electrode CCE, the sides of the partition wall PW, the sides of each of the pixel electrodes 111, the sides of each of the connection electrodes 112 and the sides of each of the light emitting elements LE. In addition, the common electrode CE may contact the upper surface of the common connection electrode CCE, the upper surface of each of the light emitting elements LE, and the upper surface of the partition wall PW.

The common electrode CE may contact the upper surface of the common connection electrode CCE and the upper surface of the light emitting element LE, which are exposed without being covered by the second insulating film INS2. Therefore, the common voltage supplied to the common connection electrode CCE may be applied to the light emitting element LE. For example, one end of the light emitting element LE may be supplied with a pixel voltage or an anode voltage of the pixel electrode 111 through the connection electrode 112, and the other end thereof may be supplied with the common voltage through the common electrode CE. The light emitting element LE may emit light with predetermined luminance in accordance with a voltage difference between the pixel voltage and the common voltage.

The common electrode CE may include a transparent conductive material. The common electrode CE may be formed of a transparent conductive oxide (TCO) such as indium tin oxide (ITO) or indium zinc oxide (IZO). A thickness of the common electrode CE may be about 0.1 μm.

The reflection film RF serves to reflect light moving to upper and lower sides and left and right sides not an upper direction among the light emitted from the light emitting element LE. The reflection film RF may include a metal material having high reflectance, such as aluminum (Al). A thickness of the reflection film RF may be about 0.1 μm.

The reflection film RF may be disposed on the sides of the common connection electrode CCE, the sides of the partition wall PW, the sides of each of the pixel electrodes 111, the sides of each of the connection electrodes 112, and the sides of each of the light emitting elements LE. The reflection film RF may contact the common electrode CE disposed on the sides of the common connection electrode CCE, the sides of the partition wall PW, the sides of each of the pixel electrodes 111, the sides of each of the connection electrodes 112, and the sides of each of the light emitting elements LE.

The protective film PTF may be disposed on the light emitting element LE in each of the first light emitting areas EA1, the second light emitting areas EA2, and the third light emitting areas EA3. The protective film PTF may be disposed between the light emitting element LE and the partition wall PW in each of the first light emitting areas EA1, the second light emitting areas EA2, and the third light emitting areas EA3. For example, the protective film PTF may be disposed in a gap space ES between the light emitting element LE and the partition wall PW in each of the first light emitting areas EA1, the second light emitting areas EA2, and the third light emitting areas EA3. In an embodiment, the protective film PTF is disposed in the gap space ES, the protective film PTF may have an upside-down U-shaped sectional shape or a chair-shaped sectional shape. Also, the protective film PTF may be formed in the gap space ES at substantially 90° with respect to other parts of the protective film PTF, the embodiment of the disclosure is not limited thereto.

Since the protective film PTF is disposed between the light emitting element LE and the wavelength conversion layer QDL, a distance between the light emitting element LE and the wavelength conversion layer QDL may be increased due to the protective film PTF. Therefore, wavelength conversion particles WCP1 and WCP2 of the wavelength conversion layer QDL may be prevented from being damaged due to heat emission of the light emitting element LE. In an embodiment, a thickness of the protective film PTF may be about 1 μm to about 3 μm, from the upper surface of the light emitting element LE in the third direction DR3, and a thickness of the wavelength conversion layer QDL in the third direction may be about 2 μm to 10 μm.

The protective film PTF may include a first base resin BRS1 and a first scatterer SCT1 scattered in the first base resin BRS1. Since a length of each of the first light emitting areas EA1, the second light emitting areas EA2, and the third light emitting areas EA3 in the first direction DR1 or the second direction DR2 is only several micrometers, a diameter of the first scatterer SCT1 may be several nanometers to several tens of nanometers. Since the protective film PTF includes the first scatterer SCT1, the light of the light emitting element LE may be scattered, e.g., in a random direction. For this reason, a path length of light passing through the wavelength conversion layer QDL may be increased, whereby color conversion efficiency based on the wavelength conversion layer QDL may be increased.

The first base resin BRS1 may include a light-transmissive organic material. For example, the first base resin BRS1 may include an epoxy-based resin, an acrylic resin, a cardo-based resin, or an imide-based resin. The first base resin BRS1 may be a UV curable resin or a thermosetting resin.

The first scatterer SCT1 may include metal oxide particles or organic particles. For example, the metal oxide may be titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). In addition, the organic particles may include an acrylic resin or a urethane-based resin.

The wavelength conversion layer QDL may be disposed on the protective film PTF in each of the first light emitting areas EA1, the second light emitting areas EA2, and the third light emitting areas EA3. The wavelength conversion layer QDL may convert a portion of first light incident from the light emitting element LE into fourth light and emit the fourth light (or light of a fourth color). For example, the fourth light may be the light of a yellow wavelength band. The fourth light may be the light that includes both a green wavelength band and a red wavelength band. For example, the fourth light may be mixture light of second light and third light.

The wavelength conversion layer QDL may include a second base resin BRS2 and wavelength conversion particles WCP. The second base resin BRS2 may include a light-transmissive organic material. For example, the second base resin BRS2 may include an epoxy-based resin, an acrylic resin, a cardo-based resin, or an imide-based resin. The second base resin BRS2 may substantially identical or similar to the first base resin BRS1, but is not limited thereto.

The wavelength conversion particles WCP may convert the first light incident from the light emitting element LE into the fourth light. For example, the wavelength conversion particles WCP may convert the light of the blue wavelength band into the light of the yellow wavelength band. The wavelength conversion particles WCP may be quantum dots (QD), quantum rods, fluorescent materials, or phosphorescent materials. The quantum dots may include group IV nanocrystal, group II-VI compound nanocrystal, group III-V compound nanocrystal, group IV-VI nanocrystal, or their combination.

The quantum dots may include a core and a shell that over-coats the core. For example, the core may be, but not limited to, at least one of CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si, or Ge. The shell may include, but is not limited to, at least one of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe or PbTe.

The wavelength conversion layer QDL may further include a scatterer for scattering the light of the light emitting element LE in a random direction. In this case, the scatterer may include metal oxide particles or organic particles. For example, the metal oxide may be titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). In addition, the organic particles may include an acrylic resin or a urethane-based resin. A diameter of the scatterer may in a range of nanoscale to microscale (e.g., several nanometers to several tens of nanometers).

A height Tqdl of the wavelength conversion layer QDL may be higher than a height Tptf of the protective film PTF. As the height Tqdl of the wavelength conversion layer QDL becomes higher, a content of the wavelength conversion particles WCP contained in the wavelength conversion layer QDL is increased, whereby light conversion efficiency of the wavelength conversion layer QDL may be increased. Therefore, it is preferable that the height Tqdl of the wavelength conversion layer QDL and the height Tptf of the protective film PTF are set in consideration of light conversion efficiency of the wavelength conversion layer QDL.

The color filters CF1, CF2 and CF3 may include first color filters CF1, second color filters CF2, and third color filters CF3.

Each of the first color filters CF1 may be disposed on the wavelength conversion layer QDL in the first light emitting area EA1. Also, each of the first color filters CF1 may be disposed on the partition wall PW. Each of the first color filters CF1 may transmit the first light and absorb or block the fourth light. For example, each of the first color filters CF1 may transmit light of the blue wavelength band and absorb or block light of the green and red wavelength bands. Therefore, each of the first color filters CF1 may transmit the first light, which is not converted by the wavelength conversion layer QDL, among the first light emitted from the light emitting element LE, and may absorb or block the fourth light converted by the wavelength conversion layer QDL. Therefore, each of the first light emitting areas EA1 may emit the first light.

Each of the second color filters CF2 may be disposed on the wavelength conversion layer QDL in the second light emitting area EA2. Also, each of the second color filters CF2 may be disposed on the partition wall PW. Each of the second color filters CF2 may transmit the second light, and may absorb or block the first light and the third light. For example, each of the second color filters CF2 may transmit the light of the green wavelength band and absorb or block the light of the blue and red wavelength bands. Therefore, each of the second color filters CF2 may absorb or block the first light that is not converted by the wavelength conversion layer QDL among the first light emitted from the light emitting element LE. In addition, each of the second color filters CF2 may transmit the second light corresponding to the green wavelength band among the fourth light converted by the wavelength conversion layer QDL, and may absorb or block the third light corresponding to the blue wavelength band. Therefore, each of the second light emitting areas EA2 may emit the second light.

Each of the third color filters CF3 may be disposed on the wavelength conversion layer QDL in the third light emitting area EA3. Also, each of the third color filters CF3 may be disposed on the partition wall PW. Each of the third color filters CF3 may transmit the third light and absorb or block the first light and the second light. For example, each of the third color filters CF3 may transmit the light of the red wavelength band and absorb or block the light of the blue and green wavelength bands. Therefore, each of the third color filters CF3 may absorb or block the first light that is not converted by the wavelength conversion layer QDL among the first light emitted from the light emitting element LE. In addition, each of the third color filters CF3 may transmit the third light corresponding to the red wavelength band among the fourth light converted by the wavelength conversion layer QDL, and may absorb or block the second light corresponding to the green wavelength band. Therefore, each of the third light emitting areas EA3 may emit the third light.

As shown in FIGS. 4 to 7, the protective film PTF is disposed between the light emitting element LE and the wavelength conversion layer QDL in each of the first light emitting areas EA1, the second light emitting areas EA2, and the third light emitting areas EA3. Thus, a distance between the light emitting element LE and the wavelength conversion layer QDL may be increased due to the protective film PTF. Therefore, wavelength conversion particles WCP1 and WCP2 of the wavelength conversion layer QDL may be prevented from being damaged due to heat emission of the light emitting element LE.

Also, since the protective film PTF includes the first scatterer SCT1, the light of the light emitting element LE may be scattered in a random direction. For this reason, a path length of light passing through the wavelength conversion layer QDL may be increased, whereby color conversion efficiency based on the wavelength conversion layer QDL may be increased.

Also, at least a partial area of the partition wall PW and light emitting elements LE may include the same material. For example, since the partition wall PW and the light emitting elements LE may be formed by the same process, the fabricating process may be simplified.

Figure 8:
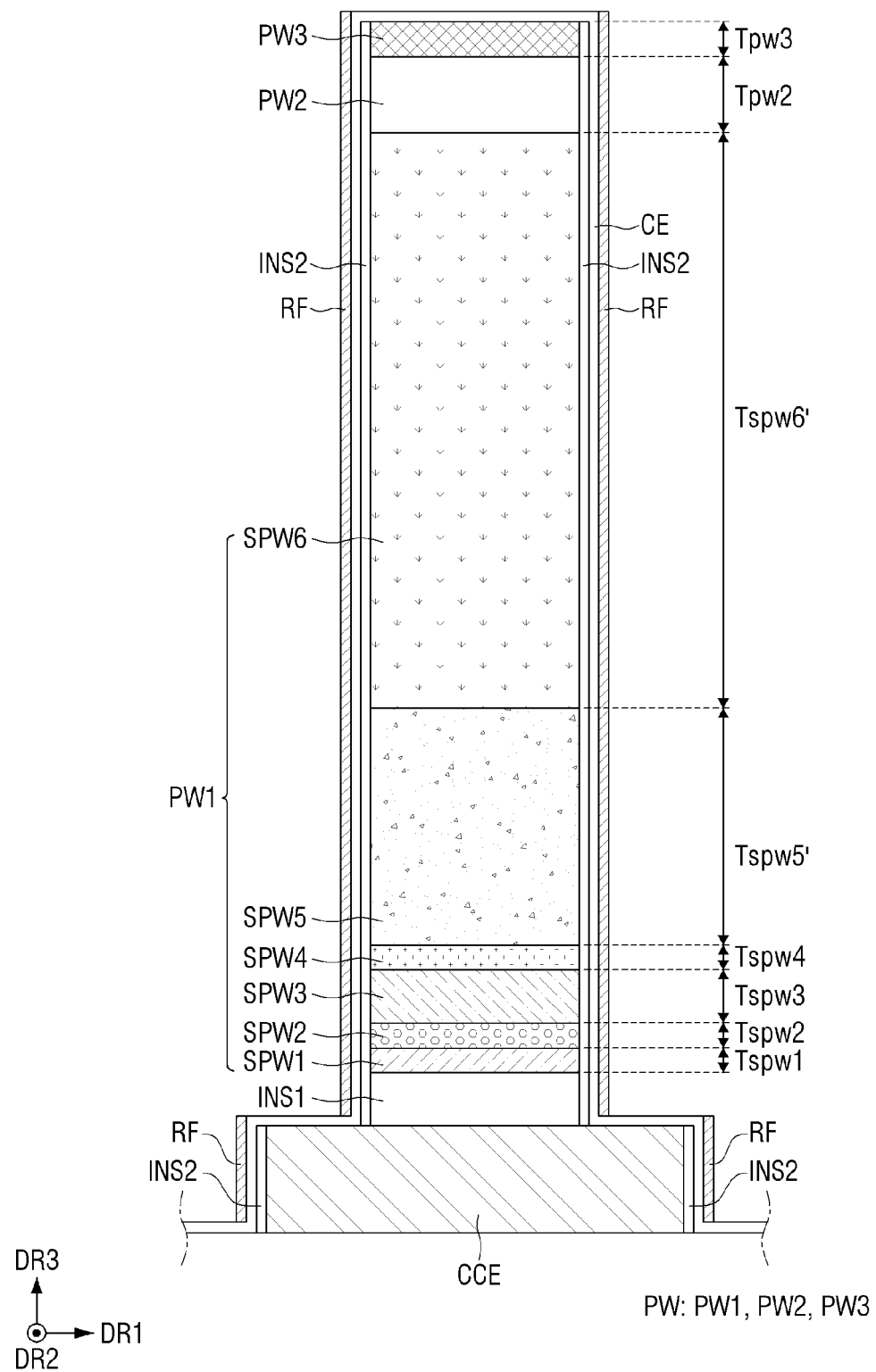
FIG. 8 is a detailed enlarged cross-sectional view schematically illustrating another example of a partition wall of FIG. 5.

FIG. 8 is a detailed enlarged cross-sectional view schematically illustrating another example of a partition wall of FIG. 5.

The embodiment of FIG. 8 is different from the embodiment of FIG. 7 at least in that a thickness Tspw5' of the five sub-partition wall SPW5 of the first partition wall PW1 is substantially equal to the thickness Tsem2 of the second semiconductor layer SEM2 of the light emitting element LE and that the thickness Tspw5' of the five sub-partition wall SPW5 of the first partition wall PW1 is thinner or smaller than a thickness Tspw6' of the sixth sub-partition wall SPW6. The embodiment of FIG. 8 is structurally different from the embodiment of FIG. 7 at least in that an undoped semiconductor layer disposed on the light emitting element LE is only removed during the fabricating process to form the light emitting element LE.

Figure 9:
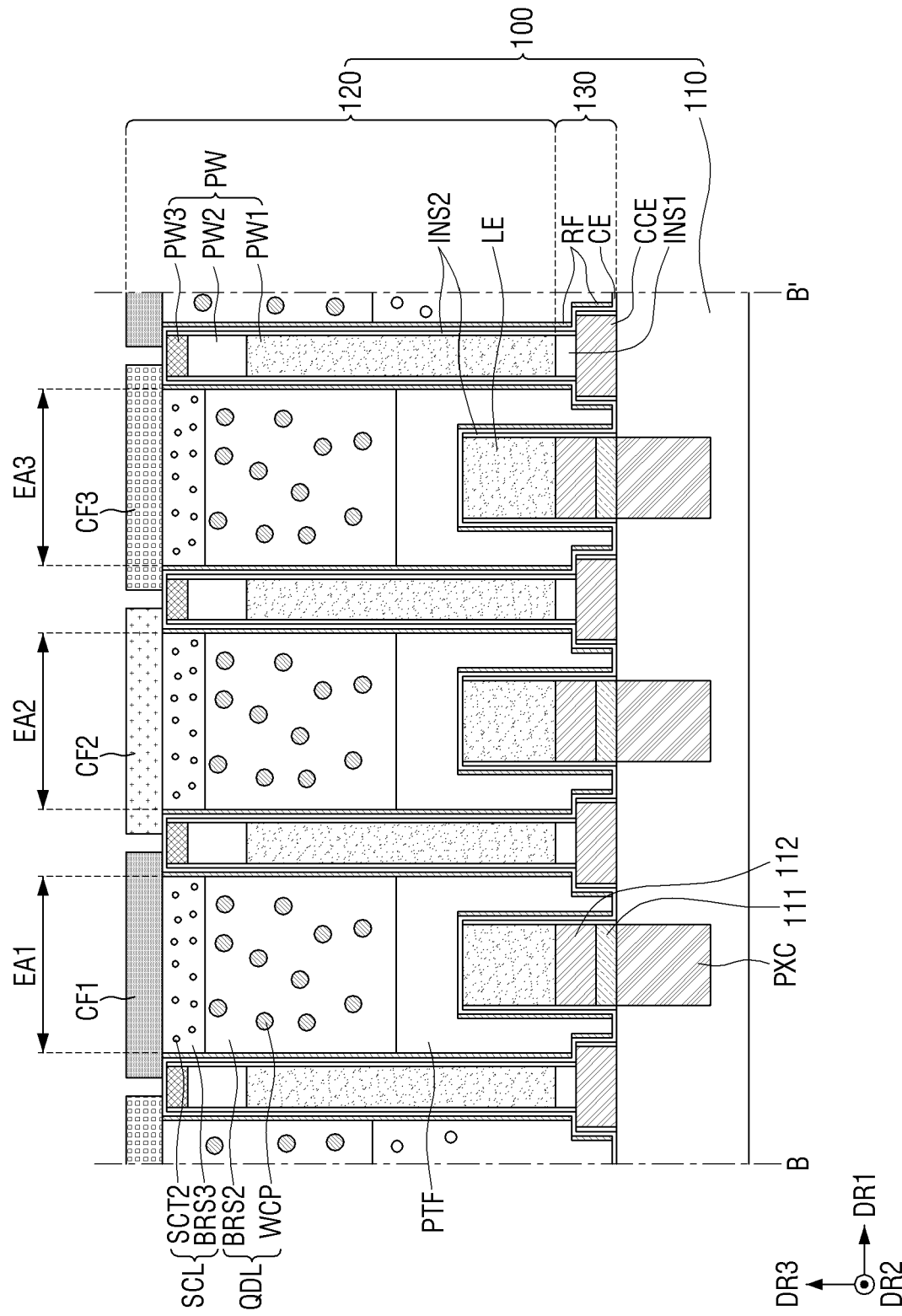
FIG. 9 is a cross-sectional view schematically illustrating another example of a display panel taken along line B-B' of FIGS. 4 and 5.

FIG. 9 is a cross-sectional view schematically illustrating another example of a display panel taken along line B-B' of FIGS. 4 and 5.

The embodiment of FIG. 9 is different from the embodiment of FIGS. 4 and 5 at least in that the protective film PTF does not include the first scatterer SCT1 in each of the first light emitting areas EA1, the second light emitting areas EA2, and the third light emitting areas EA3, and further includes a scattering layer SCL on the wavelength conversion layer QDL. In FIG. 9, the repetitive descriptions with respect to the embodiment(s) of FIGS. 4 and 5 will be omitted.

Referring to FIG. 9, the protective film PTF may include a light-transmissive organic material. For example, the protective film PTF may include an epoxy-based resin, an acrylic resin, a cardo-based resin, or an imide-based resin. The protective film PTF may not include a scatterer.

The scattering layer SCL may include a third base resin BRS3 and a second scatterer SCT2 scattered in the third base resin BRS3. In an embodiment, a length of each of the first light emitting areas EA1, the second light emitting areas EA2, and the third light emitting areas EA3 in the first direction DR1 or the second direction DR2 may be only several micrometers, and a diameter of the second scatterer SCT2 may be several nanometers to several tens of nanometers. The scattering layer SCL may include the second scatterer SCT2, and it may scatter light that has passed through the wavelength conversion layer QDL, in a random direction.

The third base resin BRS3 may include a light-transmissive organic material. For example, the third base resin BRS3 may include an epoxy-based resin, an acrylic resin, a cardo-based resin, or an imide-based resin. The third base resin BRS3 may be substantially identical or similar to the protective film PTF or the second base resin BRS2, but is not limited thereto.

The second scatterer SCT2 may include metal oxide particles or organic particles. For example, the metal oxide may be titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). In addition, the organic particles may include an acrylic resin or a urethane-based resin.

Meanwhile, an arrangement position of the scattering layer SCL is not limited to that shown in FIG. 9. For example, the scattering layer SCL may be disposed between the protective film PTF and the wavelength conversion layer QDL. In another example, the scattering layer SCL may be omitted.

Figure 10:
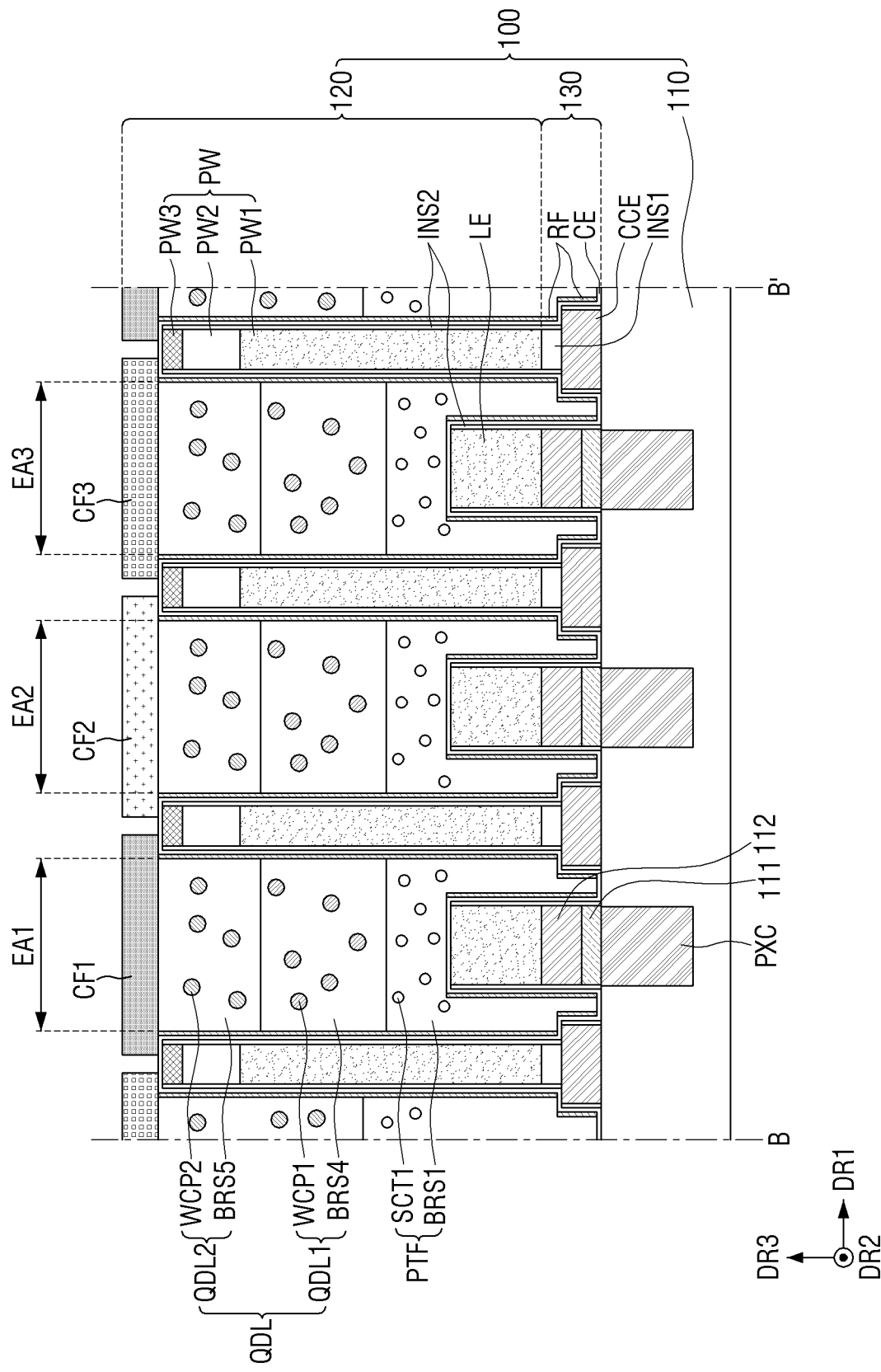
FIG. 10 is a cross-sectional view schematically illustrating still another example of a display panel taken along line B-B' of FIGS. 4 and 5.

FIG. 10 is a cross-sectional view schematically illustrating still another example of a display panel taken along line B-B' of FIGS. 4 and 5.

The embodiment of FIG. 10 is different from the embodiment of FIGS. 4 and 5 at least in that the wavelength conversion layer QDL includes a first wavelength conversion layer QDL1 and a second wavelength conversion layer QDL2 in each of the first light emitting areas EA1, the second light emitting areas EA2, and the third light emitting areas EA3. In FIG. 10, repetitive descriptions with respect to the embodiment(s) of FIGS. 4 and 5 will be omitted.

Referring to FIG. 10, the first wavelength conversion layer QDL1 may be disposed on the protective film PTF. The first wavelength conversion layer QDL1 may include a fourth base resin BRS4 and first wavelength conversion particles WCP1. The fourth base resin BRS4 may include a light-transmissive organic material. For example, the fourth base resin BRS4 may include at least one of an epoxy-based resin, an acrylic resin, a cardo-based resin, and an imide-based resin. The fourth base resin BRS4 may be substantially identical or similar to the first base resin BRS1, but is not limited thereto. The first wavelength conversion particles WCP1 may convert the first light incident from the light emitting element LE into the second light. For example, the first wavelength conversion particles WCP1 may convert the light of the blue wavelength band into the light of the green wavelength band. The first wavelength conversion particles WCP1 may be quantum dots (QD), quantum dots, quantum rods, fluorescent materials, or phosphorescent materials.

The second wavelength conversion layer QDL2 may be disposed on the first wavelength conversion layer QDL1. The second wavelength conversion layer QDL2 may include a fifth base resin BRS5 and second wavelength conversion particles WCP2. The fifth base resin BRS5 may include a light-transmissive organic material. For example, the fifth base resin BRS5 may include an epoxy-based resin, an acrylic resin, a cardo-based resin, or an imide-based resin. The fifth base resin BRS5 may be substantially identical or similar to the first base resin BRS1, but is not limited thereto. The second wavelength conversion particles WCP2 may convert the first light incident from the light emitting element LE into the third light. For example, the second wavelength conversion particles WCP2 may convert the light of the blue wavelength band into the light of the red wavelength band. The second wavelength conversion particles WCP2 may be quantum dots (QD), quantum rods, fluorescent materials, or phosphorescent materials.

The first light that is not converted by the first wavelength conversion layer QDL1 and the second wavelength conversion layer QDL2 among the first light emitted from the light emitting element LE may transmit through the first color filter CF1. Among the first light emitted from the light emitting element LE, the second light converted by the first wavelength conversion layer QDL1 and the third light converted by the second wavelength conversion layer QDL2 may be absorbed or blocked by the first color filter CF1. Therefore, the first light emitting area EA1 may emit the first light.

The first light that is not converted by the first wavelength conversion layer QDL1 and the second wavelength conversion layer QDL2 among the first light emitted from the light emitting element LE may be absorbed or blocked by the second color filter CF2. In addition, among the first light emitted from the light emitting element LE, the second light converted by the first wavelength conversion layer QDL1 may transmit through the second color filter CF2 but the third light converted by the second wavelength conversion layer QDL2 may be absorbed or blocked by the second color filter CF2. Therefore, the second light emitting area EA2 may emit the second light.

The first light that is not converted by the first wavelength conversion layer QDL1 and the second wavelength conversion layer QDL2 among the first light emitted from the light emitting element LE may be absorbed or blocked by the second color filter CF2. In addition, among the first light emitted from the light emitting element LE, the second light converted by the first wavelength conversion layer QDL1 is absorbed or blocked by the second color filter CF2 but the third light converted by the second wavelength conversion layer QDL2 may transmit through the second color filter CF2. Therefore, the third light emitting area EA3 may emit the third light.

Figure 11:
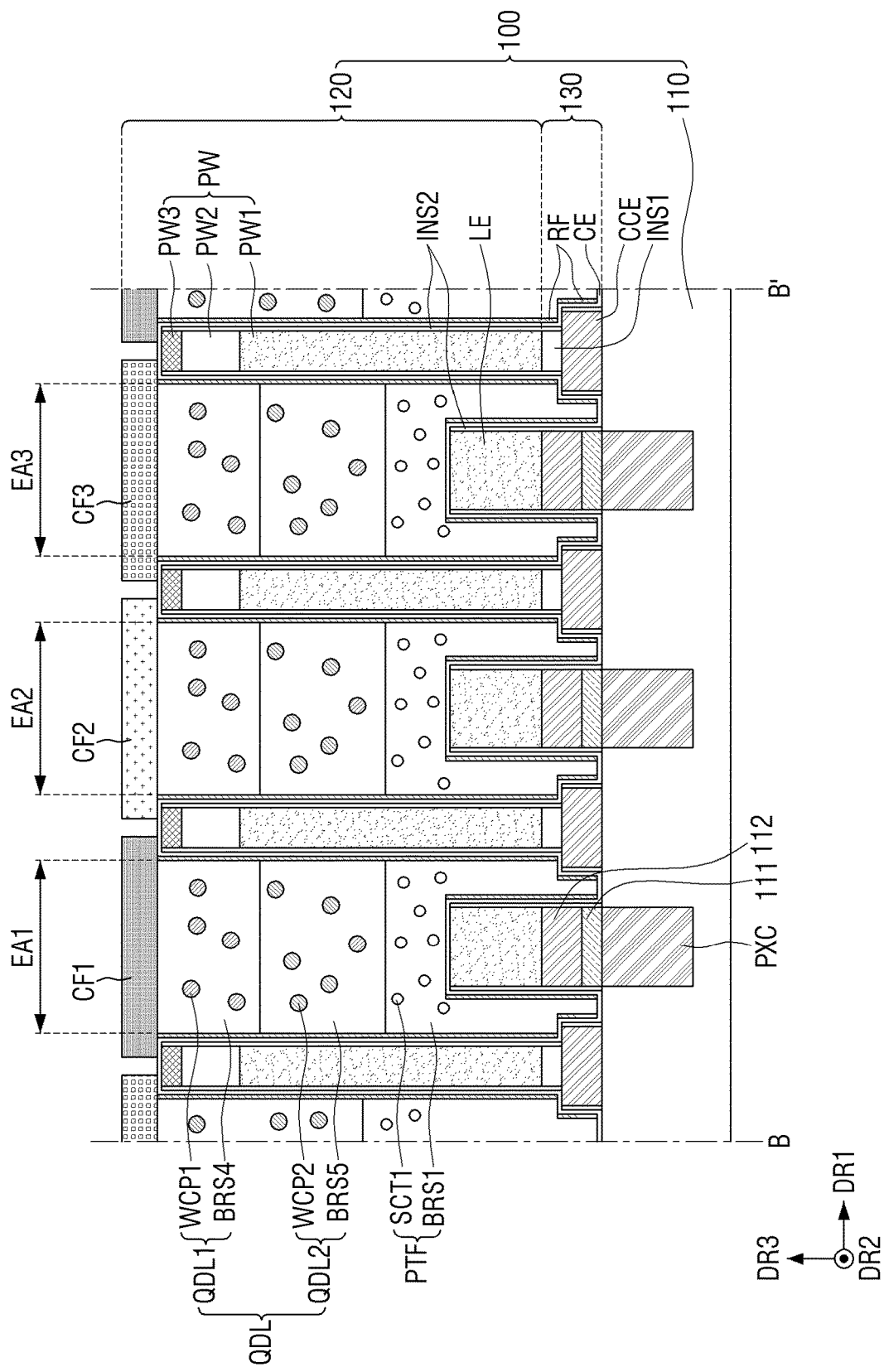
FIG. 11 is a cross-sectional view schematically illustrating further still another example of a display panel taken along line B-B' of FIGS. 4 and 5.

FIG. 11 is a cross-sectional view schematically illustrating further still another example of a display panel taken along line B-B' of FIGS. 4 and 5.

The embodiment of FIG. 11 may be different from the embodiment of FIG. 10 at least in that the second wavelength conversion layer QDL2 is disposed on the protective film PTF and that the first wavelength conversion layer QDL1 is disposed on the second wavelength conversion layer QDL2. Therefore, repetitive descriptions of the embodiment of FIG. 11 will be omitted.

Figure 12:
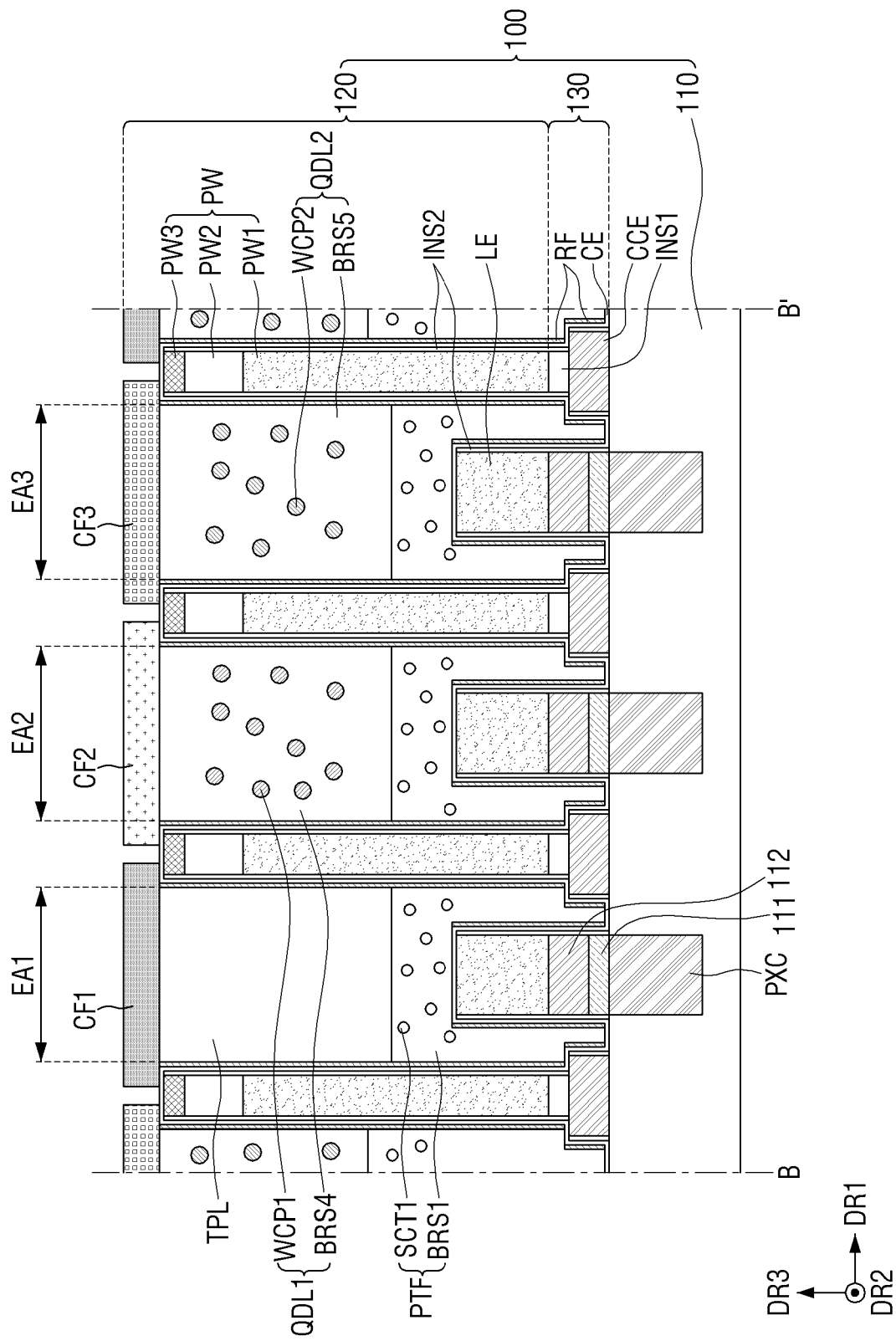
FIG. 12 is a cross-sectional view schematically illustrating further still another example of a display panel taken along line B-B' of FIGS. 4 and 5.

FIG. 12 is a cross-sectional view schematically illustrating further still another example of a display panel taken along line B-B' of FIGS. 4 and 5.

The embodiment of FIG. 12 is different from the embodiment of FIGS. 4 and 5 at least in that a light transmitting layer TPL is disposed in each of the first light emitting areas EA1, the first wavelength conversion layer QDL1 is disposed in each of the second light emitting areas EA2, and the second wavelength conversion layer QDL2 is disposed in each of the third light emitting areas EA3. In FIG. 12, the description duplicated with the embodiment of FIGS. 4 and 5 will be omitted.

Referring to FIG. 12, the light transmitting layer TPL may be disposed on the protective film PTF in each of the first light emitting areas EA1. The light transmitting layer TPL may include a light-transmissive organic material. For example, the light transmitting layer TPL may include an epoxy-based resin, an acrylic resin, a cardo-based resin, or an imide-based resin.

The first wavelength conversion layer QDL1 may be disposed on the protective film PTF in each of the second light emitting areas EA2. The first wavelength conversion layer QDL1 may include a fourth base resin BRS4 and first wavelength conversion particles WCP1. The fourth base resin BRS4 and the first wavelength conversion particles WCP1 may be substantially identical or similar to those described with reference to FIG. 10. Therefore, repetitive descriptions of the fourth base resin BRS4 and the first wavelength conversion particles WCP1 will be omitted.

The second wavelength conversion layer QDL2 may be disposed on the protective film PTF in each of the third light emitting areas EA3. The second wavelength conversion layer QDL2 may include a fifth base resin BRS5 and second wavelength conversion particles WCP2. The fifth base resin BRS5 and the second wavelength conversion particles WCP2 may be substantially identical or similar to those described with reference to FIG. 10. Therefore, repetitive descriptions of the fifth base resin BRS5 and the second wavelength conversion particles WCP2 will be omitted.

The first light emitted from the light emitting element LE in the first light emitting area EA1 may transmit through the first color filter CF1 via the protective film PTF and the light transmitting layer TPL. For example, since the first light emitted from the light emitting element LE in the first light emitting area EA1 is not converted by a separate wavelength conversion layer, the first light may transmit through the first color filter CF1. Therefore, the first light emitting area EA1 may emit the first light.

The second light converted by the first wavelength conversion layer QDL1 among the first light emitted from the light emitting element LE in the second light emitting area EA2 may transmit through the second color filter CF2. The first light that is not converted by the first wavelength conversion layer QDL1 among the first light emitted from the light emitting element LE in the second light emitting area EA2 may be absorbed or blocked by the second color filter CF2. Therefore, the second light emitting area EA2 may emit the second light.

The third light converted by the second wavelength conversion layer QDL2 among the first light emitted from the light emitting element LE in the third light emitting area EA3 may transmit through the third color filter CF3. The first light that is not converted by the second wavelength conversion layer QDL2 among the first light emitted from the light emitting element LE in the third light emitting area EA3 may be absorbed or blocked by the third color filter CF3. Therefore, the third light emitting area EA3 may emit the third light.

Figure 13:
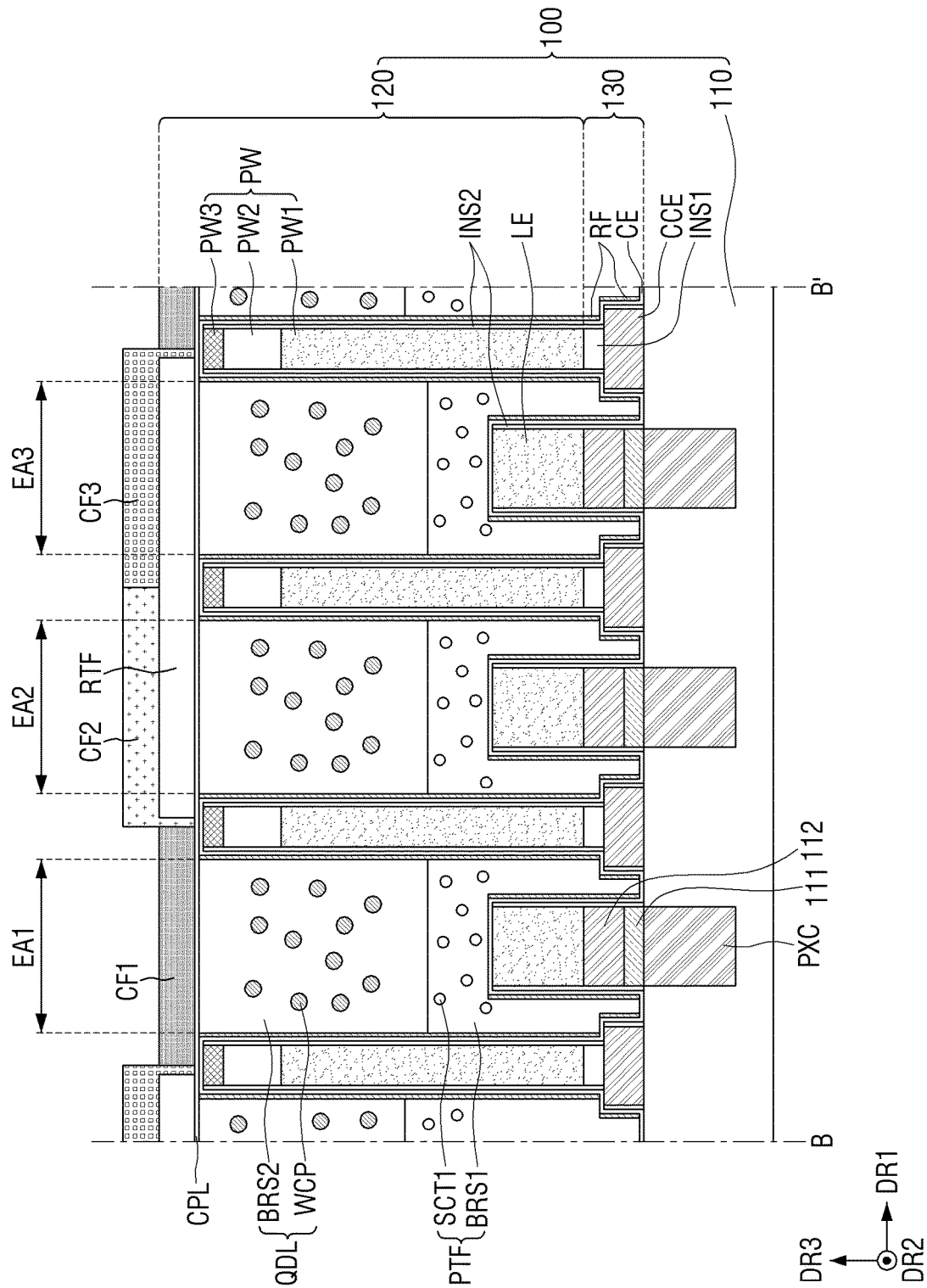
FIG. 13 is a cross-sectional view schematically illustrating further still another example of a display panel taken along line B-B' of FIGS. 4 and 5.

FIG. 13 is a cross-sectional view schematically illustrating further still another example of a display panel taken along line B-B' of FIGS. 4 and 5.

The embodiment of FIG. 13 is different from the embodiment of FIGS. 4 and 5 at least in that a capping layer CPL and a selective transmission film RTF are disposed between wavelength conversion layers QDL and color filters CF1, CF2 and CF3 in the second emission area EA2, and the third light emitting area EA3.

Referring to FIG. 13, the capping layer CPL may be disposed on the wavelength conversion layers QDL and the partition wall PW. The capping layer CPL may be formed of (or include) an inorganic film such as a silicon oxide film ($SiO_2$), an aluminum oxide film ($Al_2O_3$), or a hafnium oxide film ($HfO_x$).

The selective transmission film RTF may be disposed on the capping layer CPL. The selective transmission film RTF may be disposed in the second light emitting area EA2 and the third light emitting area EA3. The selective transmission film RTF may overlap the wavelength conversion layer QDL in the third direction DR3 in each of the second light emitting area EA2 and the third light emitting area EA3. The selective transmission film RTF may be disposed on the partition wall PW disposed between the second light emitting area EA2 and the third light emitting area EA3.

The selective transmission film RTF may be the film that reflects a portion of light emitted from the wavelength conversion layer QDL. For example, the selective transmission film RTF may be the film that reflects the first light and transmits the second light and the third light. The selective transmission film RTF may be a distributed Bragg reflector (DBR). The selective transmission film RTF may have a structure in which first and second inorganic films having their respective refractive indexes different from each other are alternately deposited in the third direction DR3. Each of the first inorganic films may be a silicon oxide film ($SiO_2$) but is not limited thereto, and each of the second inorganic films may be a titanium oxide film ($TiO_2$) but is not limited thereto.

A portion of the first light that is emitted from each of the second light emitting area EA2 and the third light emitting area EA3 as it is without being converted by the wavelength conversion layer QDL may be reflected by the selective transmission film RTF, and then may re-enter the wavelength conversion layer QDL. Therefore, light conversion efficiency of the first light emitted from light emitting element LE in each of the second light emitting area EA2 and the third light emitting area EA3 and converted into the second light or the third light by the wavelength conversion layer QDL may be enhanced. Therefore, emission efficiency of the second light emitted from the second light emitting area EA2 and emission efficiency of the third light emitted from the third light emitting area EA3 may be enhanced.

Figure 14:
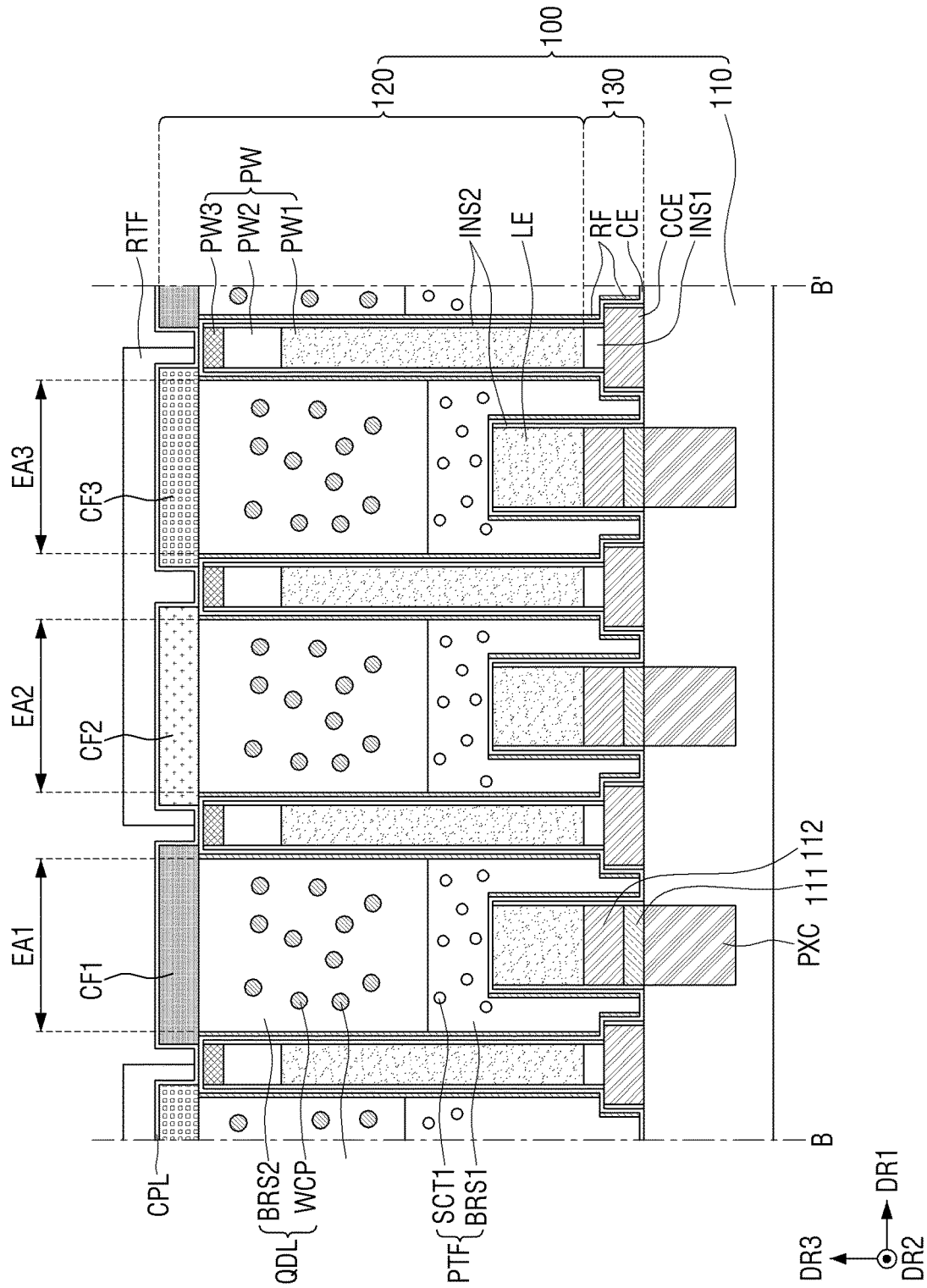
FIG. 14 is a cross-sectional view schematically illustrating further still another example of a display panel taken along line B-B' of FIGS. 4 and 5.

FIG. 14 is a cross-sectional view schematically illustrating further still another example of a display panel taken along line B-B' of FIGS. 4 and 5.

The embodiment of FIG. 14 is different from the embodiment of FIG. 13 at least in that a capping layer CPL and a selective transmission film RTF are disposed on color filters CF1, CF2 and CF3. Therefore, repetitive descriptions of the embodiment of FIG. 14 will be omitted.

Figure 15:
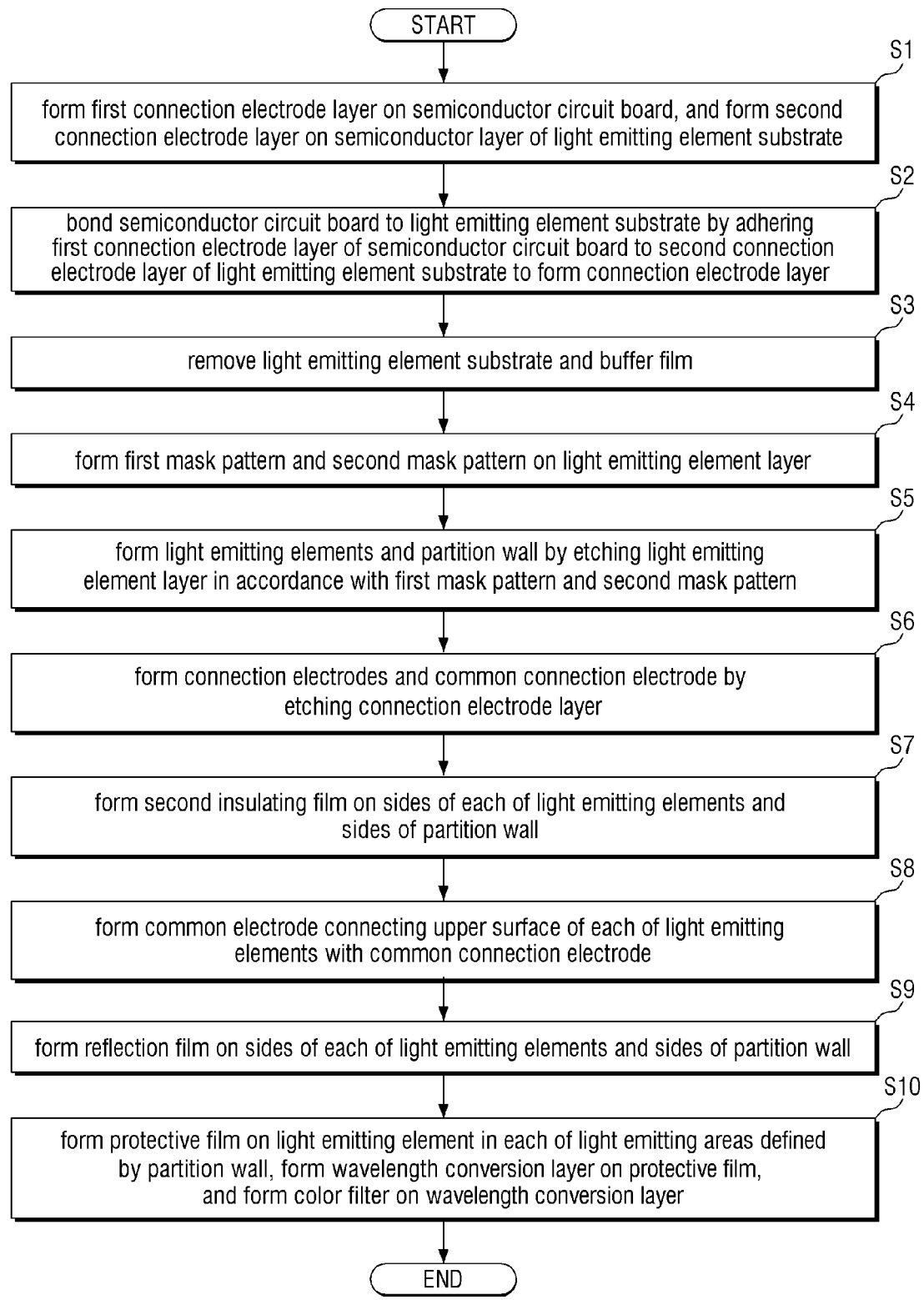
FIG. 15 is a flow chart schematically illustrating a method for fabricating a display device according to an embodiment of the present disclosure.

FIG. 15 is a flow chart schematically illustrating steps of a method for fabricating a display device according to an embodiment of the disclosure. FIGS. 16 to 27 are cross-sectional views schematically illustrating steps of a method for fabricating a display device according to an embodiment of the disclosure. Hereinafter, a method for fabricating a display panel according to an embodiment of the disclosure will be described in detail with reference to FIGS. 15 to 27.

Figure 16:
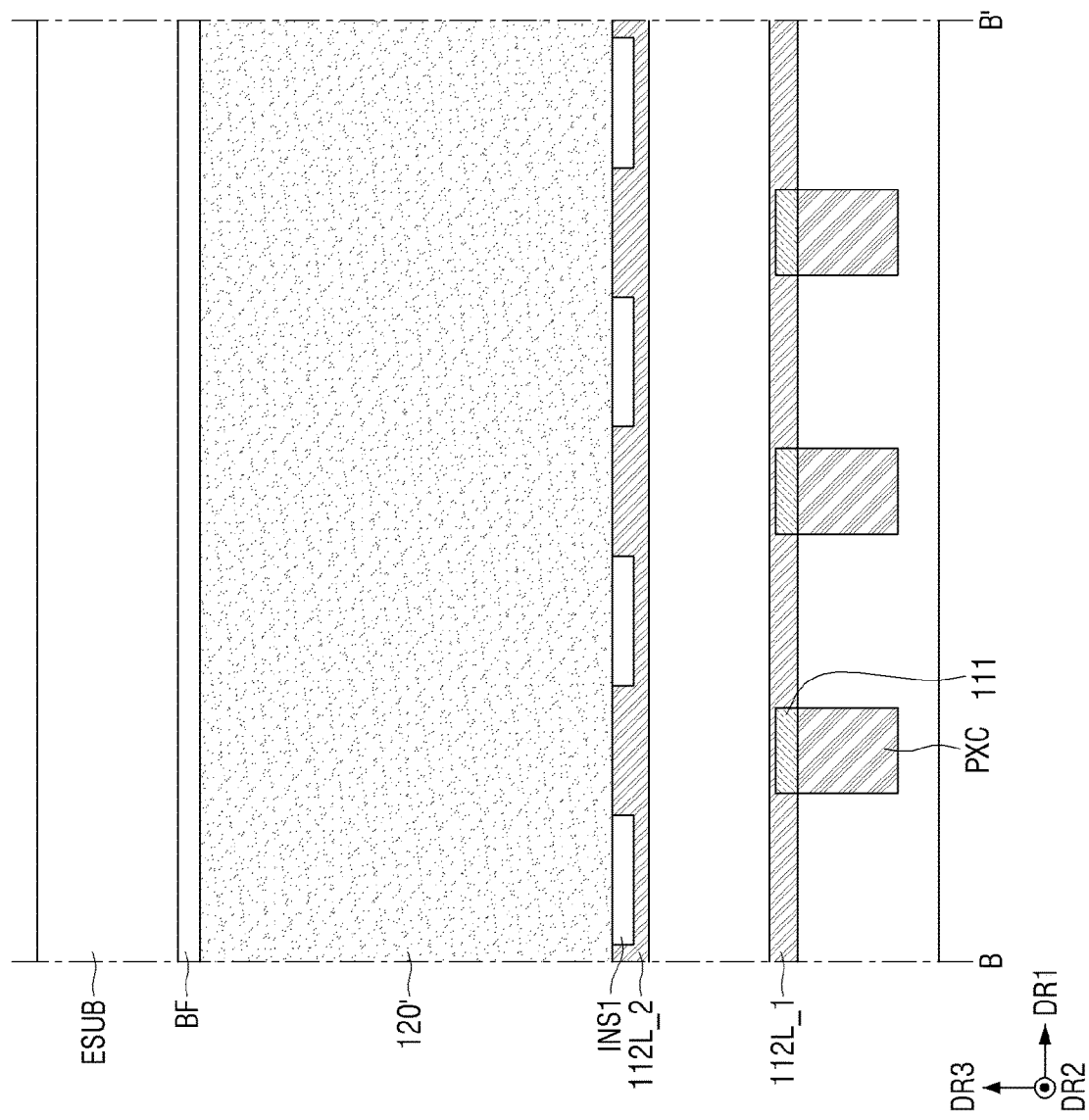
FIGS. 16 to 27 are cross-sectional views schematically illustrating a method for fabricating a display device according to an embodiment of the present disclosure.

First, as shown in FIG. 16, a first connection electrode layer 112L_1 is formed on a semiconductor circuit board 110, and a second connection electrode layer 112L_2 is formed on a light emitting element layer 120' of a light emitting element substrate ESUB (S1 of FIG. 15).

In detail, the first connection electrode layer 112L_1 is deposited to cover (or overlap) pixel electrodes 111 of the semiconductor circuit board 110. The first connection electrode layer 112L_1 may include gold (Au), copper (Cu), aluminum (Al), or tin (Sn). One surface of the first connection electrode layer 112L1 facing the second connection electrode layer 112L2 may be planarized by a polishing process such as a chemical mechanical polishing (CMP) process.

A buffer film BF may be formed on one surface of the light emitting element substrate ESUB. The light emitting element substrate ESUB may be a silicon substrate made of silicon. The buffer film BF may be formed of an inorganic film such as a silicon oxide film ($SiO_2$), an aluminum oxide film ($Al_2O_3$), or a hafnium oxide film ($HfO_x$).

The light emitting element layer 120' may be disposed on the buffer film BF. As shown in FIG. 6, the light emitting element layer 120' may include a first semiconductor layer SEM1, an electron blocking layer EBL, an active layer MQW, a superlattice layer SLT, and a second semiconductor layer SEM2. The light emitting element layer 120' may further include a semiconductor layer that is not doped with a dopant. In this case, the semiconductor layer that is not doped with a dopant, that is, an undoped semiconductor layer may be disposed on the buffer film BF, the second semiconductor layer SEM2 may be disposed on the undoped semiconductor layer, the superlattice layer SLT may be disposed on the second semiconductor layer SEM2, the active layer MQW may be disposed on the superlattice layer SLT, the electron blocking layer EBL may be disposed on the active layer MQW, and the first semiconductor layer SEM1 may be disposed on the electron blocking layer EBL. In an embodiment, the first semiconductor layer SEM1, the electron blocking layer EBL, the active layer MQW, the superlattice layer SLT, the second semiconductor layer SME2 and the undoped semiconductor layer may be substantially identical or similar to those described with reference to FIGS. 6 and 7, and thus their descriptions will be omitted.

In an embodiment, an epi-wafer may be prepared to include a substrate (or light emitting element layer 120') and a layer including at least one of a p-contact layer (e.g., p-GaN), an electron-blocking layer EBL, a single- or multi-quantum well (MQW) layer, a superlattice structure (or superlattice layer SLT), an n-contact layer (e.g., n-GaN), an undoped layer (e.g., u-GaN), and a buffer layer (or buffer film BF).

In an embodiment, a thickness of the p-contact layer (p-GaN) in the third direction DR3 may be in a range of about 30 nm to about 200 nm, a thickness of the electron-blocking layer EBL in the third direction D3 may be in a range of about 10 nm to about 50 nm, a thickness of a well of the quantum well (MQW) layer in the third direction DR3 may be in a range of about 1 nm to about 4 nm, a thickness of a barrier of the quantum well (MQW) layer in the third direction DR3 may be in a range of about 3 nm to about 10 nm, a thickness of the superlattice structure in the third direction DR3 may be in a range of about 50 nm to about 200 nm, a thickness of the n-contact layer (e.g., n-GaN) in the third direction DR3 may be in a range of about 2 μm to about 4 μm, a thickness of the undoped layer (e.g., u-GaN) in the third direction DR3 may be in a range of about 2 μm to about 3 μm, a thickness of the buffer layer in the third direction DR3 may be in a range of about 10 nm to about 50 nm, and a thickness of the substrate in the third direction DR3 may be in a range of about 100 μm to about 1000 μm. However, embodiments are not limited thereto, and other suitable thicknesses may be employed within the spirit and the scope of the disclosure.

Figure 22:
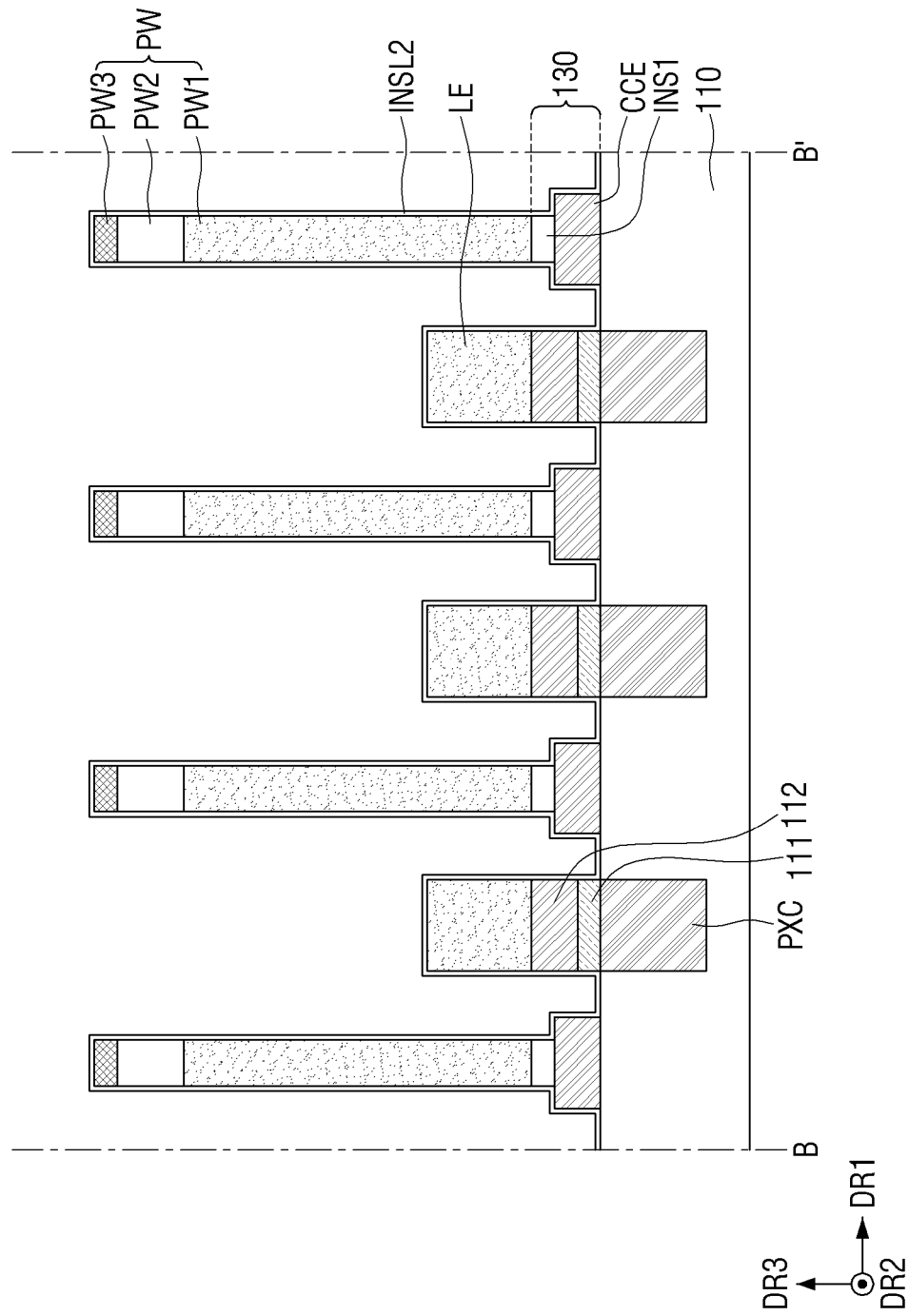

The first insulating layer INS1 may be patterned on the first semiconductor material layer LEMD. The first insulating layer INS1 may not overlap the pixel electrode 111 in the third direction DR3 as shown in FIG. 22. The first insulating layer INS1 may be formed of an inorganic layer such as a silicon oxide layer ($SiO_2$), an aluminum oxide layer ($Al_2O_3$), or a hafnium oxide layer ($HfO_x$).

The second connection electrode layer 112L_2 may be deposited on the first insulating layer INS1 and the light emitting device layer 120'. The second connection electrode layer 112LP_2 may include gold (Au), copper (Cu), aluminum (Al), or tin (Sn). One surface of the second connection electrode layer 112L2 facing the first connection electrode layer 112L1 may be planarized by a polishing process such as a CMP process.

Figure 17:
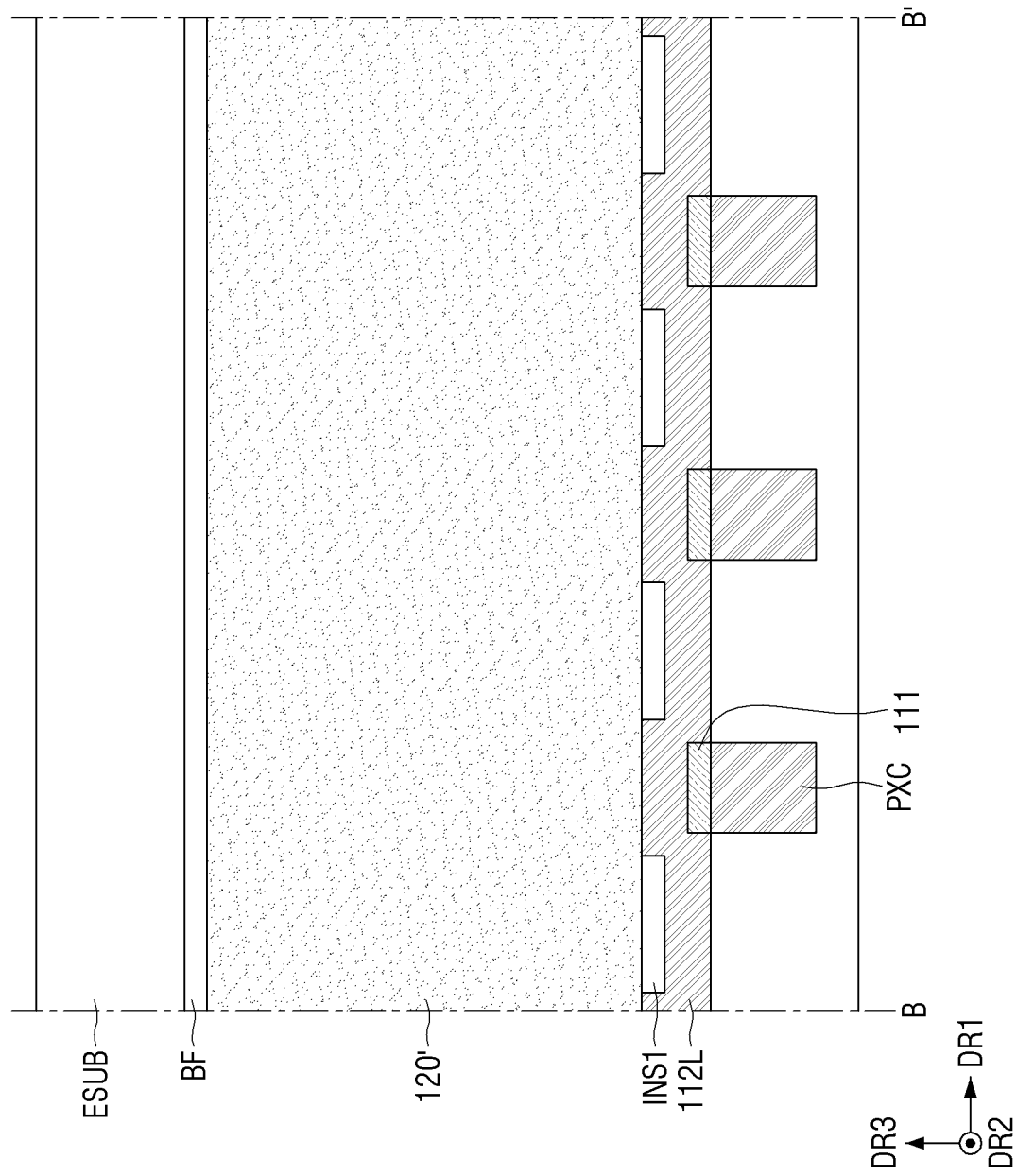

Second, as shown in FIG. 17, the first connection electrode layer 112L_1 of the semiconductor circuit board 110 and the second connection electrode layer 112L_2 of the light emitting element substrate ESUB are adhered to each other, whereby the semiconductor circuit board 110 and the light emitting element substrate ESUB are bonded (or attached or connected) to each other (S2 of FIG.15).

In detail, the first connection electrode layer 112L_1 of the semiconductor circuit board 110 and the second connection electrode layer 112L_2 of the light emitting element substrate ESUB are brought into contact with each other. Then, the first connection electrode layer 112L_1 and the second connection electrode layer 112L_2 may be subjected to melt bonding at a predetermined temperature to form a connection electrode layer 112L. Therefore, the semiconductor circuit board 110 and the light emitting element substrate ESUB may be bonded to each other.

Figure 18:
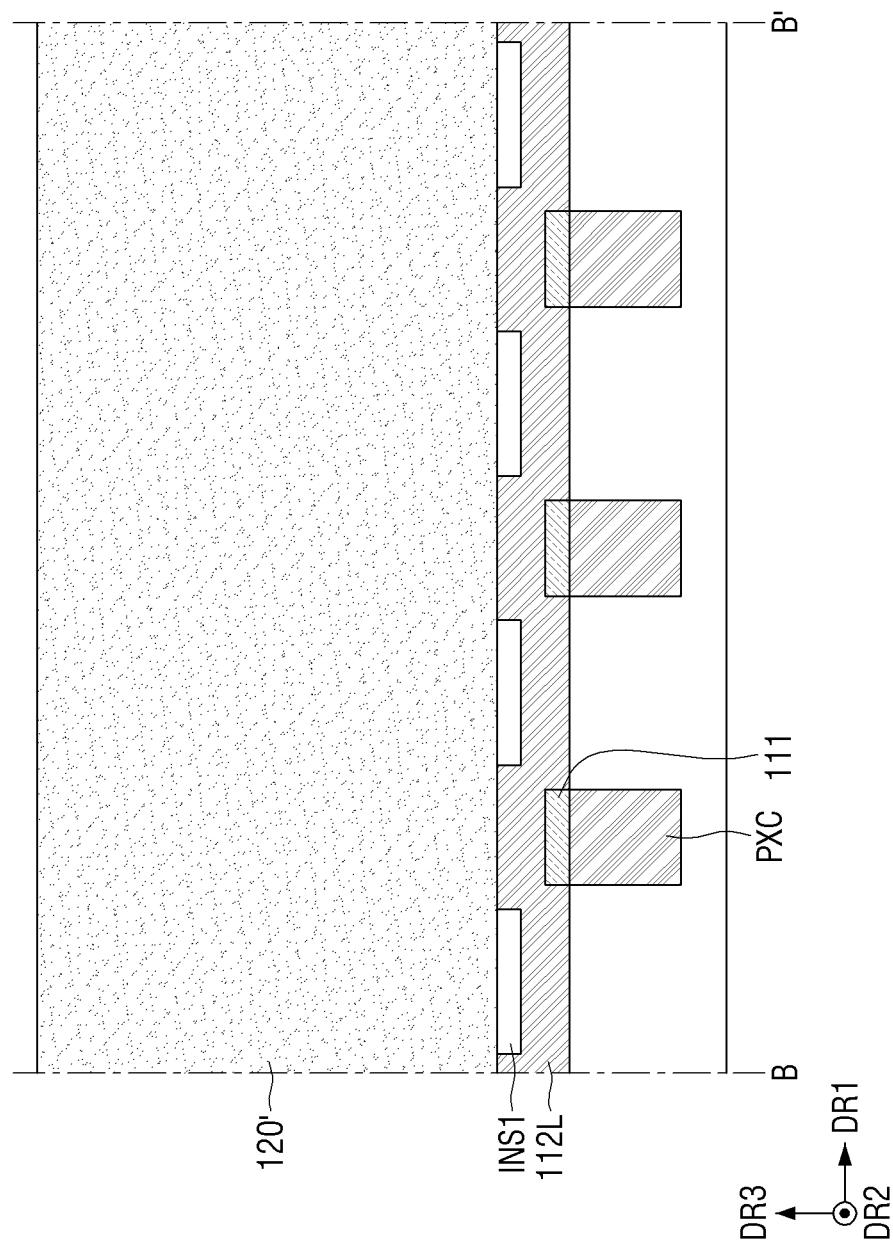

Third, as shown in FIG. 18, the buffer film BF disposed between the light emitting element substrate ESUB and the light emitting element layer 120' is removed (S3 of FIG. 15).

In detail, the light emitting element substrate ESUB may be a silicon substrate made of silicon (Si). The light emitting element substrate ESUB and the buffer film BF may be removed through a polishing process, such as a chemical mechanical polishing (CMP) process, and an etching process.

Figure 19:
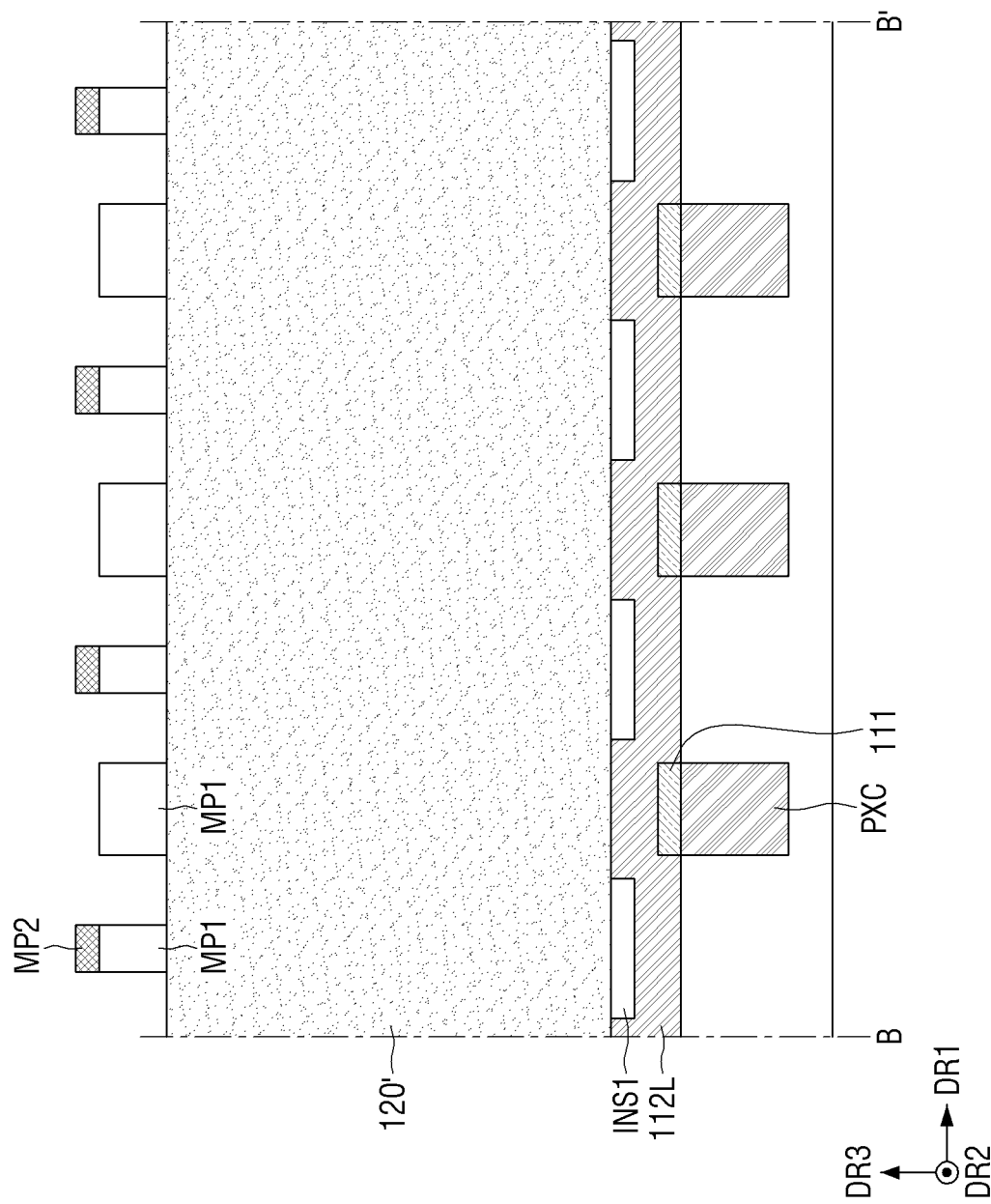

Fourth, as shown in FIG. 19, a first mask pattern MP1 and a second mask pattern MP2 are formed on the light emitting element layer 120' (S4 of FIG. 16).

In detail, the first mask pattern MP1 is formed on an upper surface of the light emitting element layer 120'. The upper surface of the light emitting element layer 120' may be a surface upwardly exposed by removing the light emitting element substrate ESUB and the buffer film BF. The first mask pattern MP1 may be formed in areas where the first partition wall PW1 and the light emitting element LE are to be formed. In an embodiment, a width of the light emitting element LE is wider than that of the first partition wall PW1, and a width of the first mask pattern MP1 formed in the area where the light emitting element LE is to be formed may be wider than a width of the first mask pattern MP1 formed in the area where the first partition wall PW1 is to be formed. The first mask pattern MP1 may be formed of an inorganic film such as a silicon oxide film ($SiO_2$), an aluminum oxide film ($Al_2O_3$), or a hafnium oxide film ($HfO_x$). A thickness of the first mask pattern MP1 may be about 1 μm to about 2 μm.

The second mask pattern MP2 may be disposed on a portion of the first mask pattern MP1. The second mask pattern MP2 may be formed in the area where the first partition wall PW1 is to be formed. The second mask pattern MP2 may include a conductive material such as nickel (Ni). A thickness of the second mask pattern MP2 may be about 0.01 μm to about 1 μm.

Figure 20:
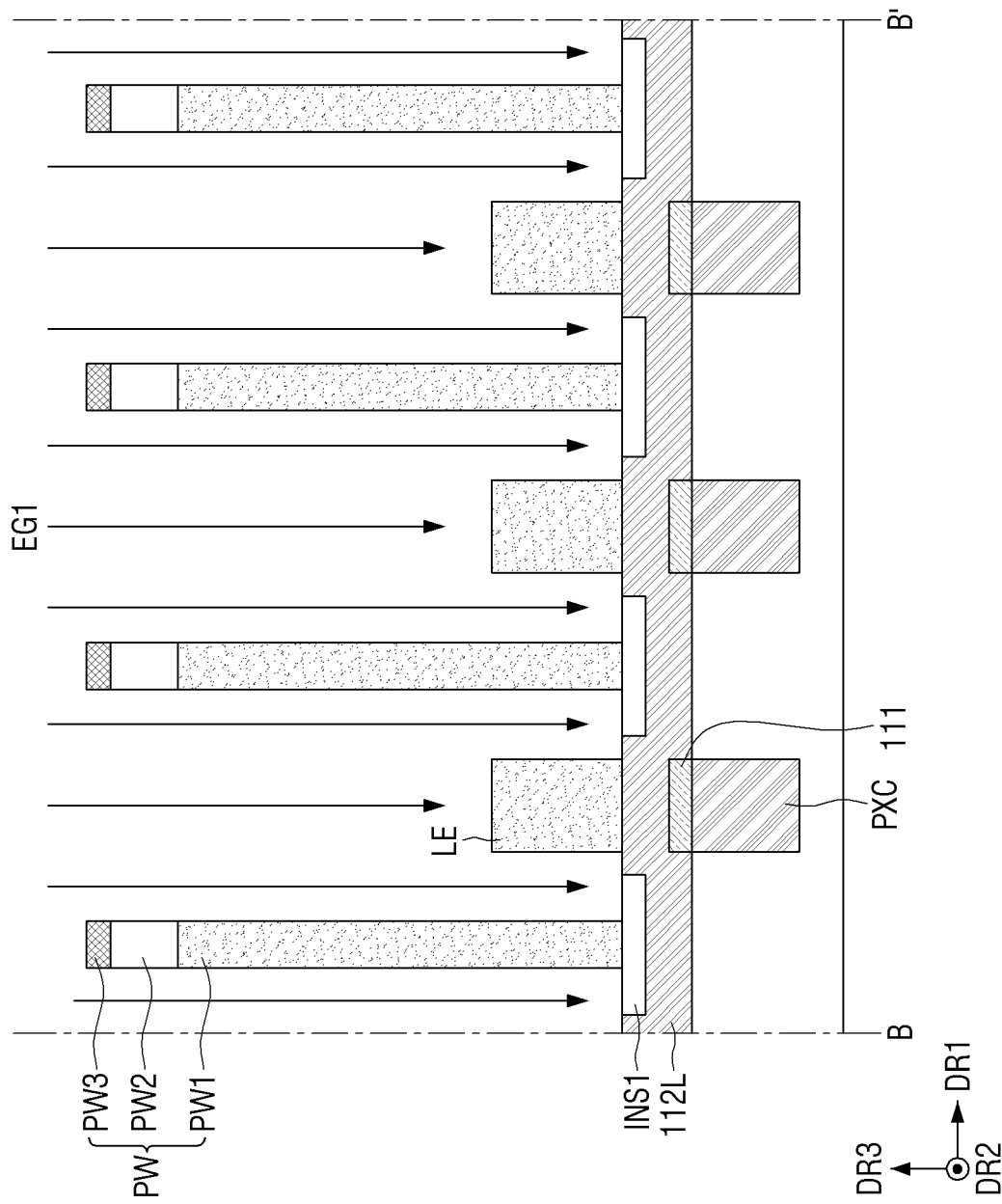

Fifth, as shown in FIG. 20, the light emitting element layer 120' may be etched (e.g., dry-etched) in accordance with the first mask pattern MP1 and the second mask pattern MP2 to form the light emitting elements LE and the partition wall PW (S5 of FIG. 15).

In detail, the second mask pattern MP2 may not be etched by an etching gas used for etching (or dry etching). For this reason, since the light emitting element layer 120' of the area where the second mask pattern MP2 is disposed is not etched, the partition wall PW may be formed.

An etching ratio of the light emitting element layer 120' based on the etching gas EG1 used for etching may be higher than an etching ratio of the first mask pattern MP1. Since the light emitting element layer 120' remains in the area where the first mask pattern MP1 is disposed, the light emitting elements LE may be formed. The light emitting element layer 120' may completely be removed from the area where the first mask pattern MP1 is not disposed.

Referring to FIG. 6, the light emitting element layer 120' may have a structure in which the first semiconductor layer SEM1, the electron blocking layer EBL, the active layer MQW, the superlattice layer SLT, the second semiconductor layer SEM2, and the semiconductor layer that is not doped with a dopant are sequentially deposited in the third direction DR3. In this case, each of the light emitting elements LE may have a structure in which the semiconductor layer that is not doped with a dopant is removed, and the first semiconductor layer SEM1, the electron blocking layer EBL, the active layer MQW, the superlattice layer SLT, and the second semiconductor layer SEM2 are sequentially deposited in the third direction DR3.

In contrast, as shown in FIG. 7, the partition wall PW may include a first partition wall PW1 that includes a first sub-partition wall SPW1 corresponding to the first semiconductor layer SEM1, a second sub-partition wall SPW2 corresponding to the electron blocking layer EBL, a third sub-partition wall SPW3 corresponding to the active layer MQW, a fourth sub-partition wall SPW4 corresponding to the superlattice layer SLT, a fifth sub-partition wall SPW5 corresponding to the second semiconductor layer SEM2, and a sixth sub-partition wall SPW6 corresponding to the semiconductor layer that is not doped with a dopant. Also, the partition wall PW may further include a second partition wall PW2 corresponding to the first mask pattern MP1 remaining without being removed by being protected by the second mask pattern MP2, and a third partition wall PW3 corresponding to the second mask pattern MP2.

Figure 21A:
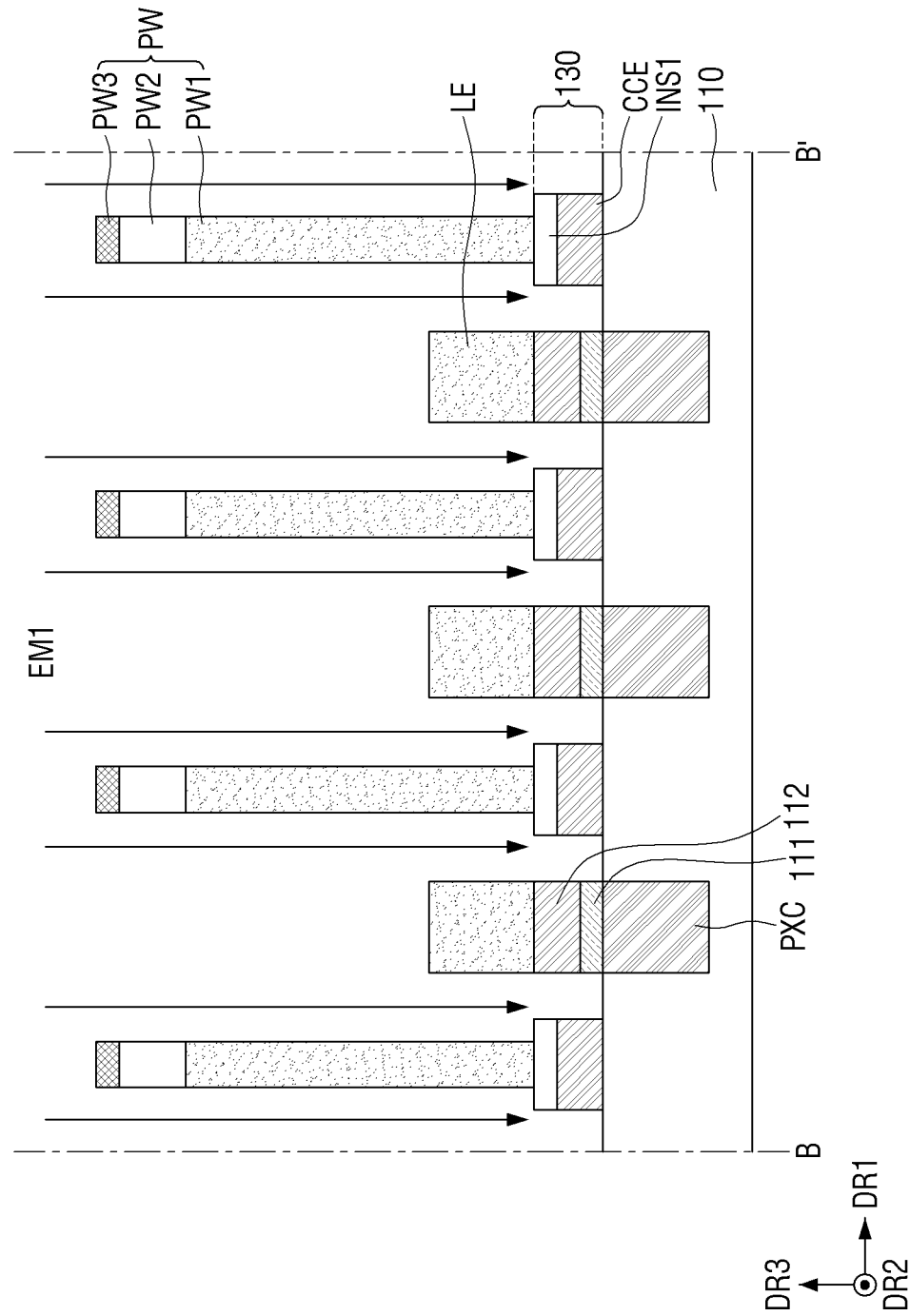
Figure 21B:
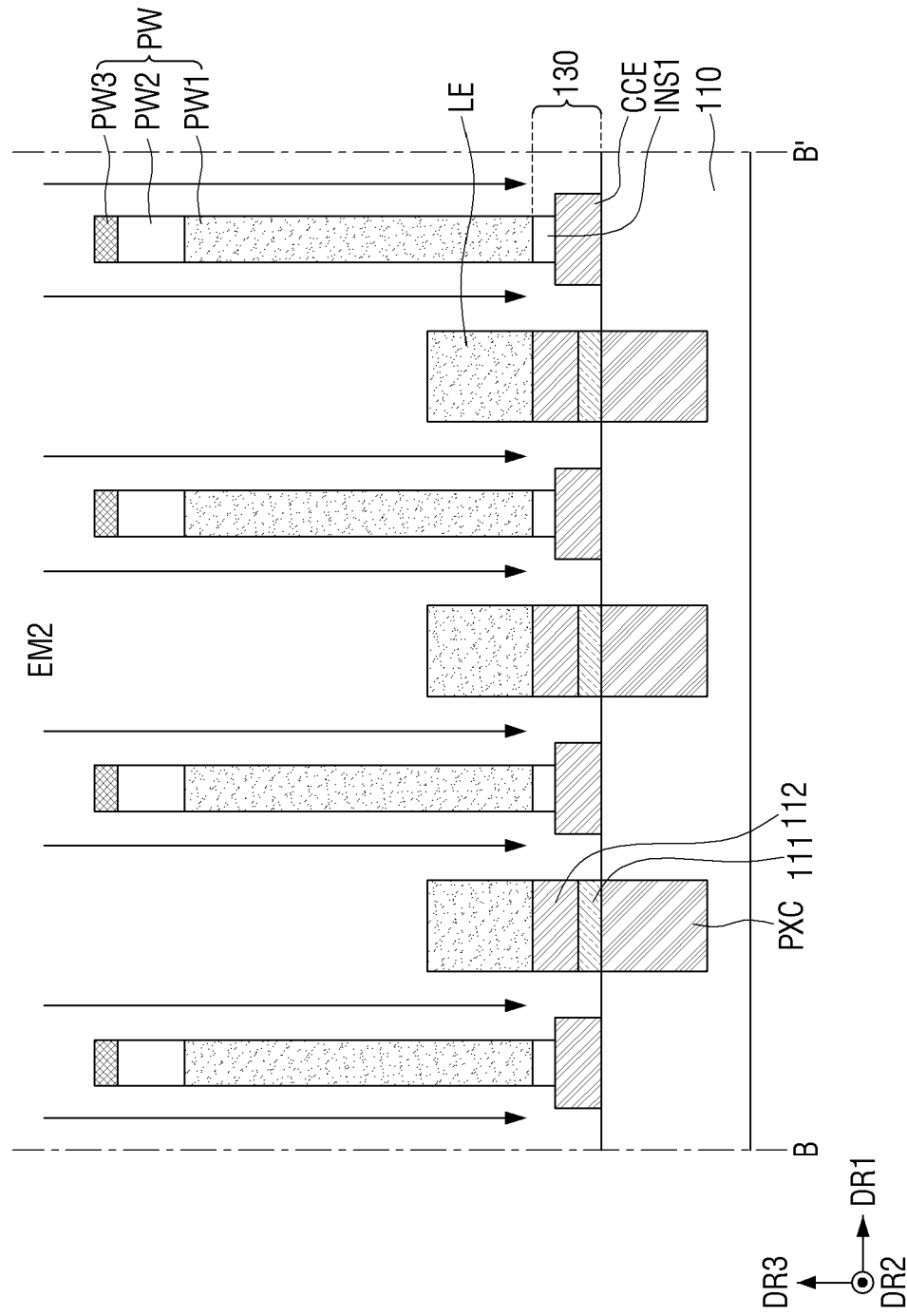

Sixth, as shown in FIGS. 21A and 21B, the connection electrode layer 112L is etched to form the connection electrodes 112 and the common connection electrode CCE (S6 of FIG. 15).

In detail, as shown in FIG. 21A, the partition wall PW, the light emitting elements LE and the first insulating film INS1 may not be etched by a first etching material EM1 used for etching. For this reason, the connection electrode layer 112L disposed on a lower portion of each of the light emitting elements LE, and a lower portion of the first insulating film INS1 may not be etched by the first etching material EM1. Therefore, the connection electrode 112 disposed on the lower portion of each of the light emitting elements LE, and the common connection electrode CCE disposed on the lower portion of the first insulating film INS1 may be formed.

Then, as shown in FIG. 21B, the partition wall PW, the light emitting elements LE, and the common connection electrode CCE may not be etched by a second etching material EM2 for etching the first insulating film INS1. Thus, the first insulating film INS1 exposed without being covered by (or overlapped by or overlapping) the partition wall PW may be etched by the second etching material EM2. Therefore, a portion of the upper surface of the common connection electrode CCE may be exposed without being covered by the first insulating film INS1.

Figure 23:
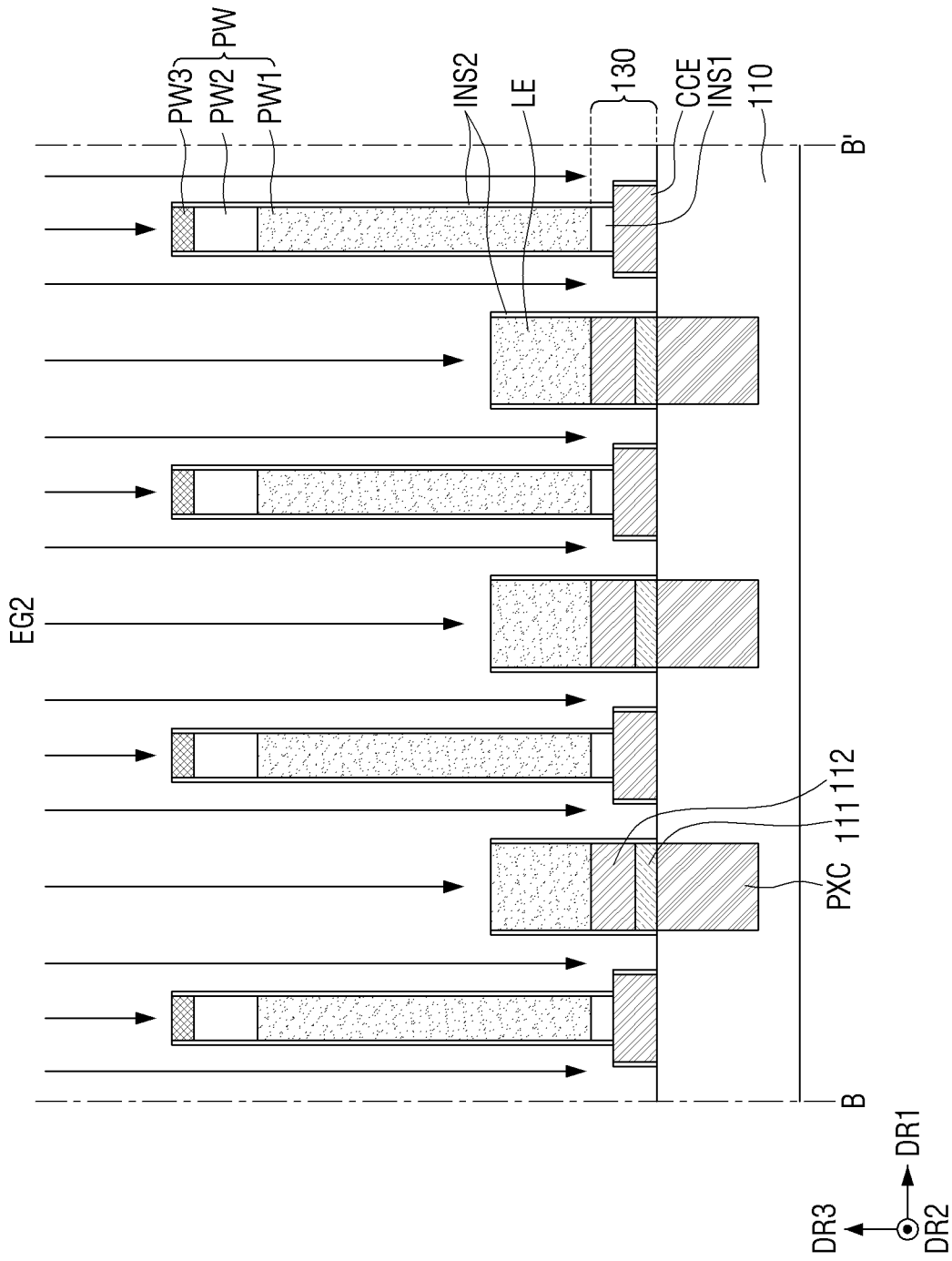

Seventh, as shown in FIGS. 22 and 23, the second insulating film INS2 is formed on the sides of each of the light emitting elements LE and the sides of the partition wall PW (S7 of FIG. 15).

In detail, a second insulating film layer INSL2 is entirely deposited on the semiconductor circuit board 110. In this case, the second insulating film layer INSL2 may be disposed on the upper surface and sides the common connection electrode CCE, the upper surface and sides of the partition wall PW, the sides of each of the pixel electrodes 111, the sides of each of the connection electrodes, the upper surface and sides of each of the light emitting elements LE, and the upper surface of the semiconductor circuit board 110 between the pixel electrode 111 and the common connection electrode CCE.

Then, in case that the second insulating film layer INSL2 is etched using a predetermined etching gas EG2 by forming a big voltage difference in the third direction DR3 without a separate mask, the second insulating film layer INSL2 disposed on a horizontal plane defined by the first direction DR1 and the second direction DR2 may be removed. In contrast, the second insulating film layer INSL2 disposed on a vertical plane defined in the third direction DR3 may not be removed.

For example, the second insulating film layer INSL2 disposed on the upper surface of the common connection electrode CCE, the upper surface of the partition wall PW, the upper surface of each of the light emitting elements LE, and the upper surface of the semiconductor circuit board 110 between the pixel electrode 111 and the common connection electrode CCE may be removed. In contrast, the second insulating film layer INSL2 disposed on the sides of the common connection electrode CCE, the sides of the partition wall PW, the sides of each of the pixel electrodes 111, the sides of each of the connection electrodes 112, and the sides of each of the light emitting elements LE may not be removed. Therefore, the second insulating film INS2 may be formed on the sides of the common connection electrode CCE, the sides of the partition wall PW, the sides of each of the pixel electrodes 111, the sides of each of the connection electrodes 112, and the sides of each of the light emitting elements LE.

The second insulating film INS2 may be formed of (or include) an inorganic film such as a silicon oxide film ($SiO_2$), an aluminum oxide film ($Al_2O_3$), or a hafnium oxide film ($HfO_x$). A thickness of the second insulating film INS2 may be about 0.1 μm.

Meanwhile, since a portion of an upper portion of the second insulating film layer INSL2 disposed on the sides of the partition wall PW may be removed by the etching gas EG2, a height of the second insulating film INS2 disposed on the sides of the partition wall PW may be lower than that of the upper surface of the partition wall PW. Similarly, since a portion of an upper portion of the second insulating film layer INSL2 disposed on the sides of each of the light emitting elements LE may be removed by the second etching material EG2, a height of the second insulating film INS2 disposed on the sides of each of the light emitting elements LE may be lower than that of the upper surface of the light emitting element LE.

Figure 24:
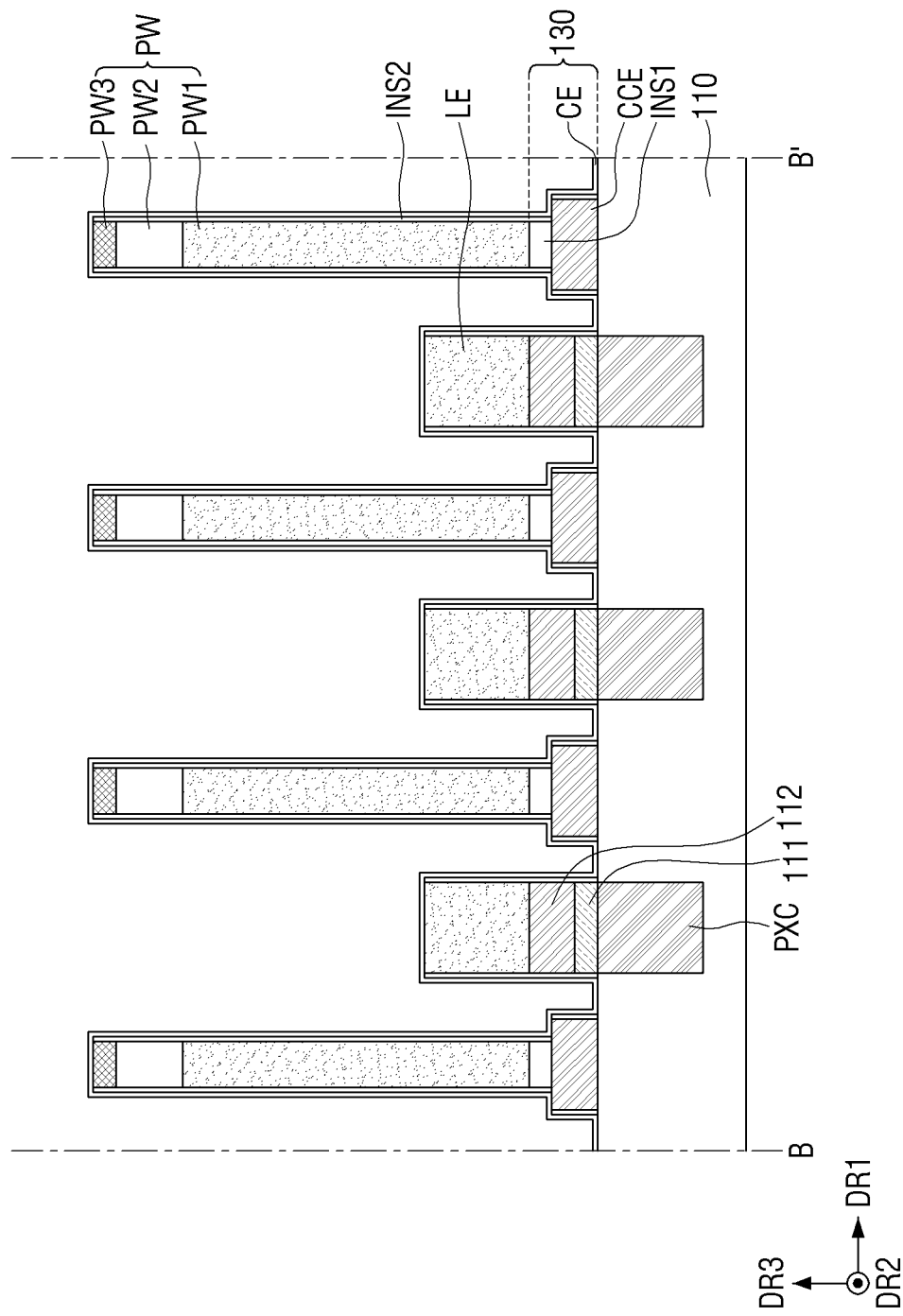

Eighth, as shown in FIG. 24, the common electrode CE for connecting the upper surface of each of the light emitting elements LE with the common connection electrode CCE is formed (S8 of FIG. 15).

In detail, the common electrode CE is deposited on the entire surface of the display area DA of the semiconductor circuit board 110. In this case, the common electrode CE may be disposed on the upper surface of the common connection electrode CCE, the upper surface of the partition wall PW, and the upper surface of the semiconductor circuit board 110 between the pixel electrode 111 and the common connection electrode CCE. The common electrode CE may also be disposed on the second insulating film INS2 disposed on the sides of the common connection electrode CCE, the sides of the partition wall PW, the sides of each of the pixel electrodes 111, the sides of each of the connection electrodes 112, and the sides of each of the light emitting elements LE.

A portion of the upper surface of the common connection electrode CCE is exposed without being covered by the first insulating film INS1, and thus may contact the common electrode CE. Therefore, the common electrode CE may be connected to the common connection electrode CCE.

The common electrode CE may include a transparent conductive material. The common electrode CE may be formed of a transparent conductive oxide (TCO) such as indium tin oxide (ITO) or indium zinc oxide (IZO). A thickness of the common electrode CE may be 0.1 µm.

Figure 25:
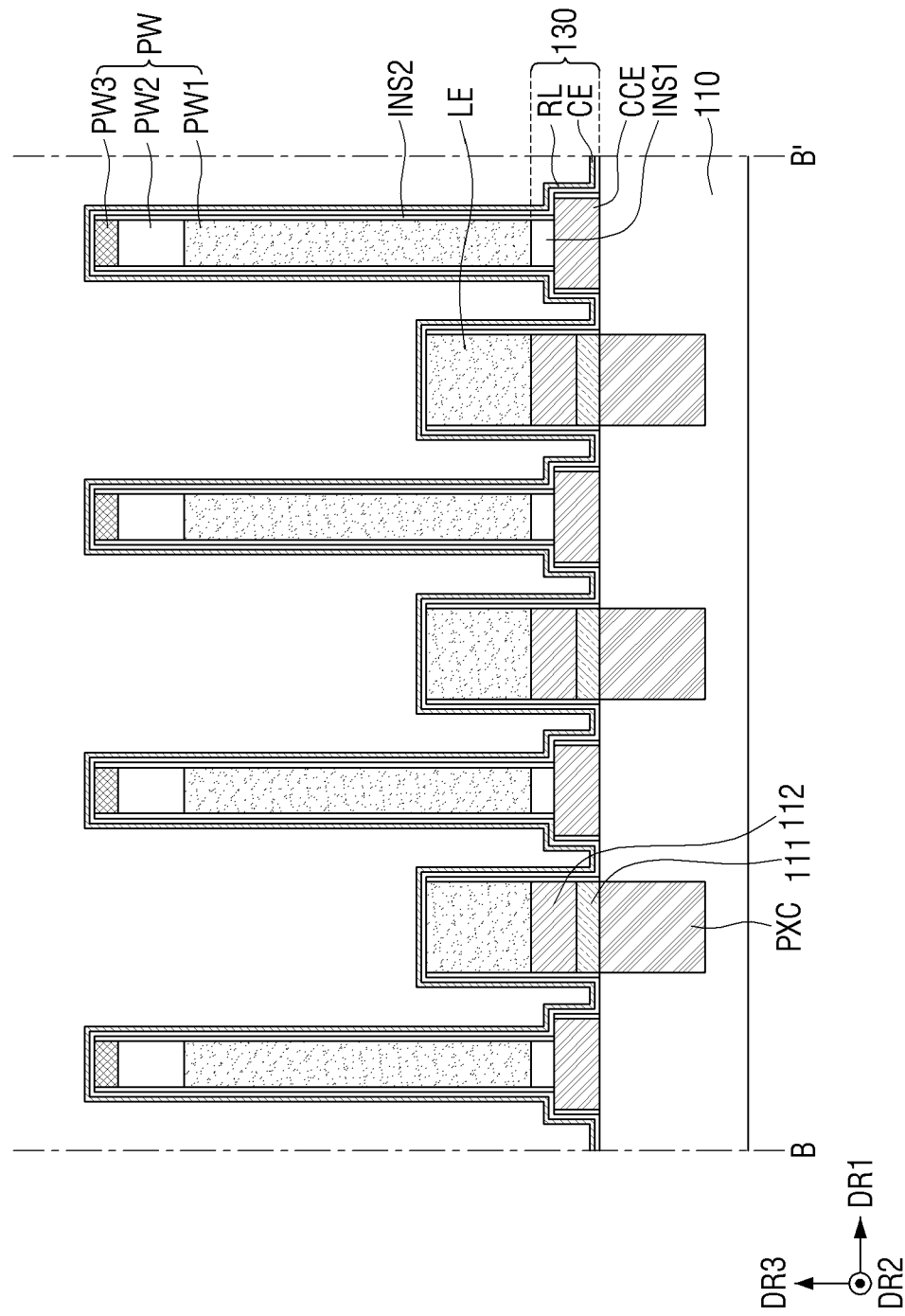
Figure 26:
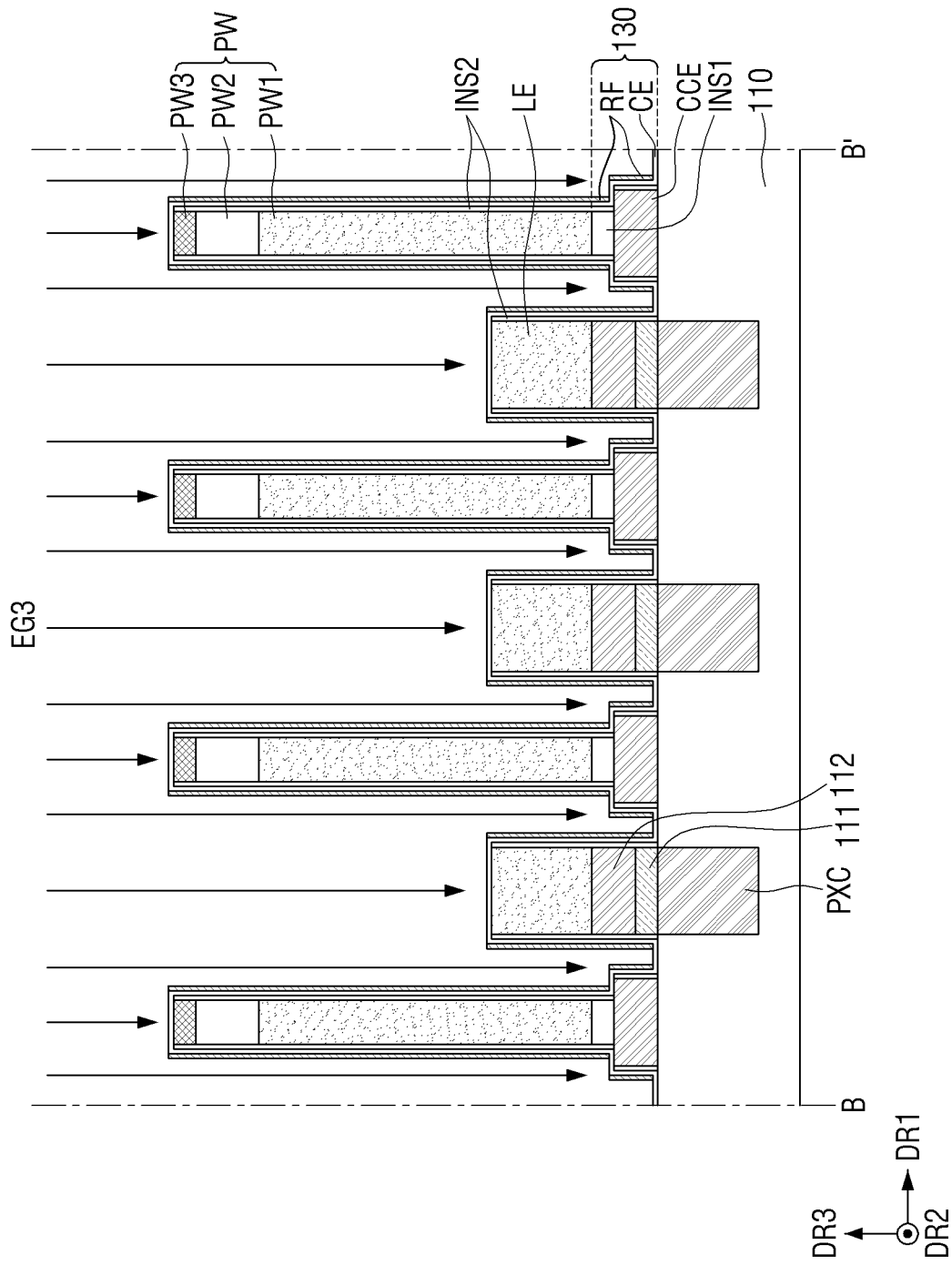

Ninth, as shown in FIGS. 25 and 26, a reflection film RF is formed on the sides of each of the light emitting elements LE and the sides of the partition wall PW (S9 of FIG. 15).

In detail, a reflection layer RL is entirely deposited on the semiconductor circuit board 110. In this case, the reflection layer RL may be disposed on the common electrode CE disposed on the upper surface and sides of the common connection electrode CCE, the upper surface and sides of the partition wall PW, the sides of each of the pixel electrodes 111, the sides of each of the connection electrodes 112, the upper surface and sides of each of the light emitting elements LE, and the upper surface of the semiconductor circuit board 110 between the pixel electrode 111 and the common connection electrode CCE.

Then, when the reflection layer RL is etched using a predetermined etching gas EG3 by forming a voltage difference in the third direction DR3 without a separate mask, the reflection layer RL disposed on a horizontal plane defined by the first direction DR1 and the second direction DR2 may be removed. In contrast, the reflection layer RL disposed on a vertical plane defined by the third direction DR3 may not be removed.

For example, the reflection layer RL disposed on the upper surface of the common connection electrode CCE, the upper surface of the partition wall PW, the upper surface of each of the light emitting elements LE and the upper surface of the semiconductor circuit board 110 between the pixel electrode 111 and the common connection electrode CCE may be removed. In contrast, the reflection layer RL disposed on the sides of the common connection electrode CCE, the sides of the partition wall PW, the sides of each of the pixel electrodes 111, the sides of each of the connection electrodes 112 and the sides of each of the light emitting elements LE may not be removed. Therefore, the second insulating film INS2 may be formed on the common electrode CE disposed on the sides of the common connection electrode CCE, the sides of the partition wall PW, the sides of each of the pixel electrodes 111, the sides of each of the connection electrodes 112, and the sides of each of the light emitting elements LE.

The reflection film RF may include a metal material having high reflectance, such as aluminum (Al). A thickness of the reflection film RF may be about 0.1 µm.

Meanwhile, since a portion of an upper portion of the reflection layer RL disposed on the sides of the partition wall PW may be removed, a height of the reflection film RF disposed on the sides of the partition wall PW may be lower than that of the upper surface of the partition wall PW. Similarly, since a portion of an upper portion of the reflection layer RL disposed on the sides of each of the light emitting elements LE may be removed, a height of the reflection film RF disposed on the sides of each of the light emitting elements LE may be lower than that of the upper surface of the light emitting element LE.

Figure 27:
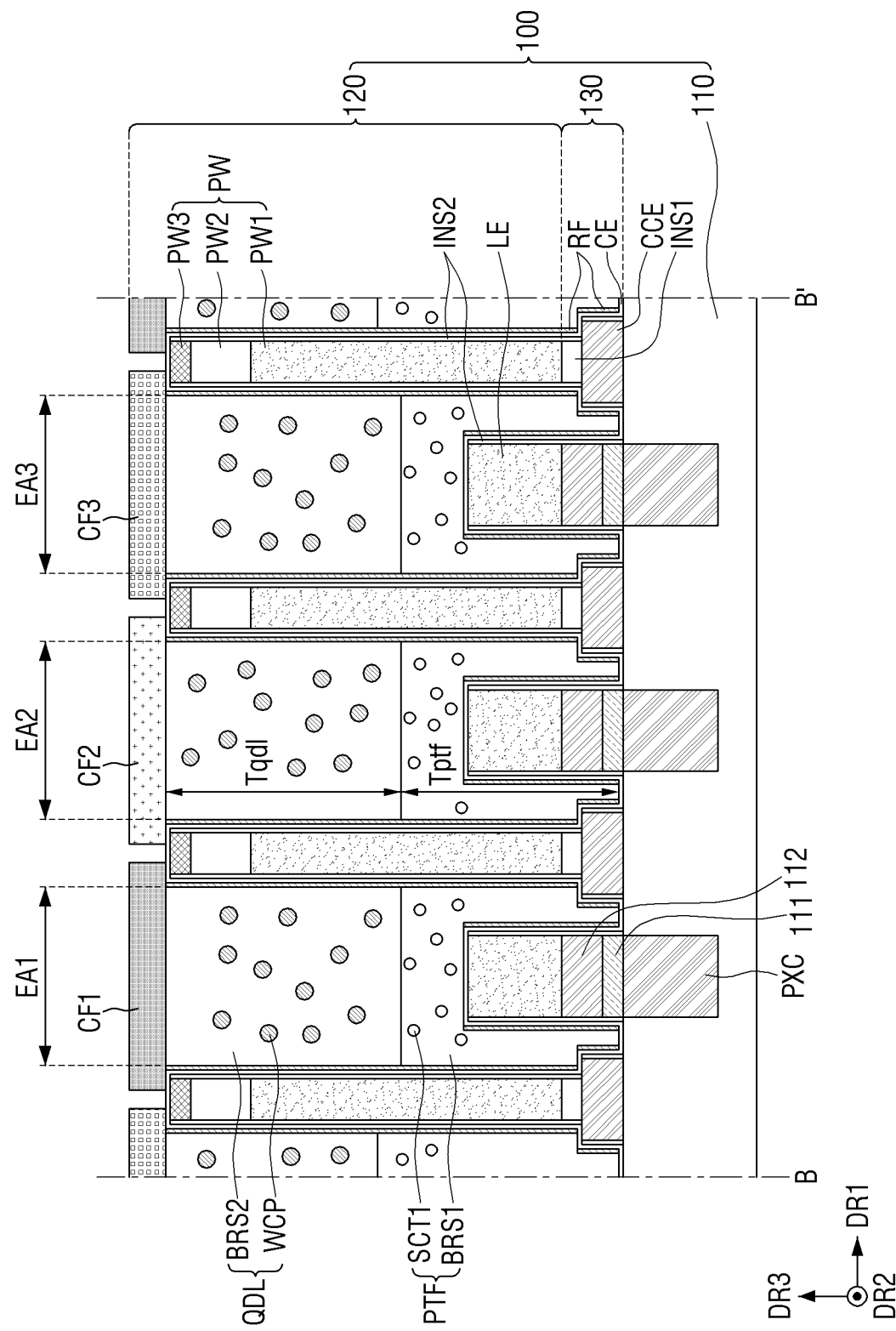

Tenth, as shown in FIG. 27, a protective film PTF is formed on the light emitting element LE in each of the light emitting areas EA1, EA2, and EA3 defined by the partition wall PW, the wavelength conversion layer QDL is formed on the protective film PTF, and color filters CF1, CF2 and CF3 are formed on the wavelength conversion layer QDL (S10 of FIG. 15).

In detail, the protective film PTF is formed on the light emitting element LE in each of the first light emitting areas EA1, the second light emitting areas EA2, and the third light emitting areas EA3. The protective film PTF may be disposed between the light emitting element LE and the partition wall PW in each of the first light emitting areas EA1, the second light emitting areas EA2, and the third light emitting areas EA3. For example, the protective film PTF may be disposed in a gap space between the light emitting element LE and the partition wall PW in each of the first light emitting areas EA1, the second light emitting areas EA2, and the third light emitting areas EA3.

Then, the wavelength conversion layer QDL is formed on the protective film PTF in each of the first light emitting areas EA1, the second light emitting areas EA2, and the third light emitting areas EA3. A distance between the light emitting element LE and the wavelength conversion layer QDL may be increased due to the protective film PTF. Therefore, wavelength conversion particles WCP1 and WCP2 of the wavelength conversion layer QDL may be prevented from being damaged due to heat emission of the light emitting element LE.

Also, since the same wavelength conversion layer QDL is disposed in each of the first light emitting areas EA1, the second light emitting areas EA2, and the third light emitting areas EA3, the wavelength conversion layer QDL may be formed in each of the first light emitting areas EA1, the second light emitting areas EA2, and the third light emitting areas EA3 by one time process.

Then, the first color filter CF1 may be formed on the wavelength conversion layer QDL in the first light emitting area EA1, the second color filter CF2 may be formed on the wavelength conversion layer QDL in the second light emitting area EA2, and the third color filter CF3 may be formed on the wavelength conversion layer QDL in the third light emitting area EA3.

As described with reference to FIGS. 15 to 27, the partition wall PW and the light emitting elements LE are simultaneously formed using the first mask pattern MP1 and the second mask pattern MP2, whereby the fabricating process may be simplified.

Also, the connection electrode layer 112L is etched using the first insulating film INS1 and the light emitting elements LE as masks to simultaneously form the connection electrodes 112 and the common connection electrode CCE, whereby the fabricating process may be simplified.

Figure 28:
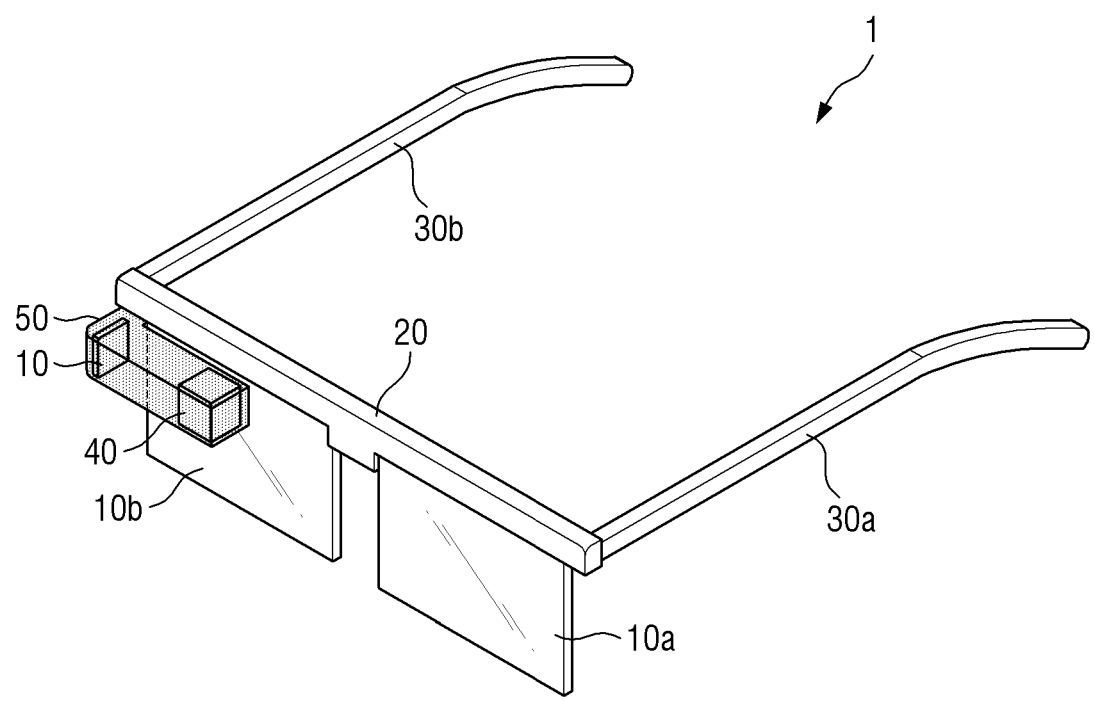
FIG. 28 is an example view schematically illustrating a virtual reality device including a display device according to an embodiment.

FIG. 28 is an example view schematically illustrating a virtual reality device including a display device according to an embodiment. In FIG. 28, a virtual reality device 1 to which a display device 10 according to an embodiment is applied is shown.

Referring to FIG. 28, the virtual reality device 1 according to an embodiment may be a glasses-type device. The virtual reality device 1 according to an embodiment may include a display device 10, a left-eye lens 10a, a right-eye lens 10b, a support frame 20, glasses frame legs 30a and 30b, a reflection member 40, and a display device accommodating portion 50.

Although FIG. 28 illustrates the virtual reality device 1 that includes glasses frame legs 30a and 30b, the virtual reality device 1 according to an embodiment may be applied to a head mounted display including a head mounting band, which may be mounted on a head, instead of the glasses frame legs 30a and 30b. That is, the virtual reality device 1 according to an embodiment is not limited to that shown in FIG. 28, and is applicable to various electronic devices in various forms.

The display device accommodating portion 50 may include a display device 10 and a reflection member 40. An image displayed on the display device 10 may be reflected from the reflection member 40 and provided to a user's right eye through the right-eye lens 10b. For this reason, the user may view a virtual reality image displayed on the display device 10 through the right eye.

Although FIG. 28 illustrates that the display device accommodating portion 50 is disposed at a right end of the support frame 20, the embodiment of the disclosure is not limited thereto. For example, the display device accommodating portion 50 may be disposed at a left end of the support frame 20, and in this case, the image displayed on the display device 10 may be reflected from the reflection member 40 and provided to the user's left eye through the left-eye lens 10a. For this reason, the user may view the virtual reality image displayed on the display device 10 through the left eye. As another example, the display device accommodating portion 50 may be disposed at both the left end and the right end of the support frame 20, and in this case, the user may view the virtual reality image displayed on the display device 10 through both the left eye and the right eye.

Figure 29:
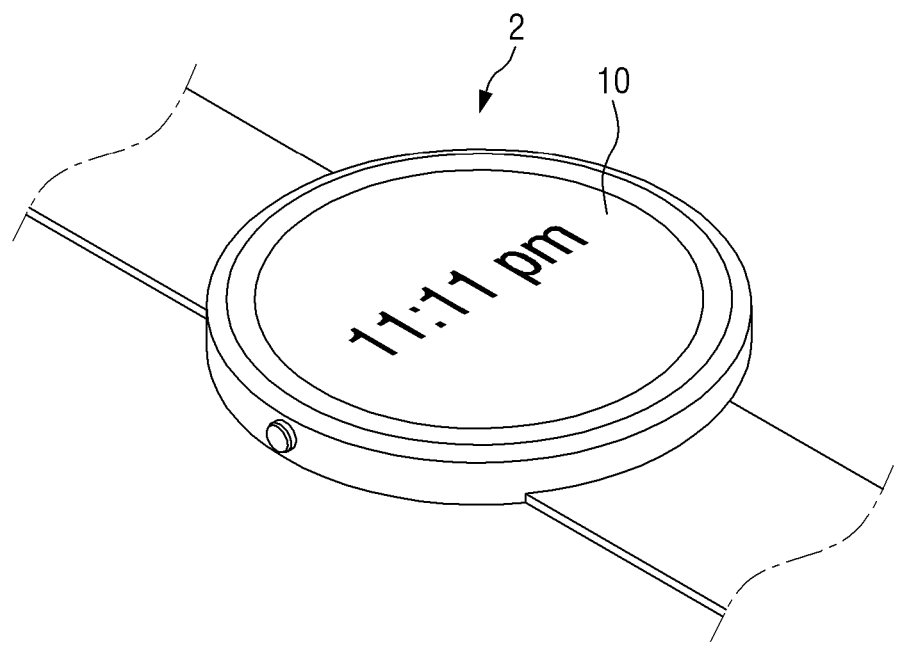
FIG. 29 is an example view illustrating a smart device including a display device according to an embodiment.

FIG. 29 is an example view schematically illustrating a smart device including a display device according to an embodiment.

Referring to FIG. 29, a display device 10 according to an embodiment may be applied to a smart watch 2, which is one of the smart devices.

Figure 30:
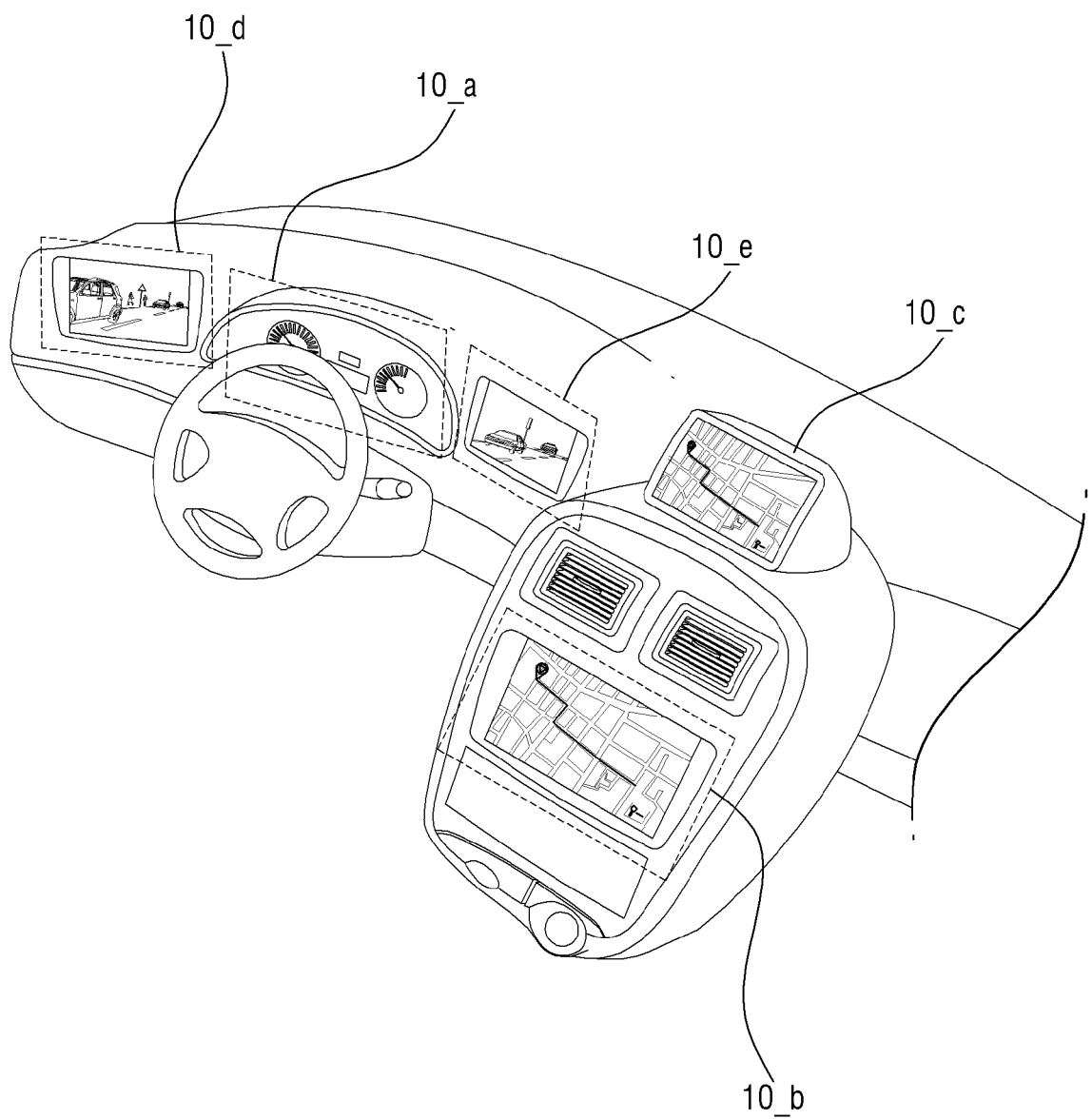
FIG. 30 is an example view illustrating a vehicle dashboard and a center fascia including a display device according to an embodiment.

FIG. 30 is an example view schematically illustrating a vehicle dashboard and a center fascia including a display device according to an embodiment. A vehicle to which the display device 10 according to an embodiment is applied is shown in FIG. 30.

Referring to FIG. 30, display devices 10_a, 10_b and 10_c according to an embodiment may be applied to a dashboard of the vehicle, applied to a center fascia of the vehicle, or applied to a center information display (CID) disposed on the dashboard of the vehicle. As another example, each of the display devices 10_a, 10_b and 10_c according to an embodiment may be used as a display device. In addition, display devices 10_d and 10_e according to an embodiment may be applied to a room mirror display that replaces a side mirror of the vehicle.

Figure 31:
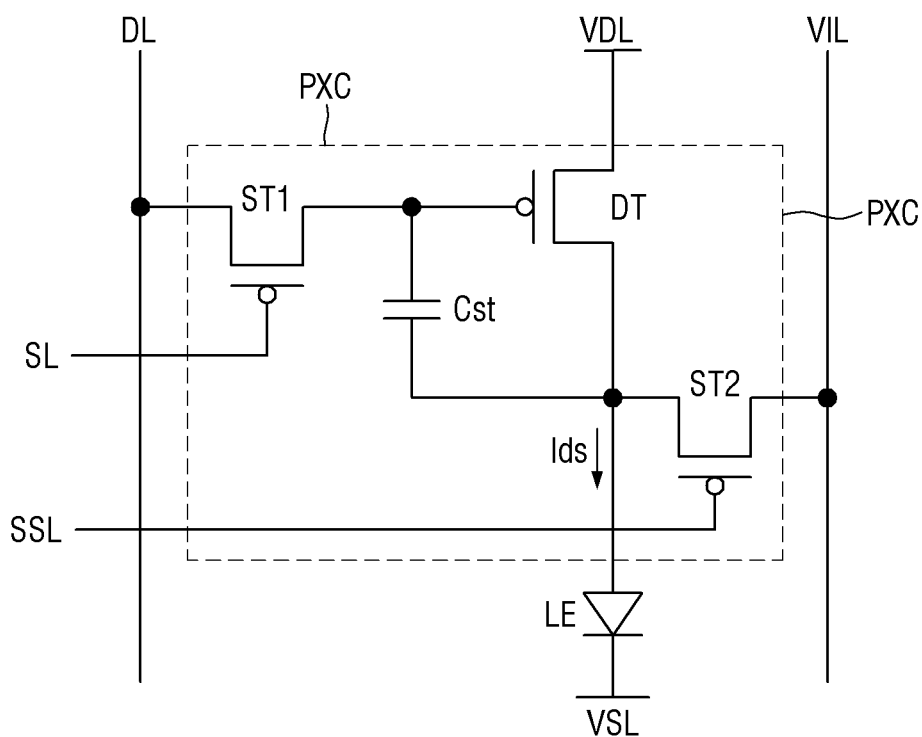
FIG. 31 is an example view illustrating a transparent display device including a display device according to an embodiment.

FIG. 31 is an example view schematically illustrating a transparent display device including a display device according to an embodiment.

Referring to FIG. 31, a display device 10_3 according to an embodiment may be applied to the transparent display device. The transparent display device may display an image IM and at the same time transmit light. Therefore, a user located on a front surface of the transparent display device may not only view the image IM displayed on the display device 10_3 but also view an object RS or background located on a rear surface of the transparent display device. In case that the display device 10_3 is applied to the transparent display device, the base substrate BSUB of the display device 10_3 shown in FIG. 4 may include a light transmitting portion capable of transmitting light or may be formed of a material capable of transmitting light.

Figure 32:
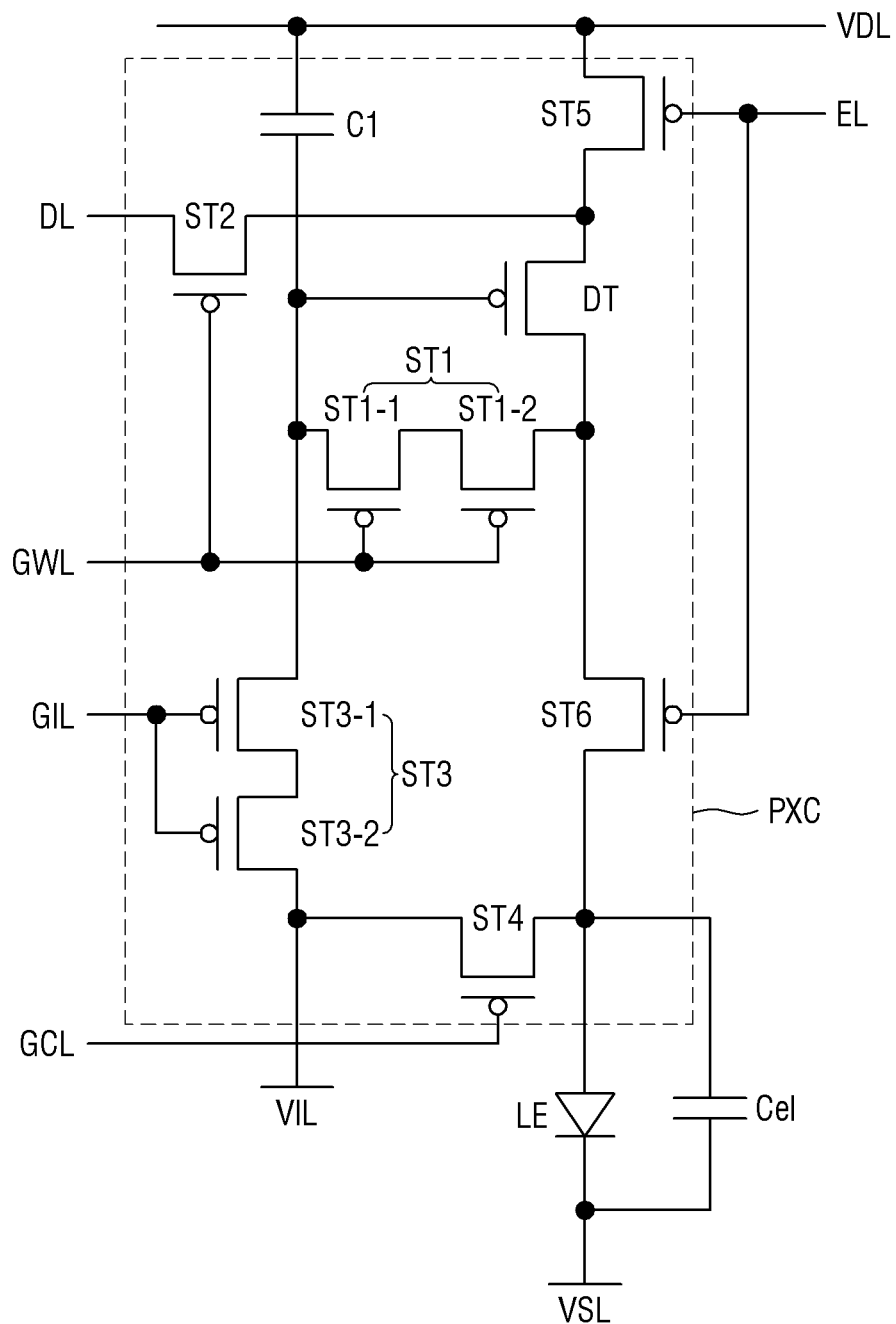
FIG. 32 is a schematic diagram of an equivalent circuit of a pixel circuit area and a light emitting element according to an embodiment.

FIG. 32 is a schematic diagram of an equivalent circuit of a pixel circuit area and a light emitting element according to an embodiment.

An example of the pixel circuit area PXC and the light emitting element LE of FIG. 5 is shown in FIG. 32.

Referring to FIG. 32, the light emitting element LE emits light in accordance with a driving current Ids. The emission amount of the light emitting element LE may be proportional to the driving current Ids. The light emitting element LE may be an inorganic light emitting element that includes an anode electrode, a cathode electrode, and an inorganic semiconductor disposed between the anode electrode and the cathode electrode. For example, the light emitting element LE may be a micro light emitting diode.

The anode electrode of the light emitting element LE may be connected to a source electrode of a driving transistor DT, and the cathode electrode thereof may be connected to a second power line VSL to which a low potential voltage lower than a high potential voltage is supplied.

The driving transistor DT adjusts a current flowing from a first power line VDL, to which a first power voltage is supplied, to the light emitting element LE in accordance with a voltage difference between a gate electrode and the source electrode. The gate electrode of the driving transistor DT may be connected to a first electrode of a first transistor ST1, its source electrode may be connected to the anode electrode of the light emitting element LE, and its drain electrode may be connected to the first power line VDL to which a high potential voltage is applied.

The first transistor ST1 is turned on by a scan signal of a scan line SL to connect a data line DL to the gate electrode of the driving transistor DT. A gate electrode of the first transistor ST1 may be connected to the scan line SL, its first electrode may be connected to the gate electrode of the driving transistor DT, and its second electrode may be connected to the data line DL.

A second transistor ST2 is turned on by a sensing signal of a sensing signal line SSL to connect an initialization voltage line VIL to the source electrode of the driving transistor DT. A gate electrode of the second transistor ST2 may be connected to the sensing signal line SSL, its first electrode may be connected to the initialization voltage line VIL, and its second electrode may be connected to the source electrode of the driving transistor DT.

Although the first electrode of each of the first and second transistors ST1 and ST2 may be a source electrode and the second electrode thereof may be a drain electrode, but it should be noted that they are not limited thereto. For example, the first electrode of each of the first and second transistors ST1 and ST2 may be a drain electrode, and the second electrode thereof may be a source electrode.

A capacitor Cst is formed between the gate electrode and the source electrode of the driving transistor DT. The capacitor Cst stores a differential voltage between a gate voltage and a source voltage of the driving transistor DT.

Although the driving transistor DT and the first and second transistors ST1 and ST2 are formed of N-type metal oxide semiconductor field effect transistors (MOSFETs) in FIG. 32, it should be noted that the transistors are not limited thereto. The driving transistor DT and the first and second transistors ST1 and ST2 may be formed of P-type MOSFETs.

Figure 33:
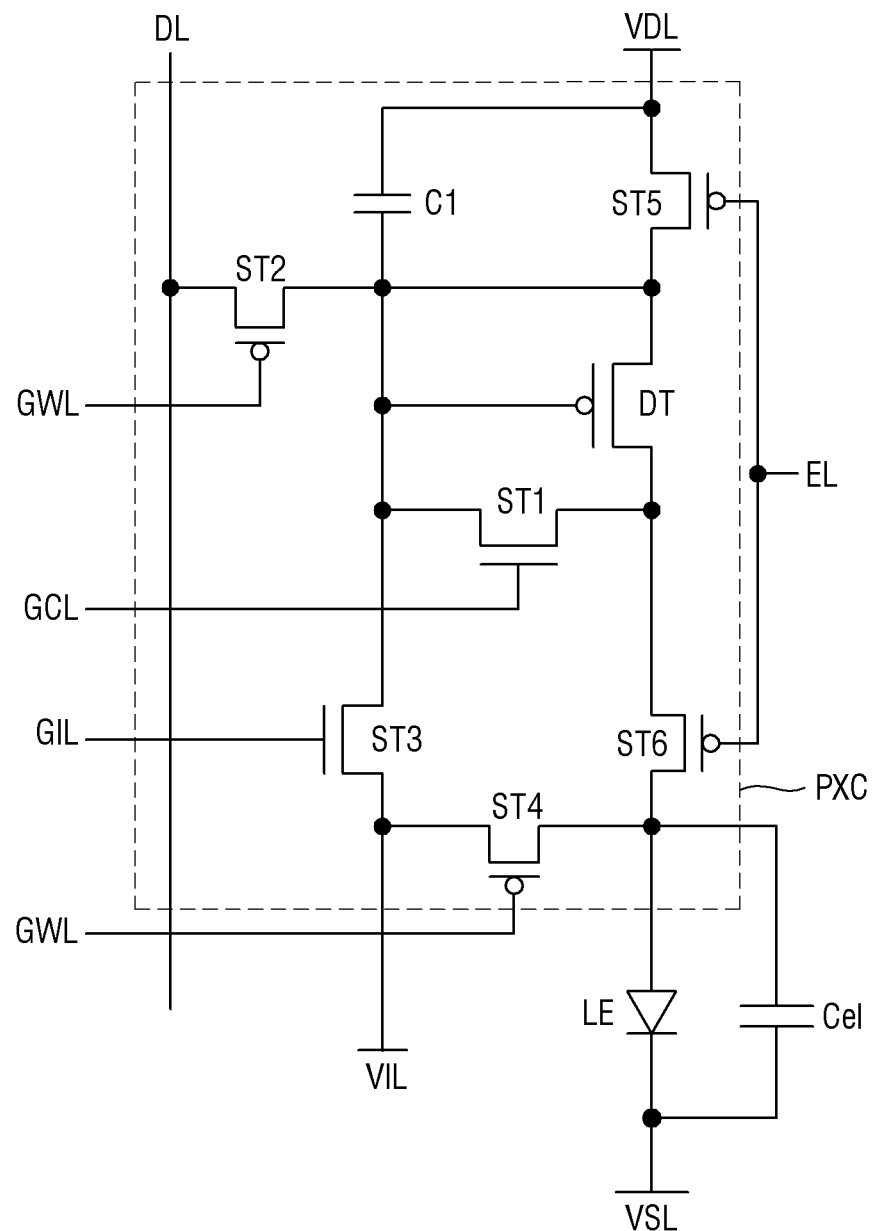
FIG. 33 is a schematic diagram of an equivalent circuit of a pixel circuit area and a light emitting element according to another embodiment.

FIG. 33 is a schematic diagram of an equivalent circuit of a pixel circuit area and a light emitting element according to another embodiment.

Another example of the pixel circuit area PXC and the light emitting element LE of FIG. 5 is shown in FIG. 33.

Referring to FIG. 33, the light emitting element LE emits light in accordance with the driving current Ids. The emission amount of the light emitting element LE may be proportional to the driving current Ids. The light emitting element LE may be an inorganic light emitting element that includes an anode electrode, a cathode electrode, and an inorganic semiconductor disposed between the anode electrode and the cathode electrode. For example, the light emitting element LE may be a micro light emitting diode.

The anode electrode of the light emitting element LE may be connected to a first electrode of a fourth transistor ST4 and a second electrode of a sixth transistor ST6, and the cathode electrode thereof may be connected to the second power line VSL. A parasitic capacitance Cel may be formed between the anode electrode and the cathode electrode of the light emitting element LE.

The pixel circuit area PXC includes a driving transistor DT, switch elements, and a capacitor C1. The switch elements include first to sixth transistors ST1, ST2, ST3, ST4, ST5 and ST6. The first transistor ST1 may include two transistors ST1-1, ST1-2, and the third transistor ST3 may include two transistors ST3-1, ST3-2.

The driving transistor DT includes a gate electrode, a first electrode, and a second electrode. The driving transistor DT controls a drain-source current Ids (hereinafter, referred to as "driving current") flowing between the first electrode and the second electrode in accordance with a data voltage applied to the gate electrode.

The capacitor C1 is formed between the second electrode of the driving transistor DT and the first power line VDL. One electrode of the capacitor C1 may be connected to the second electrode of the driving transistor DT, and the other electrode thereof may be connected to the first power line VDL.

In case that a first electrode of each of the first to sixth transistors ST1, ST2, ST3, ST4, ST5 and ST6 and the driving transistor DT is a source electrode, a second electrode thereof may be a drain electrode. In another example, in case that the first electrode of each of the first to sixth transistors ST1, ST2, ST3, ST4, ST5 and ST6 and the driving transistor DT is a drain electrode, the second electrode thereof may be a source electrode.

An active layer of each of the first to sixth transistors ST1, ST2, ST3, ST4, ST5, and ST6 and the driving transistor DT may be formed of (or include) any of poly silicon, amorphous silicon, and oxide semiconductor. In case that the semiconductor layer of each of the first to sixth transistors ST1, ST2, ST3, ST4, ST5, and ST6 and the driving transistor DT is formed of poly silicon, a process of forming the same may be a low temperature poly silicon (LTPS) process.

Although the first to sixth transistors ST1, ST2, ST3, ST4, ST5, and ST6 and the driving transistor DT are formed of P-type MOSFETs in FIG. 33, the transistors are not limited thereto, and may be formed of N-type MOSFETs.

Moreover, the first power voltage of the first power line VDL, a second power voltage of the second power line VSL, and a third power voltage of a third power line VIL may be set in consideration of characteristics of the driving transistor DT, characteristics of the light emitting element LE, and the like.

Figure 34:
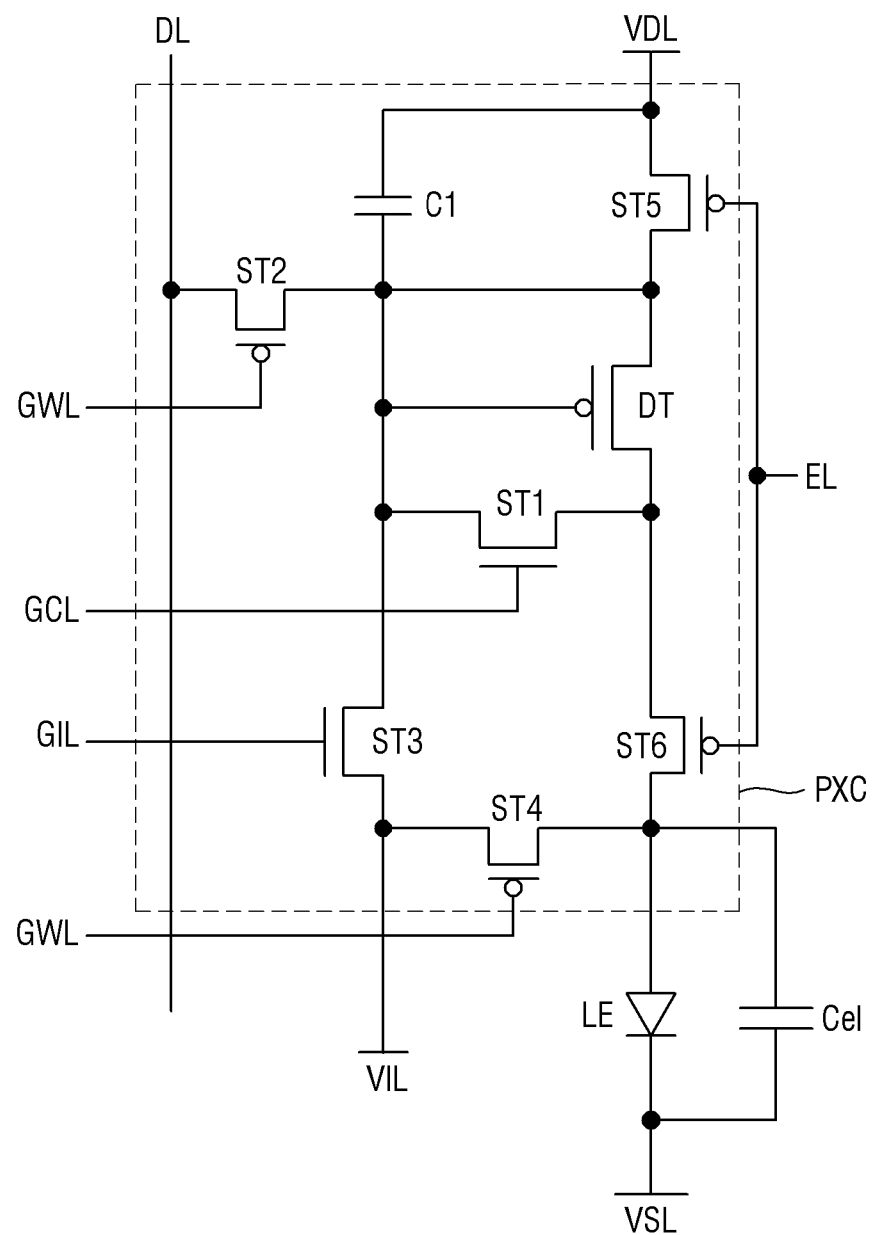
FIG. 34 is a schematic diagram of an equivalent circuit of a pixel circuit area and a light emitting element according to another embodiment.

FIG. 34 is a schematic diagram of an equivalent circuit of a pixel circuit area and a light emitting element according to another embodiment.

The embodiment of FIG. 34 is different from the embodiment of FIG. 33 at least in that the driving transistor DT, the second transistor ST2, the fourth transistor ST4, the fifth transistor ST5, and the sixth transistor ST6 are formed of P-type MOSFETs, and the first transistor ST1 and the third transistor ST3 are formed of N-type MOSFETs.

Referring to FIG. 34, the active layer of each of the driving transistor DT, the second transistor ST2, the fourth transistor ST4, the fifth transistor ST5, and the sixth transistor ST6, which are formed of P-type MOSFETs, may be formed of poly silicon, and the active layer of each of the first transistor ST1 and the third transistor ST3, which are formed of N-type MOSFETs, may be formed of an oxide semiconductor.

The embodiment of FIG. 34 is different from the embodiment of FIG. 33 at least in that the gate electrode of the second transistor ST2 and the gate electrode of the fourth transistor ST4 are connected to a write scan line GWL, and the gate electrode of the first transistor ST1 is connected to a control scan line GCL. In FIG. 34, since the first transistor ST1 and the third transistor ST3 are formed of N-type MOSFETs, a scan signal of a gate high voltage may be applied to the control scan line GCL and an initialization scan line GIL. In contrast, since the second transistor ST2, the fourth transistor ST4, the fifth transistor ST5, and the sixth transistor ST6 are formed of P-type MOSFETs, a scan signal of a gate low voltage may be applied to the write scan line GWL and a light emission line EL.

It should be noted that the pixel circuit area PXC according to the embodiment of the disclosure is not limited to that shown in FIGS. 32 to 34. The pixel circuit area PXC according to the embodiment of the disclosure may be formed in other circuit structures, which are known and may be adopted by those skilled in the art, in addition to the embodiments shown in FIGS. 32 to 34.

However, the aspects of the disclosure are not restricted to the one set forth herein. The above and other aspects of the disclosure will become more apparent to one of daily skill in the art to which the disclosure pertains by referencing the claims, with functional equivalents thereof to be included therein.

What is claimed is:
1. A display device comprising:
a bank pattern disposed on a substrate;
a light emitting element disposed in a light emitting area partitioned by the bank pattern on the substrate, and extended in a thickness direction of the substrate;

a wavelength conversion layer disposed on the light emitting element in the light emitting area and converting a wavelength of light emitted from the light emitting element; and a protective film disposed between the light emitting element and the wavelength conversion layer in the light emitting area, wherein the protective film is disposed between at least one side of the light emitting element and at least one side of the bank pattern which face each other, at least one layer in the bank pattern and at least one layer in the light emitting element have a same thickness, are formed from a same layer, and consist of a same material, and the wavelength conversion layer converts at least a portion of a first light emitted from the light emitting element into a fourth light that is mixture light of a second light and a third light.

2. The display device of claim 1, wherein the protective film includes a scatterer having a diameter in a range of about 1 nanometer to about 100 nanometers.

3. The display device of claim 1, wherein the protective film has a thickness smaller than a thickness of the wavelength conversion layer.

4. The display device of claim 1, further comprising:
a common connection electrode disposed between the substrate and the bank pattern in a thickness direction of the display device, and
the common connection electrode is spaced apart from the light emitting element.

5. The display device of claim 4, further comprising:
a pixel electrode disposed on the substrate; and
a connection electrode disposed on the pixel electrode and electrically connected to an end of the light emitting element.

6. The display device of claim 5, wherein the common connection electrode and the connection electrode consist of a same material and are formed from a same layer.

7. The display device of claim 5, wherein
the bank pattern includes a first bank layer, and
a partial area of the first bank layer and the light emitting element consist of a same material and are formed from a same layer.

8. The display device of claim 7, wherein the light emitting element includes:
a first semiconductor layer disposed on the connection electrode;
an active layer disposed on the first semiconductor layer; and
a second semiconductor layer disposed on the active layer.

9. The display device of claim 8, wherein the first bank layer includes:
a first sub-bank layer, the first sub-bank layer and the first semiconductor layer having a same material;
a second sub-bank layer, the second sub-bank layer and the active layer having a same material; and
a third sub-bank layer, the third sub-bank layer and the second semiconductor layer having a same material.

10. The display device of claim 9, wherein the third sub-bank layer has a thickness greater than a thickness of the second semiconductor layer.

11. The display device of claim 9, wherein the first bank layer is disposed on the third sub-bank layer, and further includes a fourth sub-bank layer having an undoped semiconductor material.

12. The display device of claim 11, wherein the fourth sub-bank layer has a thickness greater than a thickness of the second semiconductor layer.

13. The display device of claim 11, further comprising:
a common electrode disposed on an upper surface and sides of the bank pattern and an upper surface and sides of the light emitting element.

14. The display device of claim 13, wherein the common electrode contacts a second insulating film disposed on the sides of the bank pattern and the sides of the light emitting element.

15. The display device of claim 13, further comprising:
a reflection film disposed on the sides of the bank pattern and the sides of the light emitting element.

16. The display device of claim 15, wherein the reflection film contacts the common electrode disposed on the sides of the bank pattern and the sides of the light emitting element.

17. The display device of claim 7, wherein the bank pattern further includes:
a second bank layer disposed on the first bank layer and having an insulating material; and
a third bank layer disposed on the second bank layer and having a conductive material.

18. The display device of claim 17, wherein the second bank layer has a thickness greater than a thickness of the third bank layer.

19. The display device of claim 4, further comprising a first insulating film disposed between the bank pattern and the common connection electrode.

20. The display device of claim 1, further comprising:
a second insulating film disposed on sides of the bank pattern and sides of the light emitting element, wherein the second insulating film is disposed between the sidewall of the light emitting element and the protective film in a cross-sectional view.

21. The display device of claim 1, further comprising:
a color filter disposed on the wavelength conversion layer.

22. The display device of claim 21, further comprising:
a capping layer disposed between the wavelength conversion layer and the color filter; and
a selective transmission film disposed between the capping layer and the color filter.

23. The display device of claim 22, further comprising:
a selective transmission film disposed between the wavelength conversion layer and the color filter; and
a capping layer disposed between the selective transmission film and the color filter.

24. The display device of claim 1, wherein the wavelength conversion layer includes:
a first wavelength conversion layer disposed on the protective film and converting at least a portion of first light emitted from the light emitting element into second light; and
a second wavelength conversion layer disposed on the first wavelength conversion layer and converting at least a portion of the first light into third light.

25. A display device comprising:
a first light emitting area emitting a first light, a second light emitting area emitting a second light, and a third light emitting area emitting a third light, the first, second, and third light emitting areas being disposed in a display area of a substrate;
a bank pattern partitioning the first light emitting area, the second light emitting area, and the third light emitting area; and
a light emitting element spaced apart from the bank pattern in each of the first light emitting area, the second light emitting area, and the third light emitting area, and extended in a thickness direction of the substrate;

a protective film disposed on the light emitting element in each of the first light emitting area, the second light emitting area, and the third light emitting area; and a wavelength conversion layer disposed on the protective film in at least one of the first light emitting area, the second light emitting area, and the third light emitting area, wherein the protective film has a thickness smaller than a thickness of the wavelength conversion layer, the wavelength conversion layer converts at least a portion of the first light into a fourth light that is mixture light of the second light and the third light, and at least one layer in the bank pattern and at least one layer in the light emitting element have a same thickness, are formed from a same layer, and consist of a same material.

26. The display device of claim 25, wherein
the wavelength conversion layer is disposed in the first light emitting area, the second light emitting area, and the third light emitting area.

27. The display device of claim 26, further comprising:
a first color filter disposed in the first light emitting area and transmitting the first light;
a second color filter disposed in the second light emitting area and transmitting the second light; and
a third color filter disposed in the third light emitting area and transmitting the third light.

28. The display device of claim 25, wherein the wavelength conversion layer includes:
a first wavelength conversion layer disposed on the protective film and converting at least a portion of the first light into the second light; and
a second wavelength conversion layer disposed on the first wavelength conversion layer and converting at least a portion of the first light into the third light.

29. The display device of claim 25, further comprising:
a light transmitting layer disposed on the protective film in the first light emitting area,
wherein the protective film has a thickness smaller than a thickness of the light transmitting layer.

30. The display device of claim 29, wherein the wavelength conversion layer is disposed on the protective film in the second light emitting area to convert at least a portion of the first light into the second light, and is disposed on the protective film in the third light emitting area to convert at least a portion of the first light into the third light.

31. The display device of claim 25, wherein layers in the bank pattern and layers in the light emitting element consist of a same material and are formed from a same layer.

32. The display device of claim 25, further comprising:
a color filter disposed on the wavelength conversion layer,
a capping layer disposed between the color filter and each of the wavelength conversion layers; and
a selective transmission film disposed between the color filter and the light emitting element.

* * * * *